United States Patent
Wang et al.

(10) Patent No.: US 11,161,291 B2
(45) Date of Patent: Nov. 2, 2021

(54) MOLDED CIRCUIT BOARD OF CAMERA MODULE, MANUFACTURING EQUIPMENT AND MANUFACTURING METHOD FOR MOLDED CIRCUIT BOARD

(71) Applicant: NINGBO SUNNY OPOTECH CO., LTD., Zhejiang (CN)

(72) Inventors: Mingzhu Wang, Ningbo (CN); Bojie Zhao, Ningbo (CN); Takehiko Tanaka, Ningbo (CN); Zhen Huang, Ningbo (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 181 days.

(21) Appl. No.: 16/307,926

(22) PCT Filed: Jun. 6, 2017

(86) PCT No.: PCT/CN2017/087316
§ 371 (c)(1),
(2) Date: Dec. 7, 2018

(87) PCT Pub. No.: WO2017/211267
PCT Pub. Date: Dec. 14, 2017

(65) Prior Publication Data
US 2019/0263040 A1 Aug. 29, 2019

(30) Foreign Application Priority Data
Jun. 6, 2016 (CN) .......................... 201610394707.4

(51) Int. Cl.
*B29C 45/78* (2006.01)
*B29C 45/26* (2006.01)
(Continued)

(52) U.S. Cl.
CPC .............. *B29C 45/78* (2013.01); *B29C 45/26* (2013.01); *B29C 45/64* (2013.01); *H04N 5/225* (2013.01);
(Continued)

(58) Field of Classification Search
CPC ......... B29C 45/78; B29C 45/26; B29C 45/64; B29C 2945/76531; B29C 2945/76732;
(Continued)

(56) References Cited

U.S. PATENT DOCUMENTS

| 2002/0025352 A1 | 2/2002 | Miyajima |
| 2011/0194023 A1* | 8/2011 | Tam ..................... H04N 5/2253 348/374 |

(Continued)

FOREIGN PATENT DOCUMENTS

| CN | 104516032 | 4/2015 |
| CN | 105611134 | 5/2016 |

(Continued)

*Primary Examiner* — Joseph S Del Sole
*Assistant Examiner* — Lawrence D. Hohenbrink, Jr.
(74) *Attorney, Agent, or Firm* — Wenderoth, Lind & Ponack, L.L.P.

(57) ABSTRACT

A molded circuit board (10) of a camera module (100), manufacturing equipment (200) and a manufacturing method for the molded circuit board. The manufacturing equipment (200) comprises a forming mold (210), which comprises a first mold (211) and a second mold (212) that can be opened or closed, where the first mold (211) and the second mold (212) form a forming cavity (213) when closed. Also, a light window forming block (214) and a base forming guide groove (215) located at the periphery of the light window forming block (214) are provided within the forming cavity (213). When a circuit board is mounted in the forming cavity (213), once a molding material (13) filled into the base forming guide groove (215) is solidified into form by undergoing a transition process from a liquid state (Continued)

to a solid state, a molded base (12) is formed at the position corresponding to the base forming guide groove (215), a through hole of the molded base (12) is formed at the position corresponding to the light window forming block (214), where the molded base (12) is integrally formed on the circuit board so as to form the molded circuit board (10) of the camera module (100). The through hole is used for providing the camera module (100) with an optical path. The molded base (12) can serve as a frame for the camera module (100).

16 Claims, 32 Drawing Sheets

(51) Int. Cl.

| | | |
|---|---|---|
| *B29C 45/64* | (2006.01) | |
| *H04N 5/225* | (2006.01) | |
| *H05K 3/28* | (2006.01) | |
| *H05K 3/00* | (2006.01) | |
| *B29L 31/34* | (2006.01) | |

(52) U.S. Cl.
CPC .............. *H04N 5/2251* (2013.01); *H05K 3/00* (2013.01); *H05K 3/284* (2013.01); *B29C 2945/76531* (2013.01); *B29C 2945/76732* (2013.01); *B29L 2031/34* (2013.01); *H05K 2203/1316* (2013.01)

(58) Field of Classification Search
CPC ........ H04N 5/225; H04N 5/2251; H05K 3/00; H05K 3/284; H05K 2203/1316; B29L 2031/34
USPC ......................................................... 425/143
See application file for complete search history.

(56) References Cited

U.S. PATENT DOCUMENTS

| | | | |
|---|---|---|---|
| 2011/0195140 A1* | 8/2011 | Ho ...................... | B29C 45/1761 |
| | | | 425/185 |
| 2012/0026337 A1* | 2/2012 | Boulanger .............. | H01L 22/32 |
| | | | 348/164 |
| 2013/0242181 A1 | 9/2013 | Phoon et al. | |
| 2016/0191767 A1* | 6/2016 | Otani ................... | H04N 5/2257 |
| | | | 348/373 |
| 2016/0368176 A1* | 12/2016 | Kasai .................. | B29C 45/1418 |
| 2017/0244872 A1* | 8/2017 | Wang ................... | H04N 5/2257 |

FOREIGN PATENT DOCUMENTS

| | | | | |
|---|---|---|---|---|
| CN | 105611134 A | * | 5/2016 | ......... H04N 5/22521 |
| EP | 3419275 A | | 12/2018 | |
| EP | 3419276 A1 | | 12/2018 | |
| JP | 2001292365 A | | 10/2001 | |
| JP | 2006269486 | | 10/2006 | |
| JP | 2006324539 | | 11/2006 | |
| JP | WO2007043509 A1 | | 4/2007 | |
| JP | 2007523568 | | 8/2007 | |
| JP | 2008235488 | | 10/2008 | |
| JP | 200999680 | | 5/2009 | |
| JP | 2009147188 | | 7/2009 | |
| JP | 2010177351 A | | 8/2010 | |
| JP | 201386326 | | 5/2013 | |
| JP | WO2013153721 A | | 10/2013 | |
| JP | 201568853 A | | 4/2015 | |
| JP | WO2015133631 A | | 9/2015 | |
| KP | 101397677 | | 5/2014 | |
| KP | 101587694 | | 1/2016 | |
| KR | 20080046239 A | | 5/2008 | |
| WO | WO2005072041 A1 | | 8/2005 | |
| WO | WO2011008098 A2 | | 1/2011 | |
| WO | WO2011084900 | | 7/2011 | |
| WO | WO-2015133631 A1 | * | 9/2015 | ............. B32B 37/12 |

* cited by examiner

A

B-B

C-C

D-D

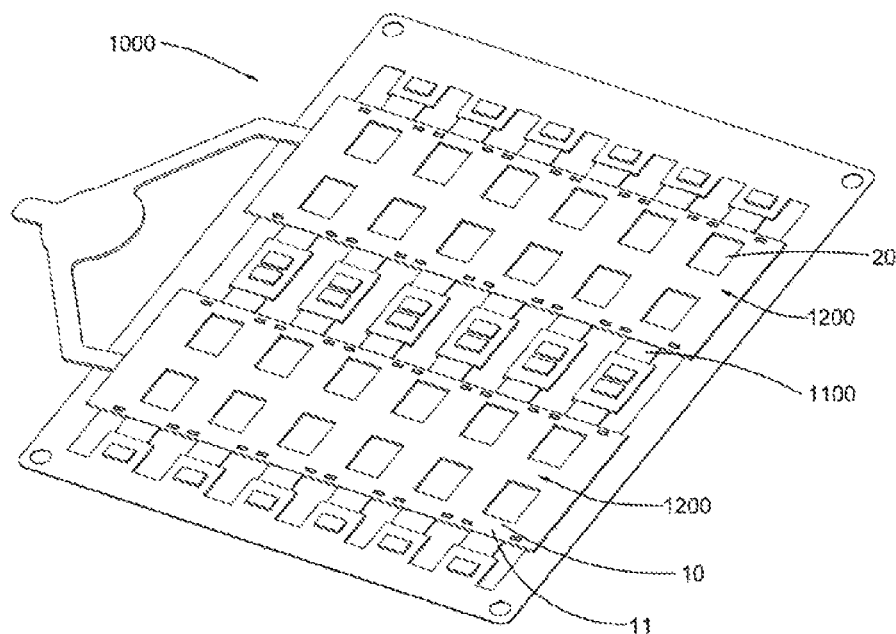

FIG.38

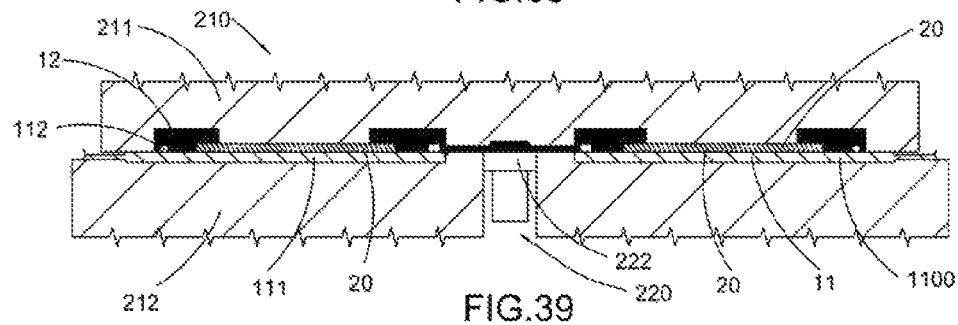

FIG.39

| Transport and load an integral piece of circuit board array at a second mould of a molding mould |
|---|

| When the second mould is closed with a first mould of the molding mould, a molding material is filled in a base array forming guide groove within the molding mould and is turned into a liquid state, and a position corresponding to each light window forming block of the molding mould is not filled with the molding material |

| The molding material in the base array forming guide groove is transferred into a solid state from the liquid state to form an integral piece of molded base array integrally solidified on the integral piece of circuit board array, so as to obtain an integral piece of molded circuit board assembly array |

| Cut the integral piece of molded circuit board assembly array to obtain a plurality of molded circuit board assemblies |

FIG.40

MOLDED CIRCUIT BOARD OF CAMERA MODULE, MANUFACTURING EQUIPMENT AND MANUFACTURING METHOD FOR MOLDED CIRCUIT BOARD

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a circuit board arrangement of a camera module, and more particularly to a molded circuit board of camera module and manufacturing equipment therefor and manufacturing method thereof.

Description of Related Arts

With the development of a variety of electronic products and smart devices, camera modules are expected to have a high-performance, lighting and thinning performance. While facing a variety of development requirements of the high resolution, high image quality and other high performances, the electronic components of the circuits become more and more; the chip area is growing and the driver resistors, capacitors and other passive components are correspondingly increased, which makes the specifications of the electronic components grow bigger and bigger, increases the difficulty of the assembly, and makes the overall size of the camera module bigger and bigger. While according to the situations mentioned above, the conventional assemble method of the holder, the circuit board and the electronic components of a conventional camera module are extremely limiting the lighting and thinning performance development of the camera module in a certain extent.

The conventional camera module generally includes a circuit board, a photosensitive element, a holder and a lens. The components of the camera module are generally packaged in a COB (Chip on Board) process, wherein the photosensitive element is electrically connected to the circuit board. The holder is affixed to the circuit board by a glue. While in this packaging process, during a step of affixing the holder, as the holder is disposed on an outer side of the electronic components of the circuit board, when the holder and the circuit board is mounted, it is necessary to reserve a certain safe distance between the holder and the electronic components. Furthermore, the safe distance needs to be preset in advance both in the horizontal direction and the vertical direction, which increases the thickness of the camera module in certain extent and which makes the thickness of the camera module hard to be decreased.

In addition, the holder or an actuator is affixed to the circuit board by a glue and other stickers. During an affixing process, a calibration process is generally needed. In the calibration process, a center axis of the photosensitive element and a central axis of the lens are adjusted such that the photosensitive element and the lens are properly aligned along a horizontal direction and a vertical direction. Therefore, in order to meet the requirements of the calibration process, a pretty much glue is needed to be preset between the holder and the circuit board and between the holder and the actuator, so as to provide an adjustment space between each other. While on one hand this requirement in a certain extent increases the thickness of the camera module and the thickness of the camera module is hard to decrease. On the other hand, repeatedly affixing and assemble process is likely to cause inconsistent tilt and the holder, the circuit board and the actuator have a higher flatness requirement. Using the glue to affix cannot guarantee that the lens is flatly attached to the circuit board.

Furthermore, the electronic components of the circuit board and the photosensitive element are exposed to the environment during the packaging process, it is inevitable that there will be dust and dirt stick to the electronic components of the circuit board, or even further reach to the photosensitive element, which may result in dirty spots on the assembled camera module and other negative situations, and thus reducing the product yield.

The holder can be integrally packaged on the circuit board to solve these problems, but in the prior art there are no circuit boards with integrally packaged holder, and there is no suitable packaging equipment either. Generally, in a conventional integral semiconductor package molding process, a liquid material is integrally encapsulated on a semiconductor substrate. The liquid material has an enough area to coat on the whole semiconductor substrate, and then the liquid material is solidified so that the package molding process is finished.

However, confined by the structure of the circuit board and the holder of the camera module, in the conventional package molding process, there is still no circuit boards with an integral package molded holder. On one hand, the requirement on size, precision and flatness of the camera module is higher. On other hand, the circuit board needs to be matched with the photosensitive element, the holder is generally annular and a light window needs to be provided in the center, so that the photosensitive element and the lens are optically arranged and the light penetrates through the lens and the light window and reaches to the photosensitive element; and a bottom side of the holder needs to be firmly connected with the circuit board. Except for the light window, the other sides of the holder are required to be light shading for preventing the lighting from entering into within the holder. While the conventional integral package equipment has no structure which can form the holder with these optical characteristics, especially there is no molding mould to perform.

More specifically, the designing of the molding mould for lens holder has to consider the way to build a stable isolation environment for the photosensitive area portion of the photosensitive element, so as to ensure that the molding material will not enter the area of the photosensitive element and render defects, such as burr, pollution on the photosensitive element, and etc., during the molding process of the lens holder. Besides, the photosensitive element usually thin and fragile, so it has to ensure that the photosensitive element from bearing too much pressure and being crushed when designing the isolation means. Besides, a lead wire will usually be provided between the photosensitive element and the circuit board. The lead wire curvingly and bendingly extends between the photosensitive element and the circuit board to connect and communicate the circuit board and the photosensitive element. Correspondingly, the design of the isolation means of the photosensitive element has to consider reserving space for the lead wire, so as to avoid the lead wire from being pressed to distort or even broken away from the photosensitive element or the circuit board during the isolation environment building process for the photosensitive element.

In addition, the circuit board of the camera board generally includes many electronic components such as resistors, capacitors and drivers, etc. In the integral package process, the electronic components need to be properly arranged. An encapsulating structure of the integral encapsulating mould can only form the holder with the light window on the position around the circuit board, and the circuit board and an effective photosensitive region of the photosensitive element cannot be occupied to affect a photographic effect. In addition, the integral encapsulating mould also needs to be designed to match with the size of the circuit board such as area, thickness and so on, thereby forming the holder with suitable size.

SUMMARY OF THE PRESENT INVENTION

The invention is advantageous in that it provides a molded circuit board of a camera module and a manufacturing equipment therefor and a manufacturing method thereof, wherein the molded circuit board comprises a molded base and a circuit board, the molded base is capable of making a material, which is used for forming the molded base, be molded on the circuit board by a manufacturing equipment, so that the molded circuit board forms an integrally molded package structure.

Another advantage of the invention is to provide a molded circuit board of a camera module and a manufacturing equipment therefor and a manufacturing method thereof, wherein a photosensitive element of the camera module can be integrally formed with the molded circuit board by a molding process, in other words, the molded circuit board is capable of being molded on the circuit board and the photosensitive element, thereby forming an integrally compact structure.

Another advantage of the invention is to provide a molded circuit board of a camera module and a manufacturing equipment therefor and a manufacturing method thereof, wherein in an integrally molded process of the molded base, there is no need to affix by a glue, so that the flatness of the molded circuit board is better and the thickness of the molded circuit board is thinner, thereby the camera module being convenient to be calibrated, being more thinner and having a better performance.

Another advantage of the invention is to provide a molded circuit board of a camera module and a manufacturing equipment therefor and a manufacturing method thereof, wherein the molded circuit board is integrally formed on the circuit board by the manufacturing equipment, so that the integrally compact structure enables the molded base blocking stray light, enhancing a heat dissipation performance of the circuit board, and as well as enhancing the strength of the molded circuit board.

Another advantage of the invention is to provide a molded circuit board of a camera module and a manufacturing equipment therefor and a manufacturing method thereof, wherein the molded base is integrally covered on a plurality of electronic components of the circuit board, so that these electronic components are not directly exposed to the external environment.

Another advantage of the invention is to provide a molded circuit board of a camera module and a manufacturing equipment therefor and a manufacturing method thereof, wherein the plurality of electronic components of the circuit board is disposed in the edge region of the molded base, a liquid molding material is prevented from entering into a middle chip overlapping region of the circuit board corresponding to a molding mould of the manufacturing equipment, so that the liquid material is covered and coated on the edge region of an outer side of the circuit board so as to form the molded base covered and coated on the electronic components.

Another advantage of the invention is to provide a molded circuit board of a camera module and a manufacturing equipment therefor and a manufacturing method thereof, wherein the manufacturing equipment is capable of providing a molding mould for manufacturing the molded circuit board, wherein in the molding steps, by providing at least one light window forming block and at least one base forming guide groove in the molding chamber, the middle chip overlapping region of the circuit board corresponds to the light window forming block of the molding mould, thereby preventing the liquid material entering into the area of the middle chip overlapping region, while the base forming guide groove around the light window forming block is filled with the liquid material so as to form the molded base.

Another advantage of the invention is to provide a molded circuit board of a camera module and a manufacturing equipment therefor and a manufacturing method thereof, wherein when the molding mould is in a closed-mould position, one or more actuator pin groove forming blocks prevent the liquid material from entering thereto so as to form corresponding actuator pin grooves after the solidification of the molded base, so that the actuator pin is convenient to be affixed to the circuit board during manufacturing the camera module.

Another advantage of the invention is to provide a molded circuit board of a camera module and a manufacturing equipment therefor and a manufacturing method thereof, wherein the molding mould performs the molding steps after the first and second mould are in the closed-mould position, wherein the circuit board is fixed in the molding chamber of the molding mould, then the liquid material forming the molded base can enter the base forming guide groove in the molding chamber, and the molded base is formed after solidification.

Another advantage of the invention is to provide a molded circuit board of a camera module and a manufacturing equipment therefor and a manufacturing method thereof, wherein the first and second mould are configured to produce a relative displacement to have an open-mould position and a closed-mould position, wherein one of the mould is fixed and the other is movable, or the two molds both can be moved so as to easy to be operated.

Another advantage of the invention is to provide a molded circuit board of a camera module, manufacturing equipment, and manufacturing method for molded circuit board, wherein the manufacturing equipment comprises the molding mould for manufacturing the molded circuit board, wherein the molding mould comprises an upper mould and a lower mould, which forms and defines a molding space when the upper mould and the lower mould are closed, wherein an isolation block is provided in the molding space, wherein as a circuit board with a photosensitive element disposed thereon is arranged in the molding space, the isolation block will be correspondingly arranged above the photosensitive element so as to seal the photosensitive element, such that when the molding material is filled into the molding space and solidified and molded, a molded base will be formed in the outer side of the photosensitive element and a light window of the molded base will be formed at the position corresponding to the isolation block.

Another advantage of the present invention is to provide a molded circuit board of camera module, manufacturing equipment and manufacturing method for molded circuit board, wherein the isolation block comprises an avoidance space formed on the bottom side of the isolation block, wherein when the isolation block is attached on the photosensitive element, the avoidance space is provided between the photosensitive element and the isolation block in order to prevent the isolation block from directly contacting the photosensitive element, so as to protect the photosensitive area portion of the photosensitive element from being crushed.

Another advantage of the present invention is to provide a molded circuit board of a camera module and a manufacturing equipment therefor and a manufacturing method thereof, wherein the isolation block comprises an isolation block body, an extension part, and a side tilt part formed on side of the isolation block body, wherein the isolation block body, the extension part, and the side tilt part are integrally formed, wherein the extension part extends downward along the isolation block body, wherein the extension part and the side tilt part coordinate for providing an adequate and enough wiring space for the lead wires connecting the circuit board and the photosensitive element, so as to ensure that when the isolation block is overlapped on the photosensitive element, the lead wires and the isolation block will not contact.

Another advantage of the present invention is to provide a molded circuit board of camera module, manufacturing equipment and manufacturing method for molded circuit board, wherein a cushion film is provided between the isolation block and the photosensitive element, wherein when the isolation block is attached on the photosensitive element, the cushion film can effectively absorb the load of the isolation block on the photosensitive element, so as to prevent processing defects, such as the photosensitive element being crushed and etc., during the molding technology process.

Another advantage of the present invention is to provide a molded circuit board of camera module, manufacturing equipment and manufacturing method for molded circuit board, wherein a cushion film is provided between the isolation block and the photosensitive element, wherein because the cushion film is somewhat flexible and soft, such that when the isolation block is attached on the photosensitive element, the cushion film will be pressed and deformed, so as to better seal and isolate the photosensitive element in order prevent the photosensitive element from being polluted during the molding process.

Another advantage of the present invention is to provide a molded circuit board of camera module, manufacturing equipment and manufacturing method for molded circuit board, wherein the isolation block further comprises an air path for removing the air remained between the isolation block and the cushion film, so as to make the cushion film be firmly attached on the bottom of the isolation block under the negative pressure and to ensure that when the isolation block is aligned with and attached on the photosensitive element, the relative positions of the cushion film and the isolation block will not change to cause the direct contact between the isolation block and the photosensitive element and to damage the photosensitive element.

Another object of the present invention is to provide a molded circuit board of camera module, manufacturing equipment and manufacturing method for molded circuit board, wherein the isolation block comprises a flexible section and a rigid section coupled on the flexible section, such that when the isolation block is attached on the photosensitive element, the flexible section of the isolation block will contact the photosensitive element, so as to rely on the soft and flexible characteristic of the flexible section to prevent the photosensitive element from being crushed.

Another advantage of the invention is to provide a molded circuit board of a camera module and a manufacturing equipment therefor and a manufacturing method thereof, the material forming the molded base can be a hot-melt material, thereby injecting into the molding chamber in a liquid state and being solidified by cooling.

Another advantage of the invention is to provide a molded circuit board of a camera module and a manufacturing equipment therefor and a manufacturing method thereof, the material forming the molded base can be a thermosetting material, thereby injecting into the molding chamber in a liquid state and being solidified by continual heating.

Another advantage of the invention is to provide a molded circuit board of a camera module and a manufacturing equipment therefor and a manufacturing method thereof, wherein the circuit board can be preheated, so that in the molding process, it is possible to reduce the temperature difference of the circuit board and the liquid molding material.

Another advantage of the invention is to provide a molded circuit board of a camera module and a manufacturing equipment therefor and a manufacturing method thereof, wherein the manufacturing equipment is capable of manufacturing a separated molded circuit board, or the manufacturing equipment is capable of manufacturing an integral piece of molded circuit board array, a plurality of single molded circuit board forming separated camera module or the molded circuit board assemblies of a camera module array is formed by cutting the integral piece of molded circuit board array.

Another advantage of the invention is to provide a molded circuit board of a camera module and a manufacturing equipment therefor and a manufacturing method thereof, wherein when the molding mould is in the closed-mould position, the liquid molding material enters the base forming guide groove under a pressure effect, so that the liquid molding material can be flatly formed on the circuit board, a flat molding surface of the molding mould can ensure that a top surface and a side surface of the molded base have a better flatness.

Another advantage of the invention is to provide a molded circuit board of a camera module and a manufacturing equipment therefor and a manufacturing method thereof, wherein the liquid molding material entering the base forming guide groove is precisely controlled in quantity, thereby ensuring to form the molded base with suitable size.

In order to achieve the above and other advantages and objects, the present invention provides a manufacturing equipment for manufacturing at least one molded circuit board of at least one camera module, wherein the manufacturing equipment comprising:

a molding mould comprising a first mould and a second mound;

a mould fixing unit, wherein the mould fixing unit is capable of separating and closely uniting the first mould and the second mound, wherein when the first mould and the second mound are united to form a molding chamber, at least one light window forming block and a base forming guide groove disposed around the light window forming block are provided in the molding chamber of the molding mould; and a temperature control unit which provides a controlled temperature environment for the molding chamber, wherein when at least one circuit board is mounted in the molding chamber, a molding material filled in the base forming guide groove is solidified from a liquid state to a solid state under a temperature controlling effect of the temperature control unit, wherein a molded base is formed at a position corresponding to the base forming guide groove and a light window of the molded base is formed at a position corresponding to the light window forming block, wherein the molded base is integrally molded on the circuit board so as to form the molded circuit board of the camera module. It is understandable that the window is for providing an optical path for the camera module. The molded base can serve as a frame for the camera module.

In some embodiments, the first mould and the second mound are capable of producing a relative displacement so as to be in an open-mould position and a closed-mould position, wherein at least one of the first mould and the second mound is moveable.

In some embodiments, the light window forming block and the base forming guide groove are positioned at the first mould, the second mould has at least one circuit board positioning groove or positioning hole for mounting the circuit board.

In some embodiments, the light window forming block and the base forming guide groove are positioned at the second mould, the first mould has at least one circuit board positioning groove or positioning hole for mounting the circuit board.

In some embodiments, the first mould is a fixed upper mould and the second mould is a moveable lower mould.

In some embodiments, the light window forming block and the base forming guide groove are integrally formed in the first mould.

In some embodiments, a molded structure of the light window forming block and the base forming guide groove is detachably provided at the first mould, so as to be suitable to be replaced to manufacture the molded circuit board with different shapes and sizes.

In some embodiments, further comprising a molding material feeding mechanism, wherein the molding material feeding mechanism has at least one material storing member, at least one material transporting channel and at least one material pushing member, wherein the molding material is transported from the material storing member to the material transporting channel by the material pushing member and then is filled in the base forming guide groove.

In some embodiments, the material storing member is provided with a heating environment such that the molding material in a solid state within the material storing member is heated and melted, and then is pushed into the material transporting channel.

In some embodiments, the molding material in the solid state within the material storing member can be pushed into the material transporting channel at a same time when being heated and melted into a semi-melt state.

In some embodiments, the molding material in the solid state within the material storing member can be pushed into the material transporting channel after being heated and melted into a pure liquid.

In some embodiments, the mould fixing unit drives at least one of the first mould and the second mound to move, so that the first mould and the second mound which are coaxial arranged are separated with each other or firmly closed with each other.

In some embodiments, further comprising a vacuum unit for evacuating the molding chamber to decrease the pressure inside of the molding chamber.

In some embodiments, the temperature control unit comprises a melting and heating arrangement and a solidifying and temperature controlling arrangement, the melting and heating arrangement is used for melting the molding material which is in the solid state, the solidifying and temperature controlling arrangement provides a heating environment for the molding mould; or the temperature control unit is an integral arrangement, wherein the temperature control unit is capable of heating and melting the molding material which is in the solid state and is also capable of heating the molding material within the molding chamber such that the liquid molding material is heated to be solidified.

In some embodiments, the manufacturing equipment further comprises a circuit board array feeding mechanism providing at least one circuit board array to the molding mould, wherein the circuit board array is integrally formed with a plurality of the circuit boards, the circuit board array feeding mechanism comprises at least one guide rail, at least one load member and at least one unload member, the load member and the unload member move along the guide rail, wherein the load member transports the unmolded circuit board array to the molding chamber and the unload member uploads the molded circuit board which is formed after the molding process.

In some embodiments, the manufacturing equipment further comprises a controller automatically control a molding process of the manufacturing equipment.

In some embodiments, wherein a circuit board array is mounted in the molding chamber, the circuit board array is integrally formed with a plurality of the circuit boards, wherein the manufacturing equipment manufactures at least one integral piece of molded circuit board array in an integral board array molding operation, wherein the integral piece of molded circuit board array comprises a plurality of the molded circuit board assemblies which are integrally combined to form a one-piece structure.

In some embodiments, molded bases on the circuit boards of the integral piece of molded circuit board array are separated with each other.

In some embodiments, the integral piece of molded circuit board has an integral piece of molded base array which is integrally molded on the integral piece of circuit board array.

In some embodiments, wherein the molding material is a thermal melting material, the molding material which is filled in the base forming guide groove is in a liquid state and is solidified to form the molded base which is integrally molded on the circuit board by cooling.

In some embodiments, the molding material is a thermosetting material, the molding material which is filled in the base forming guide groove is in a liquid-melt state and is solidified to form the molded base which is integrally molded on the circuit board by heating.

In some embodiments, the circuit board comprises a base board and a plurality of electronic components provided on the base board, wherein the molded base is covered and coated on at least one of the electronic components.

In some embodiments, the base board has a middle chip overlapping region and an edge region disposed around the middle chip overlapping region, the electronic components are arranged on the edge region.

In some embodiments, the middle chip overlapping region provides a flat mating face firmly contacting to a bottom surface of the light window forming block so as to prevent the liquid molding material entering the middle chip overlapping region.

In some embodiments, the middle chip overlapping region of the base board and the edge region are in a same plane.

In some embodiments, the middle chip overlapping region of the base board is concave relative to the edge region to form a concave groove in the base board, wherein a bottom end of the light window forming block is protruded from the base forming guide groove and the bottom end of the light window forming block is extended into the concave groove, wherein the concave groove is used for assembling a photosensitive element of the camera module; or the middle chip overlapping region of the base board protrudes outwards relatively to the edge region, so as to share the pressure of the light window forming block and avoid burr.

In some embodiments, when the molding mould is in the closed-mould position and performs a molding process, a side guide groove adjacent to at least one side surface of the circuit board is provided to communicate with the base forming guide groove, wherein the liquid molding material is filled in the side guide groove and forms the molded base after solidification and the molded base is further covered and coated on the side surface of the circuit board.

In some embodiments, when the molding mould is in the closed-mould position and performs a molding process, a bottom guide groove under at least one bottom surface of the circuit board is provided to communicate with the base forming guide groove, wherein the liquid molding material is filled in the bottom guide groove and forms the molded base after solidification and the molded base is further covered and coated on the bottom surface of the circuit board.

In some embodiments, the circuit board further comprises one or more through-holes which are extended along a thickness direction of the circuit board, wherein when the molding mould is in the closed-mould position and performs a molding process, the liquid molding material is further filled into the through-holes and is solidified inside the through-holes.

In some embodiments, the circuit board to be molded is electrically connected to at least one photosensitive element, wherein the molded base is integrally molded on the circuit board and the photosensitive element.

In some embodiments, the unmolded circuit board and the photosensitive element and the photosensitive element are electrically connected by one or more lead wires in advance.

In some embodiments, the photosensitive element has a photosensitive area portion and a non-photosensitive area portion which is positioned around the photosensitive area portion, wherein when the molding mould is in the closed-mould position and performs a molding process, the light window forming block is firmly contacted with at least the photosensitive area portion, the molded base being solidified and molded is integrally molded on at least one portion of the non-photosensitive area portion.

In some embodiments, the molded base is integrally covered and coated on the lead wires and the electronic components of the circuit boards.

In some embodiments, the d circuit board to be molded is electrically connected to at least one photosensitive element and an optical filter is overlapped with the photosensitive element, wherein when the molding mould is in the closed-mould position and performs a molding process, the light window forming block is firmly contacted to a center area of the optical filter, the molded base after being solidified and molded is integrally molded on the circuit board, the photosensitive element and the optical filter.

In some embodiments, when the molding mould is in the closed-mould position, one or more actuator pin groove forming blocks are provided and extended in the base forming guide groove, wherein after a molding material filled in the base forming guide groove is solidified from a liquid state to a solid state, an actuator pin is formed at a position corresponding to the actuator pin groove forming block.

In some embodiments, a shape and size of the light window forming block is matched with a shape and size of the light window, wherein a shape and size of the base forming guide groove is matched with a shape and size of the molded base.

In some embodiments, the light window forming block further comprises a main forming body portion and a stair portion which is on a top end of the main forming body portion and which is integrally formed with the main forming body portion, and a groove of the molded base is formed on a top end of the molded base.

According to another aspect of the present invention, the present invention also provides a semi-finished product, for manufacturing a molded circuit board of a camera module, which comprises an integral piece of circuit board array and a plurality of molded bases which are integrally molded on the integral piece of circuit board array, wherein the integral piece of circuit board array comprises a plurality of circuit boards which are integrally combined with each other, wherein each of the molded bases is molded on each of the corresponding circuit boards. Each the molded base is integrally molded independently with each other on the corresponding circuit board respectively. A plurality of the molded bases are integrally combined with each other so as to form at least one integral piece of molded base array which is integrally molded on the integral piece of circuit board array.

According to the present invention, the foregoing and other objects and advantages are also attained by a manufacturing method of a molded circuit board of a camera module, comprising steps as follows.

(a) Fix at least one circuit board at a second mould of a molding mould.

(b) Close the second mould and a first mould, and Fill a liquid molding material in at least one base forming guide groove within the molding mould, wherein a position corresponding to at least one light window forming block is prevented from filling in the liquid material, wherein the base forming guide groove is disposed around the light window forming block.

(c) Solidify the molding material filled in the base forming guide groove from a liquid state to a solid state so as to form a molded base which is formed at a position corresponding to the base forming guide groove, wherein a light window of the molded base is formed at a position corresponding to the light window forming block, wherein the molded base is integrally molded on the circuit board so as to form the molded circuit board of the camera module.

In some embodiments, in the step (a), fix at least one integral piece of circuit board array at the second mould, wherein the integral piece of circuit board array comprises a plurality of the circuit boards integrated with each other; in the step (b), a base array forming guide groove is filled with the molding material, wherein the base array forming guide groove has a plurality of the base forming guide grooves which are communicated with each other to form an integral groove; after the molding material is solidified in the step (c), the circuit board array is integrally molded with an integral piece of molded base array so as to form an integral piece of molded circuit board.

According to some embodiments of the present invention, the manufacturing method further comprises a step of cutting the integral piece of molded circuit board array into a plurality of the molded circuit board assemblies.

According to some embodiments of the present invention, the manufacturing method further comprises steps of electrically connecting a photosensitive element to the circuit board, then fixing the circuit board with the photosensitive element at the second mould, so that after the molding material is solidified in the step (c), the integrally molded base is further molded on at least one portion of a non-photosensitive area portion of the photosensitive element.

According to some embodiments of the present invention, the manufacturing method further comprises steps of electrically connecting a plurality of photosensitive elements to each of the circuit boards of the integral piece of circuit board array respectively, then fixing the integral piece of circuit board array with the photosensitive elements at the second mould, so that after the molding material is solidified in the step (c), the integral piece of molded base array is further molded on at least one portion of a non-photosensitive area portion of each of the photosensitive elements.

According to some embodiments of the present invention, the step (b) further comprises a step of driving at least one of the first mould and the second mound to move by a mould fixing unit so as to form at least one closed molding chamber when the first mound and the second mound are in the closed-mould position.

According to some embodiments of the present invention, before the step (b), the manufacturing method further comprises a step of preheating the circuit board in advance, so that in the step (b), the temperature difference between the circuit board and the liquid thermosetting molding material is reduced According to some embodiments of the present invention, the manufacturing method further comprises a step of transporting the integral piece of circuit board array by at least one load member automatically moves along a guide rail; after the step (c), at least one upload member moves automatically along the guide rail so as to transport the integral piece of molded circuit board array to a storage position.

According to some embodiments of the present invention, before the step (b), the manufacturing method further comprises a step of transporting the molding material which is in the solid state into at least one material storing member; when the molding material is heated and melt into a pure liquid, a material pushing member pushes the liquid molding material to one or more material transporting channels communicated with the material storing member, and the liquid material enters the base forming guide groove through the material transporting channel.

According to some embodiments of the present invention before the step (b), the manufacturing method further comprises a step of transporting the molding material which is in the solid state into at least one material storing member; during a melting process of the molding material, under a pushing effect of a material pushing member, the molding material is pushed into one or more material transporting channels which are communicated with the material storing member, and the liquid material enters the base forming guide groove through the material transporting channel.

According to some embodiments of the present invention, the molding material is a thermal melting material, in the step (c), further comprises a step of cooling the liquid material such that the molding material forms the molded base after solidification.

According to some embodiments of the present invention, the molding material is a thermosetting material, in the step (c), further comprises a step of heating the liquid material such that the molding material forms the molded base after solidification.

According to some embodiments of the present invention, the manufacturing method further comprises a step of replacing a molding structure which is detachable provided at the first mould and which is provided with the light window forming block and the base forming guide groove into other molding structure with a shape and size which is suitable to manufacture other different molded circuit board.

In accordance with another aspect of the invention, the present invention also provides a molded circuit board of a camera module, the molded circuit board is manufactured by a manufacturing method comprising the following steps.

(a) Fix at least one circuit board at a second mould of a molding mould.

(b) Close the second mould and a first mould, and Fill a liquid molding material in at least one base forming guide groove within the molding mould, wherein a position corresponding to at least one light window forming block is prevented from filling in the liquid material, wherein the base forming guide groove is disposed around the light window forming block.

(c) Solidify the molding material filled in the base forming guide groove from a liquid state to a solid state so as to form a molded base which is formed at a position corresponding to the base forming guide groove, wherein a light window of the molded base is formed at a position corresponding to the light window forming block, wherein the molded base is integrally molded on the circuit board so as to form the molded circuit board of the camera module.

In some embodiments, in the step (a), fix at least one integral piece of circuit board array at the second mould, wherein the integral piece of circuit board array comprises a plurality of the circuit boards integrated with each other; in the step (b), a base array forming guide groove is filled with the molding material, wherein the base array forming guide groove has a plurality of the base forming guide grooves which are communicated with each other to form an integral groove; after the molding material is solidified in the step (c), the circuit board array is integrally molded with an integral piece of molded base array so as to form an integral piece of molded circuit board which can be cut to form a plurality of the molded circuit board assemblies.

In accordance with another aspect of the invention, the present invention also provides a molding mould, for manufacturing at least one molded circuit board of a camera module, comprising a first mould and a second mound which is capable of being separated and closely united, wherein when the first mould and the second mound are united to form a molding chamber, and at least one light window forming block and a base forming guide groove disposed around the light window forming block are provided in the molding chamber of the molding mould, wherein when at least one circuit board is mounted in the molding chamber, a molding material filled in the base forming guide groove is solidified from a liquid state to a solid state under a temperature controlling effect of a temperature control unit, wherein a molded base is formed at a position corresponding to the base forming guide groove and a light window of the molded base is formed at a position corresponding to the light window forming block, wherein the molded base is integrally molded on the circuit board so as to form the molded circuit board of the camera module. Still further objects and advantages will become apparent from a consideration of the ensuing description and drawings.

According to another aspect of the present invention, the present invention provides a molding mould for manufacturing at least one molded circuit board, wherein the molding mould comprising:

an upper mould; and a lower mould, wherein when the upper mould and the lower mould are closed, it forms and defines a molding space, wherein an isolation block is provided in the molding space, wherein as a circuit board with a photosensitive element assembled thereon is arranged in the molding space, the isolation block will be correspondingly arranged on the upper part of the photosensitive element so as to seal the photosensitive element, such that when the molding material is filled into the molding space and solidified and molded, a molded base will be formed in the outer side of the photosensitive element and at least one light window of the molded base will be formed at the position corresponding to the isolation block.

Still further objects and advantages will become apparent from a consideration of the ensuing description and drawings.

These and other objectives, features, and advantages of the present invention will become apparent from the following detailed description, the accompanying drawings, and the appended claims.

BRIEF DESCRIPTION OF THE DRAWINGS

FIG. 38 is a schematic view of the molded circuit board according to another alternative mode of the present invention.

FIG. 39 is a cross-sectional view of the molded circuit board when the molding mould is in the closed-mould position and after the molded circuit board is molded according to the alternative mode of the present invention.

FIG. 40 is a block diagram illustrating a manufacturing process according to above embodiment of the present invention.

DETAILED DESCRIPTION OF THE PREFERRED EMBODIMENT

Figure 1:
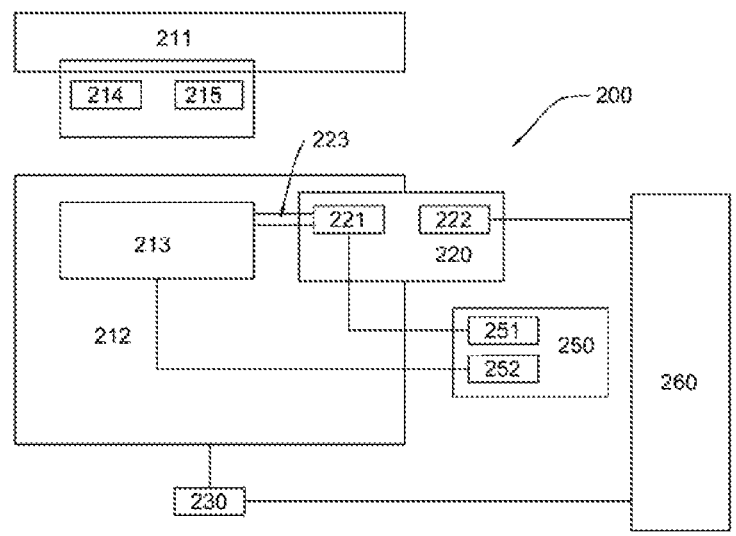
FIG. 1 is a block diagram illustrating a manufacturing equipment for a molded circuit board according to a preferred embodiment of the present invention.
Figure 2A:
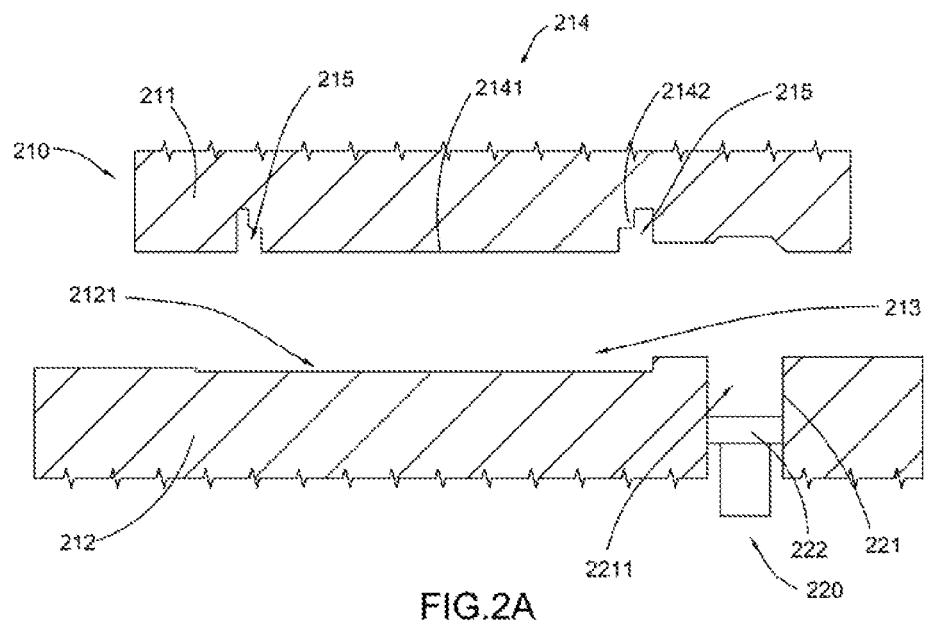
FIG. 2A is a cross-sectional view of a molding mould of the manufacturing equipment for the molded circuit board in an open-mould position according to the above preferred embodiment of the present invention.
Figure 2B:
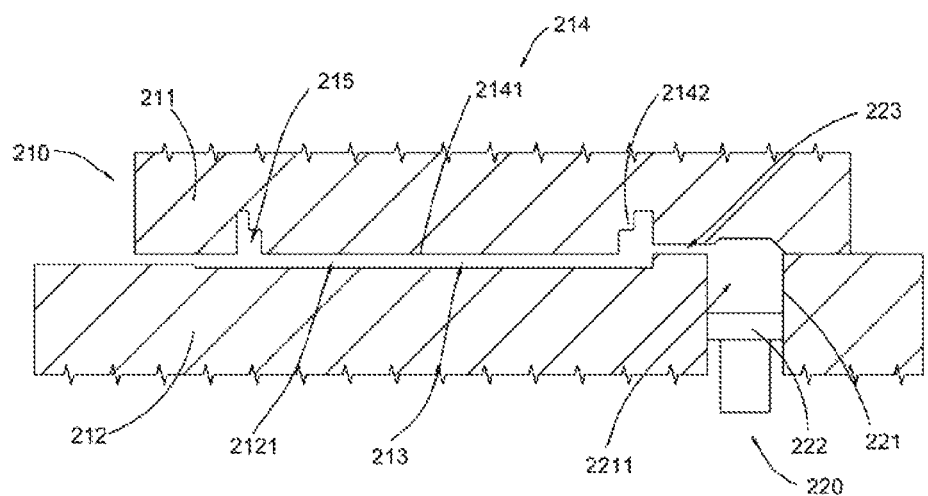
FIG. 2B is a cross-sectional view of the molding mould of the manufacturing equipment for the molded circuit board in a closed-mould position according to the above preferred embodiment of the present invention.
Figure 3A:
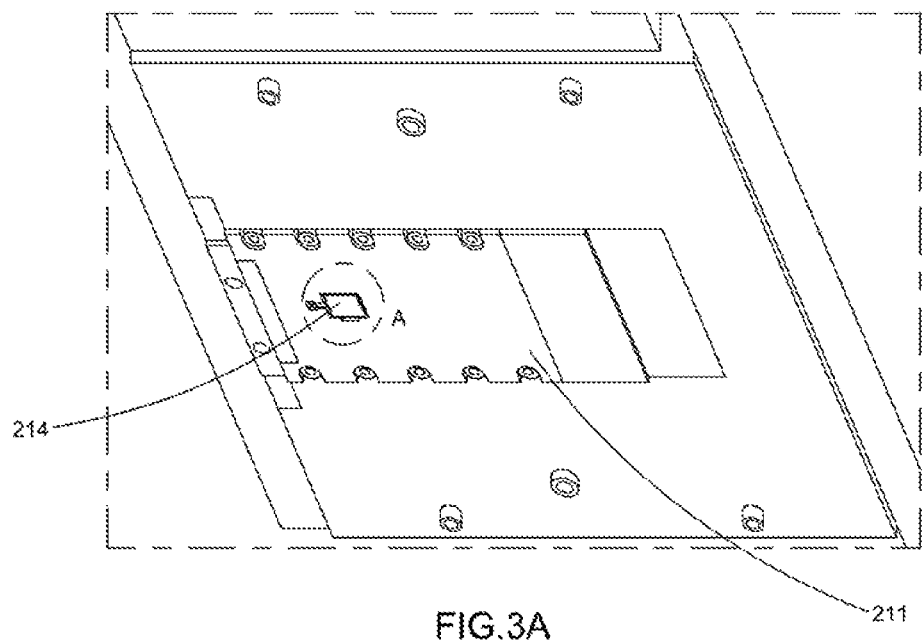
FIG. 3A is a perspective view of a first mould of the manufacturing equipment for the molded circuit board according to the above preferred embodiment of the present invention.
Figure 3B:
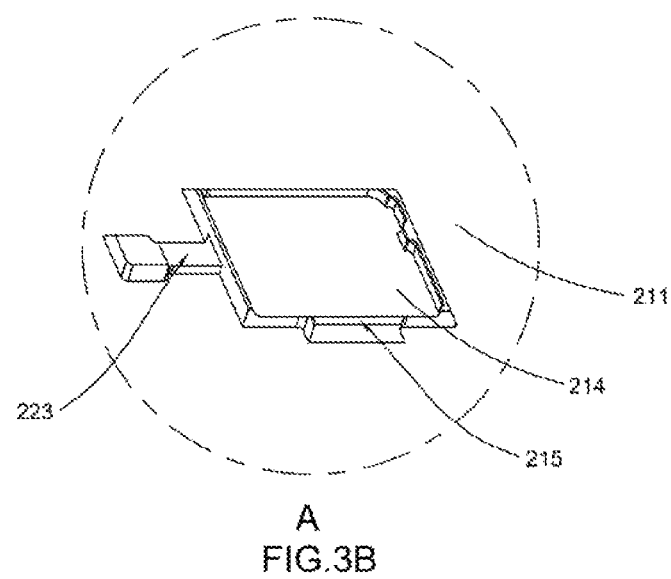
FIG. 3B is a partial enlarged schematic view of a light window forming block and a base forming guide groove of the first mould of the molding mould of the manufacturing equipment for the molded circuit board according to the above preferred embodiment of the present invention.
Figure 4:
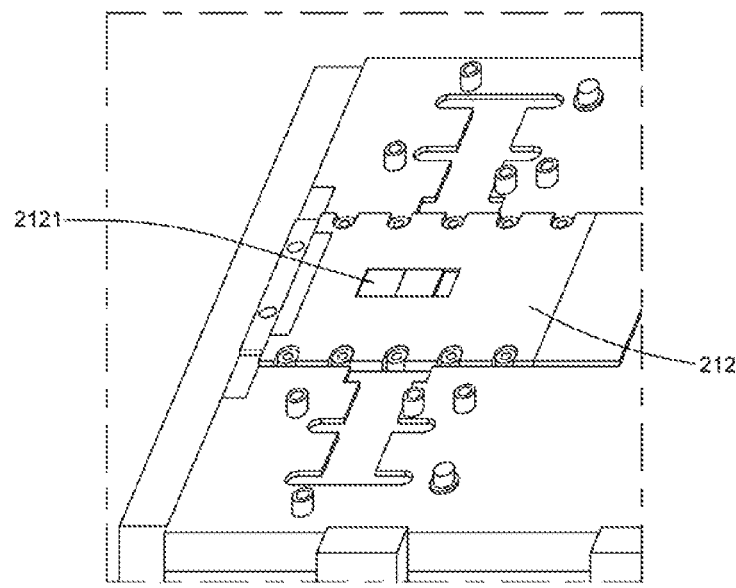
FIG. 4 is a perspective view of a second mound of the molding mould of the manufacturing equipment for the molded circuit board according to the above preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and etc. just indicate relations of direction or position are based on the relations of direction or position shown in the appended drawings, which is only to facilitate descriptions of the present invention and to simplify the descriptions, rather than to indicate or imply that the referred device or element must apply specific direction or to be operated or configured in specific direction. Therefore, the above mentioned terminologies shall not be interpreted as confine to the present invention.

It is understandable that the term "a" should be understood as "at least one" or "one or more". In other words, in one embodiment, the number of an element can be one and in other embodiment the number of the element can be more than one. The term "a" is not construed as a limitation of quantity.

Referring to FIG. 1 to FIG. 13 of the drawings, a molded circuit board 10 of a camera module 100 and a manufacturing equipment 200 thereof are illustrated. As shown in FIG. 10 to FIG. 13, the molded circuit board 10 comprises a circuit board 11 and a molded base 12, wherein the molded base 12 is integrally molded to the circuit board 11 by the manufacturing equipment 200, so that the molded base 12 can replace a holder or a supporter of a conventional camera module and it is unlike the conventional packaging process which is required to attach the holder or the supporter to the circuit board by a glue.

The camera module 100 further comprises a photosensitive element 20 and a lens 30. Wherein the molded base 12 comprises an annular molding body 121 and has a light window 122 in a middle thereof to provide a light path for the lens 30 and the photosensitive element 20. The photosensitive element 20 is operatively connected to the circuit board 11. For example, the photosensitive element 20 is electrically connected to the circuit board 11 by leading wires through a COB process, and is positioned on a top side of the circuit board 11. Alternatively, the photosensitive element 20 is provided at a bottom of the circuit board 11 by a flip chip process. The photosensitive element 20 and the lens 30 are respectively assembled on two sides of the molded base 12 and are optically aligned in such a manner that the light passing through the lens 30 is able to reach the photosensitive element 20 via the light window 122, so that the camera module 100 is able to provide an optical image through a photoelectric conversion action.

Figure 12:
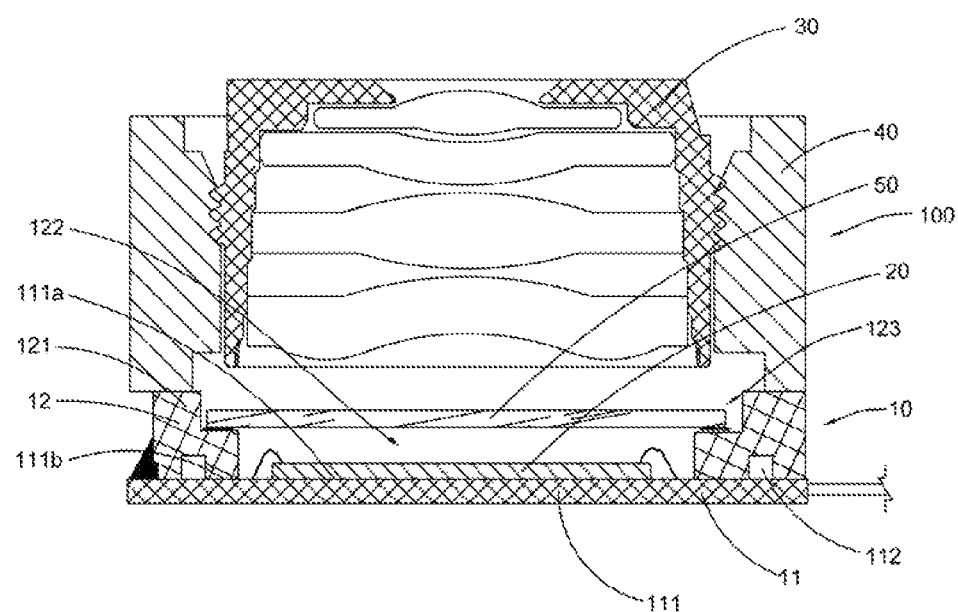
FIG. 12 is a cross-sectional view of a camera module assembled by the molded circuit board manufactured by the manufacturing process according to the above embodiment of the present invention.
Figure 13:
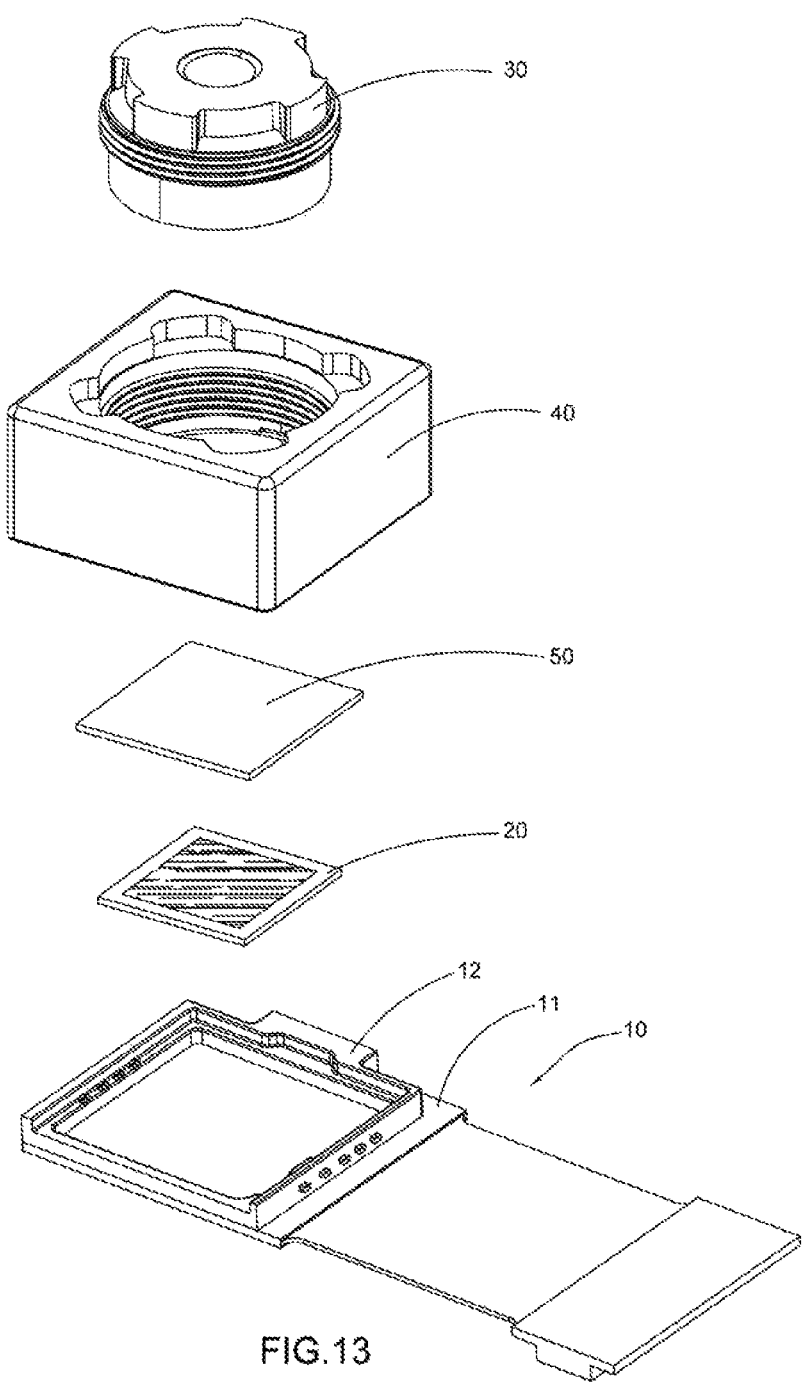
FIG. 13 is an exploded perspective view of a camera module assembled by the molded circuit board manufactured by the manufacturing process according to the above embodiment of the present invention.

The camera module 100 can be a fixed-focus camera module or an automatic-focus camera module. As shown in FIG. 12 and FIG. 13, the camera module 100 is an automatic-focus camera module having a motor 40 (actuator) and the lens 30 is mounted in the motor 40. The molded base 12 supports the motor 40. An optical filter 50 is provided on a top side of the molded base 12 to filter lights which pass through the lens 30 and the optical filter 50 can be an infrared cut-off filter. The circuit board 11 comprises a base board 111 and a plurality of electronic components 112.

The plurality of electronic components 112 is formed on the base board 111 using a technology such as the surface mount technology. The electronic components 112 include but not limited to resistors, capacitors, and other device drivers. In this embodiment of the invention, the molded base 12 is integrally covered and coated on the electronic components 112 to further prevent items such as similarly to dusts and debris of a conventional camera mould from adhering to the electronic components 112 to further pollute the photosensitive element 20, which affects the imaging results. It is understandable that in another alternative mode of the embodiment the electronic components 112 is embedded within the base board 111, in other words, the electronic components 112 are not exposed. The base board 111 of the circuit board 11 is a rigid PCB, a flexible PCB, a rigid-flex PCB or a ceramic substrate. It is worth mentioning that in this preferred embodiment of the present invention, since the molded base 12 is integrally covered and coated on the electronic components 112, the electronic components 112 is able to be not buried within the base board 111. The base board 111 can be only used to form conductive lines, so that the finally obtained molded circuit board 10 has a smaller thickness.

In this preferred embodiment of the present invention, as shown in FIG. 10 to FIG. 13, the base board 111 comprises a middle chip overlapping region 111a corresponding to the overlapped photosensitive element 20 and an edge region 111b around the middle chip overlapping region 111a. The electronic components 112 are arranged on the edge region 111b to provide the relative smooth middle chip overlapping region 111a so that during a molding process, the middle chip overlapping region 111a of the base board 111 contacts firmly to a mould surface of the manufacturing equipment 200 to prevent a molding material 13 entering the middle chip overlapping region 111a. More specific descriptions will be described below.

It is understandable that the molded base 12 of the present invention is fixed on the circuit board 11 by a molding process and does not need a adhering and fixing process. The molding combination manner renders a better connection stability and control of the manufacturing process, and it is unnecessary to reserve a glue space for calibration and adjustment between the molded base 12 and the circuit board 11, so that the thickness of the camera module 100 is decreased. On the other hand, the molded base 12 is covered and coated on the electronic components 112, so that it is unnecessary to reserve a safe distance around the electronic components 112 of a conventional camera module. In addition, the molded base 12 replaces the conventional holder or supporter to avoid tilt errors resulting from adhering and assembling the holder or supporter, so that cumulative tolerances of the assembly of the camera module 100 are reduced. Moreover, the molded base 12 is integrally formed on the circuit board 11, so that the integral and firmly contacting configuration enables the molded base 12 to block stray light, to enhance a cooling function of the circuit board 11, and to strengthen the strength of the circuit board 11.

Furthermore, as shown in FIG. 1 to FIG. 9 of the drawings, the manufacturing equipment 200 of the molded circuit board 10 of the camera module 100 comprises a molding mould 210, a molding material feeding mechanism 220, a mould fixing unit 230, a temperature control unit 250 and a controller 260. The controller 260 automatically controls the molding material feeding mechanism 220 in a molding process. The molding mould 210 comprises a first mould 211 and a second mould 212. The first mould 211 and the second mould 212 are able to open mould and to close mould under control of the mould fixing unit 230. In other words, the mould fixing unit 230 enables to separate the first mould 211 and the second mould 212 and to close the first mould 211 with the second mould 212 to define a molding chamber 213. When the first mould 211 and the second mould 212 are in a closed-mould position, the circuit board 11 is fixed within the molding chamber 213 and the liquid molding material 13 enters the molding chamber 213 so as to be integrally molded on the circuit board 11 and to from the molded base 12 which is integrally molded on the circuit board 11 after solidification.

More specifically, the molding mould 210 further comprises a light window forming block 214 and a base forming guide groove 215 formed around the light window forming block 214. When the first mould 211 and the second mould 212 are in the closed-mould position, the light window forming block 214 and the base forming guide groove 215 are extended inside of the molding chamber 213 and the liquid molding material 13 is filled into the base forming guide groove 215, as the position corresponding to the light window forming block 214 cannot be filled with the liquid molding material 13, so that the liquid molding material 13 forms the annular molding body 121 of the molded base 12 in the position of the base forming guide groove 215 and forms the light window 122 of the molded base 12 in the position of the light window forming block 214 after solidification.

The first mould 211 and the second mould 212 can be two moulds which have a relative movement. For example, one of the two moulds is fixed and the other of the two moulds is moveable. Or both of the two mounds are moveable, one skilled in the art will understand that the embodiment of the present invention described above is exemplary only and not intended to be limiting. In the embodiment of the present invention, the first mould 211 is specifically implied as a fixed upper mould and the second mould 212 is specifically embodied as a moveable lower mould. The fixed upper mould and the moveable lower mould are provided coaxially. For example, the moveable lower mould can slides upwardly along a plurality of positioning shafts and form the closed molding chamber 213 with the fixed upper mould in the closed-mould position.

The second mould 212 which is embodied as the lower mould has a circuit board positioning groove 2121 adapted for mounting and fixing the circuit board 11. The light window forming block 214 and the base forming guide groove 215 can be formed in the first mould 211 which is embodied as the upper mould. When the first mould 211 and the second mould 212 form the base forming guide groove 215 in the closed-mould position, the molding chamber 213 is formed, and the liquid molding material 13 is filled into the base forming guide groove 215 on a top side of the circuit board 11, so that the molded base 12 is formed on the top side of the circuit board 11.

It is understandable that the circuit board positioning groove 2121 also can be provided in the first mould 211 which is embodied as the upper mould adapted for mounting and fixing the circuit board 11. The light window forming block 214 and the base forming guide groove 215 can be formed in the first mould 211. When the first mould 211 and the second mould 212 are in the closed-mould position, the molding chamber 213 is formed. The circuit board 11 in the upper mound is arranged face down and the liquid molding material 13 is filled into the base forming guide groove 215 which is in a bottom side of the inverted circuit board 11, so that the bottom side of the inverted circuit board 11 forms the molded base 12.

More specifically, when the first mould 211 and the second mould 212 are in the closed-mould position and perform a molding step, the light window forming block 214 is overlappingly arranged on the middle chip overlapping region 111a of the base board 111 of the circuit board 11 and a bottom surface of the light window forming block 214 is firmly contacted with the middle chip overlapping region 111a of the base board 111 of the circuit board 11, so that the liquid molding material 13 is prevented from entering the middle chip overlapping region 111a of the base board 111 of the circuit board 11, so that the light window 122 of the molded base 12 is formed on the position of the light window forming block 214. While the base forming guide groove 215 is disposed on the edge region 111b, thus when the base forming guide groove 215 is filled with the liquid molding material 13, the liquid molding material 13 is integrally combined on the edge region 111b of the base board 111 of the circuit board 11 and is formed the molded base 12 on an outer side of the middle chip overlapping region 111a of the base board 111 of the circuit board 11 after solidification.

It is understandable that, in the embodiment of the present invention, the electronic components 112 of the circuit board 11 are arranged outside of the middle chip overlapping region 111a. In other words, the electronic components 112 of the circuit board 11 are mounted at position which is at an outside of the photosensitive element 20 thereof. In this way, the middle chip overlapping region 111a is not provided with the protruding electronic components 112, so that the middle chip overlapping region 111a of the base board 111 of the circuit board 11 provides a relatively flat surface, thus when the light window forming block 214 provided on the first mould 211 is contacted to the middle chip overlapping region 111a of the base board 111 of the base board 111, there are no protrusions between a bottom surface of the light window forming block 214 and the middle chip overlapping region 111a of the base board 111 of the circuit board 11 to form a gap which will result in the liquid molding material 13 entering the middle chip overlapping region 111a of the base board 111 of the circuit board 11. In other words, the bottom of the light window forming block 214 is firmly contacting to a top surface of the middle chip overlapping region 111a of the base board 111 of the circuit board 11, so that the liquid molding material 13 can only reach around the light window forming block 214 to prevent the flashing of the liquid molding material 13. In other words, the middle chip overlapping region 111a of the base board 111 of the circuit board 11 provides a mating face firmly contacting to the bottom of the light window forming block 214.

Furthermore, when the mould molding mould 210 is in the closed-mould position, the electronic components 112 is put in the base forming guide groove 215; thus when the liquid molding material 13 enters the base forming guide groove 215, the liquid molding material 13 is covered and coated over the surface of the electronic components 112.

It is worth mentioning that the light window forming block 214 further comprises a main forming body portion 2141 and a stair portion 2142 on a top end thereof. The stair portion 2142 is integrally formed with the main forming body portion 2141. A groove 123 of the molded base 12 is formed on a top end of the light window 122, so that the molded base 12 forms a stair shape top surface. Certainly in other embodiments, the groove 123 of the molded base 12 is not formed on the top end of the light window 122, instead, a flat top surface of the molded base 12 is formed on the top end of the electronic components 112. In this embodiment of the present invention, the optical filter 50 or the lens 30 can be mounted in the groove 123. In other words, the motor 40 or other member supporting the lens 30 can be mounted in the stair shape top surface of an outer side; or the stair shape top surface can be directly used to support the lens 30. Alternatively, a small holder is attached on the position of the groove 123 and is mounted with the optical filter 50 or a motor and lens. In addition, a shape of the light window 122 of the molded base 12 is not confined. In the embodiment of the present invention, the light window 122 is rectangle or circular and the light window forming block 214 correspondingly has a columnar configuration. In other embodiments, a cross section of the light window 122 is a frustum having increasing diameters.

It is understandable that a molding surface of the base forming guide groove 215 formed by the first mould 211 is configured to be a flat surface and is in the same plane, thus when the molded base 12 is solidified, the top surface of the molded base 12 is relatively flat, thereby providing a flat mounting condition for the motor 40, the lens 30 and other supporting members of the lens 30 and decreasing tilt errors of the assembled camera module 100.

It is worth mentioning that the base forming guide groove 215 and the light window forming block 214 are integrally molded in the first mould 211. In other embodiments, the first mould 211 further comprises a detachable molding configuration, the molding configuration is formed with the base forming guide groove 215 and the light window forming block 214. Thus, different shapes and sizes of the base forming guide groove 215 and the light window forming block 214 are designed according to different shapes and sizes of the molded circuit board 10 such as different diameters and thickness of the molded base. Thus, as long as to replace different molding configuration, the manufacturing equipment is adapted to be applied on different specification requirements of the molded circuit board 10. It is understandable that the second mould 212 correspondingly comprises a detachable fixed block to provide different shapes and sizes of the circuit board positioning groove 2121 so as to facilitate the replacement of different shapes and sizes of the circuit board 11.

The molding material feeding mechanism 220 comprises a material storing member 221, a material pushing member 222, a melting and heating arrangement 251 and has a material transporting channel 223. The material transporting channel 223 is communicated with the base forming guide groove 215. The material storing member 221 has a material storing groove 2211. The molding material 13 is placed in the material storing groove 2211 and the solid-state molding material 13 is heated and melted to turn into the liquid molding material 13. The material storing member 221 can be a separate box body, and also can be integrally formed in the second mould 212. In other words, the material storing groove 2211 can be formed at a partial position of the second mould 212. The material transporting channel 223 is integrally formed in the molding material feeding mechanism 220 or is formed by a suitable feeding tube communicating with the material storing groove 2211. In this embodiment of the present invention, the material transporting channel 223 is embodied as a guide groove at a bottom side of the first mould 211 or the second mould 212, such as the first mould 211 which is embodied as the upper mould thereon. When the first mould 211 and the second mould 212 are in the closed-mould position, the guide groove forms the material transporting channel 223 transforming the liquid molding material 13 to the base forming guide groove 215. It is understandable that after the molding process, a cured and solidified extension section of the solidified molding material 13 is formed in the material transporting channel 223. After the product is taken out, the material transporting channel 223 and the base forming guide groove 215 are cleaned according to requirements. The material pushing member 222 is a structure which is movable and is capable of pressing and pushing the molding material 13 in the material storing groove 2211 such as a plunger or a worm. The melting and heating arrangement 251 can be various structures which can heat the solid-state molding material 13 in the material storing groove 2211. For example, in one embodiment, an outer side of the material storing member 221 has a heating tube filled with heated fluid or an electric heating component.

It is understandable that the liquid molding material 13 which enters the base forming guide groove 215 is accurately quantified by weight; or the molding material feeding mechanism 220 comprises a dosing mechanism. For example, the amount of the liquid molding material 13 filled in the base forming guide groove 215 is controlled by calculating a flow rate of the molding material 13 and a diameter of the material transporting channel 223. Alternatively, the amount of the liquid is controlled by maintaining a pressure of the base forming guide groove 215 of the molding mould 210. Certainly, the quantitative controlling method disclosed above is not intended to be limiting and can be employed in other suitable manners.

When the molding mould 210 is the closed-mould position, the liquid molding material 13 is pushed into the base forming guide groove 215 through the material transporting channel 223 under the pushing and pressure increasing effects of the material pushing member 222, thereby the liquid molding material 13 filling around the light window forming block 214. Finally, during a solidifying process, the liquid molding material 13 in the base forming guide groove 215 is solidified and hardened to be integrally molded on the molded base 12 of the circuit board 11.

It is understandable that the molding material 13 is a heat fusible material such as a thermoplastic material. A melting and heating device turns the solid-state heat fusible material into the liquid molding material 13 by heating and melting. During the molding process, the hot melt molding material 13 is solidified by a cooling process. The molding mould 210 is also provided with a solidifying and temperature controlling arrangement 252. The solidifying and temperature controlling arrangement 252 provides a temperature-controlled environment and has a cooling effect on the molten liquid state molding material 13 in the base forming guide groove 215, thereby the molding material 13 is solidified to form the molded base 12.

The molding material 13 also can be a thermosetting material. The solid thermosetting molding material 13 is put into the material storing groove 2211. The thermosetting material is heated and melted to turn into the liquid molding material 13 by the melting and heating device. During the molding process, the thermosetting molding material 13 is solidified by a further heating process, and the molding material 13 cannot be melted again under the original low melting point after solidification, thereby forming the molded base 12.

Accordingly, when the molding material 13 is the thermosetting material, the solidifying and temperature controlling arrangement 252 configured on the molding mould 210 is a solidifying and temperature controlling arrangement so as to continue to heat the liquid thermosetting molding material 13 entering the base forming guide groove 215, so that the liquid thermosetting molding material 13 is heated to be solidified. It is understandable that the melting and heating device melting and heating the molding material 13 and the solidifying and temperature controlling arrangement which heats the molding material 13 to be solidified are separated heating unit or an integrated heating unit. When the integrated heating unit is in use, a melting and heating temperature and a solidifying and holing temperature can be consistent. It is worth mentioning that a melting and heating time in the material storing groove 2211 needs to be controlled so as to avoid the liquid molding material 13 being solidified inside the material storing groove 2211. So that when the solid-state molding material 13 is substantially completely melted to a liquid state, the molding material 13 is pushed into the transport mechanisms 224 by the material pushing member 222. Alternatively, when the solid-state molding material 13 begins to melt and is in a semi-solid state, the molding material 13 is pushed into the material transporting channel 223 by the material pushing member 222 during a melting process. When the heating units are different in a melting process and a solidifying process, the solid molding material 13 can be heated and melted to the liquid state under a relative low temperature condition, and then the molding material 13 is transported to be solidified under a high temperature condition.

It is understandable that the molding mould 210 can preheat the fixed circuit board 11 in advance. For example, the molding mould 210 preheats to the temperature of the solidifying process, so that during the molding process, the circuit board 11 and the liquid thermosetting molding material 13 have not too much difference in temperature, so that the liquid molding material 13 is firmly bonded to the surface of the circuit board 11.

It is understandable that in this embodiment of the present invention, a molding process is illustrated. In a practice, a plurality of separated circuit boards 11 can be molded simultaneously. In other words, the molding material 13 in the material storing groove 2211 is simultaneously transported to a plurality of separated circuit boards 11 by a plurality of material transporting channels 223 after heating and melting for the molding process. Alternatively, a joint board array operation mentioned in the flowing embodiment is also adapted.

Referring to FIG. 5 to FIG. 9B of the drawings, a manufacturing process of the molded base 12 of the camera module 100 according to the preferred embodiment of the present invention is illustrated. Wherein the sectional views of the FIG. 5 to FIG. 9A of the drawings are along a direction of B-B line of the FIG. 5, the sectional view of the FIG. 9B of the drawings is along a direction of C-C line of the FIG. 5.

Figure 5:
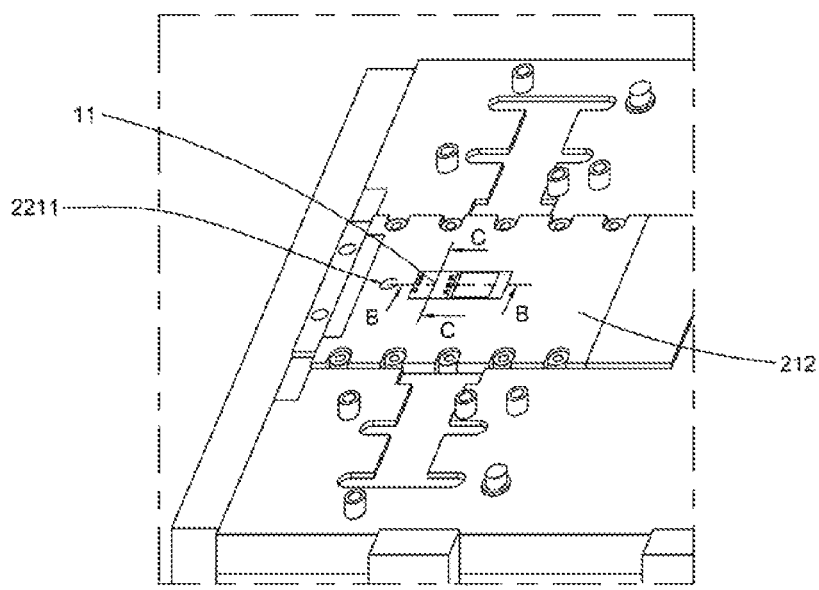
FIG. 5 is a perspective view of the second mound of the molding mould of the manufacturing equipment for the molded circuit board placed a circuit board according to the above preferred embodiment of the present invention.
Figure 6:
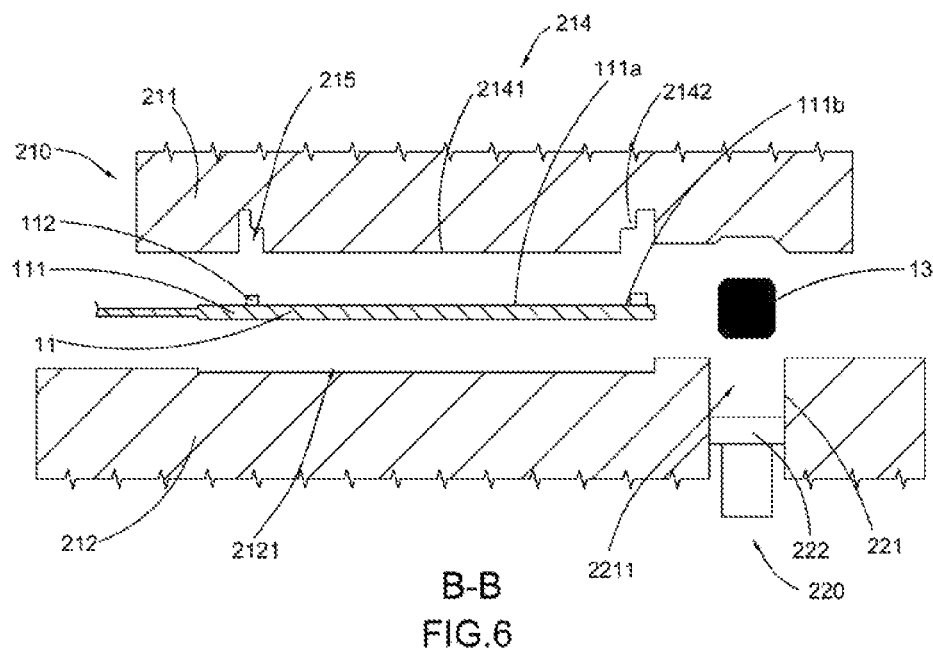
FIG. 6 is a cross-sectional view illustrating positions of a circuit board and a molding material being arranged in the molding mould of the manufacturing equipment for the molded circuit board according to the above preferred embodiment of the present invention, wherein the cross-sectional view is along a B-B line of the FIG. 5.

As shown in FIG. 5 and FIG. 6 of the drawings, before the molding process, in the embodiment, the circuit board 11 is fixed to the second mould 212 which is the lower mould. The solid-state molding material 13 is provided at a side of the circuit board 11.

Figure 7:
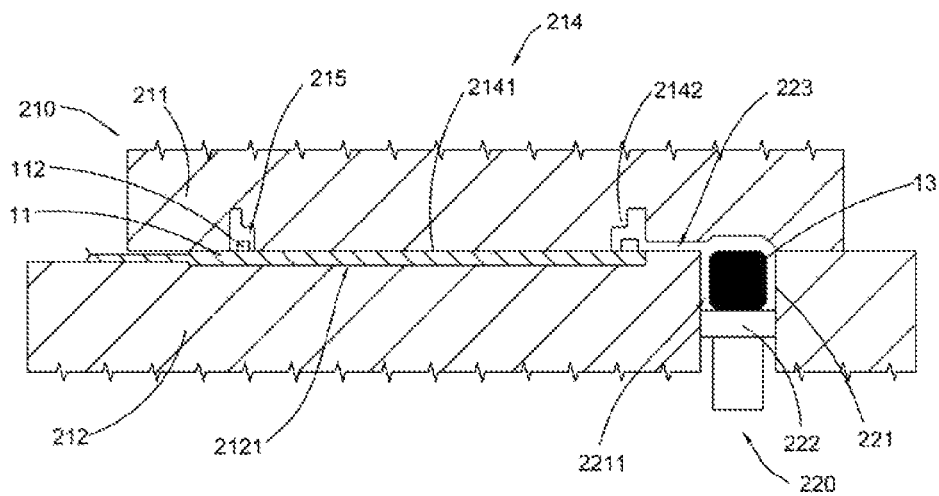
FIG. 7 is a cross-sectional view of the molding mould of the manufacturing equipment for the molded circuit board positioned the circuit board and the molding material according to the above preferred embodiment of the present invention; the cross-sectional view is along a B-B line of the FIG. 5.

As shown in FIG. 7 of the drawings, the molding mould 210 is in the closed-mould position, the circuit board 11 is about to be molded and the solid-state molding material 13 is ready in position. The solid-state molding material 13 is heated, so that the molding material 13 is melted to turn into the liquid state. It is understandable that in other embodiment, the melt molding material 13 which is in the liquid state or in a semi-solid state enters the material storing groove 2211 transported by tubes.

Figure 8:
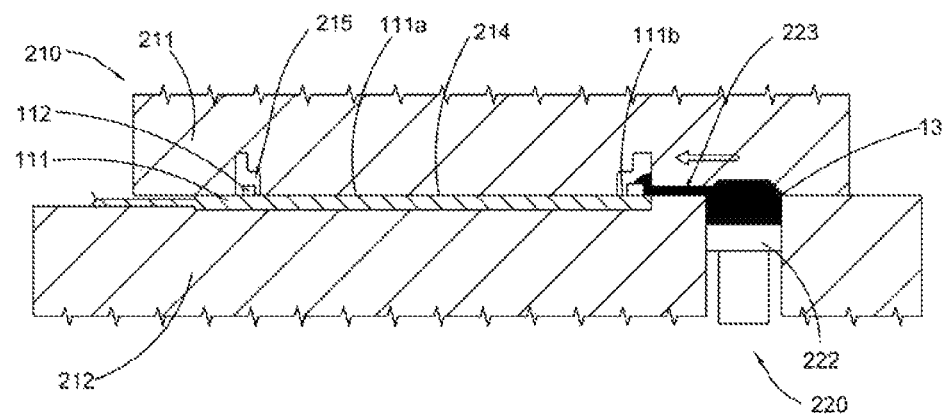
FIG. 8 is a cross-sectional view of the molding mould of the manufacturing equipment for the molded circuit board according to the above preferred embodiment of the present invention, illustrating that the liquid material is pushed into the base forming guide groove by the molding mould; the cross-sectional view is along a B-B line of the FIG. 5.

As shown in FIG. 8 of the drawings, the melted molding material 13 enters the base forming guide groove 215 along the material transporting channel 223 under the effect of the material pushing member 222 and reaches around the light window forming block 214. It is understandable that the molding material 13 can be completely melted into the liquid state and then be pushed in the material transporting channel 223 by the material pushing member 222; or the molding material 13 in a semi-melt state is pushed in the material transporting channel 223 and the solid-state molding material 13 is then completely melted into the liquid molding material 13 by the molding mould 210 providing a heating environment.

Figure 9A:
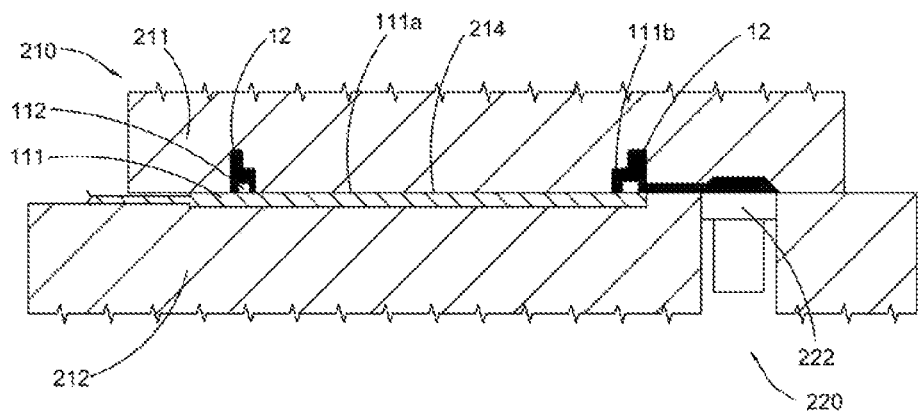
FIG. 9A is a cross-sectional view of the molding mould of the manufacturing equipment for the molded circuit board according to the above preferred embodiment of the present invention, illustrating that the molding mould performs a molding process to form the molded base; the cross-sectional view is along a B-B line of the FIG. 5.
Figure 9B:
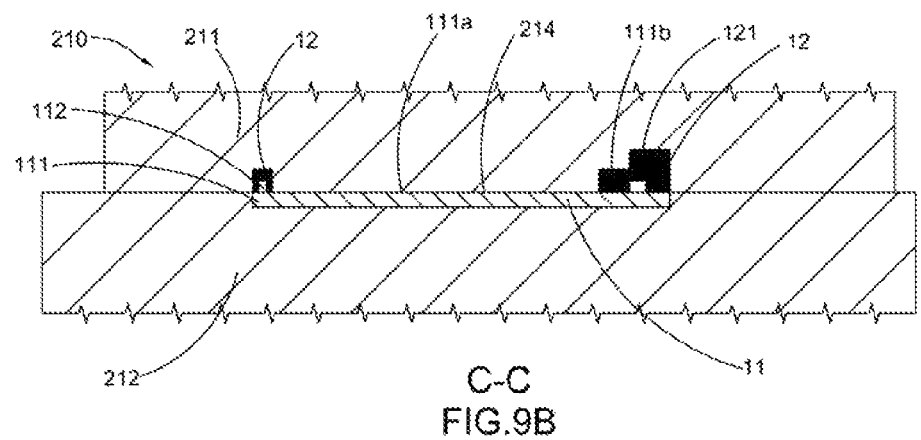
FIG. 9B is a cross-sectional view of the molding mould of the manufacturing equipment for the molded circuit board according to the above preferred embodiment of the present invention, illustrating that the molding mould performs the molding process to form the molded base; the cross-sectional view is along a C-C line of the FIG. 5.
Figure 10:
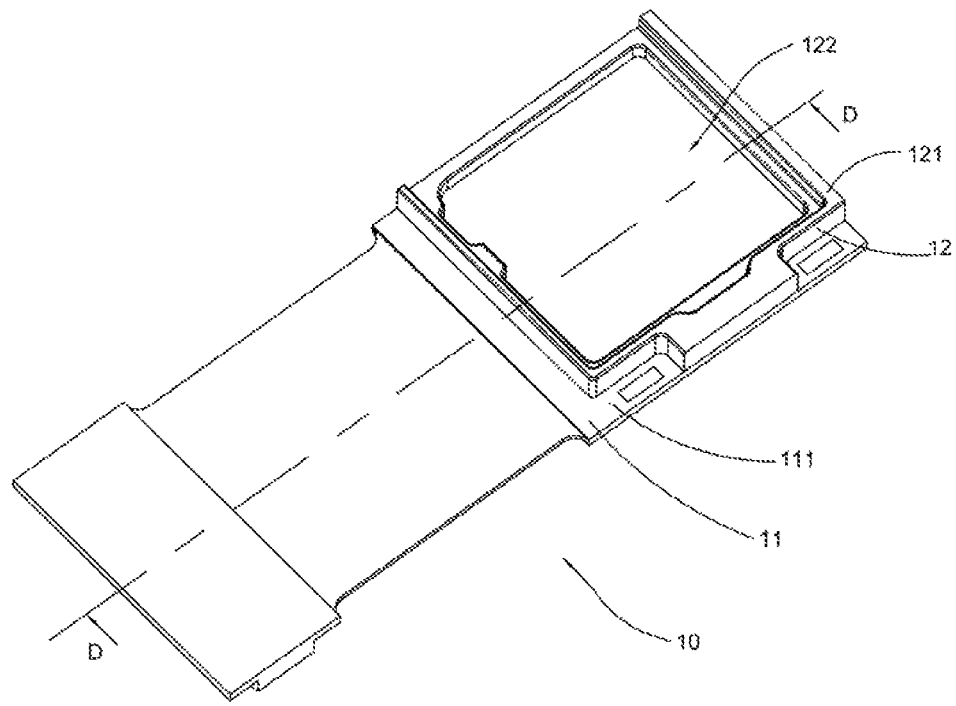
FIG. 10 is a perspective view of the molded circuit board manufactured by the manufacturing process according to the above embodiment of the present invention.
Figure 11:
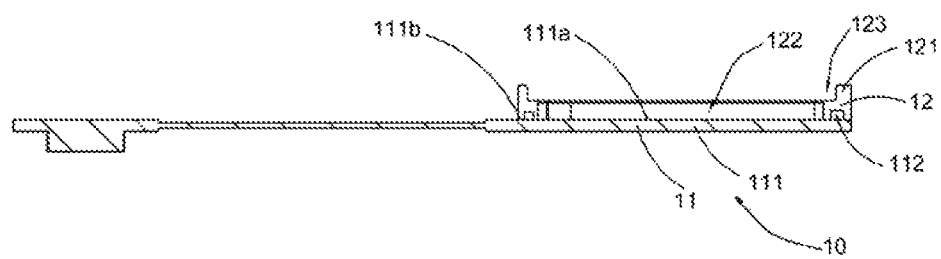
FIG. 11 is a cross-sectional view of the molded circuit board manufactured by the manufacturing process; the cross-sectional view is along a D-D line.

As shown in FIG. 9A and FIG. 9B of the drawings, when the base forming guide groove 215 is filled with the liquid molding material 13, the liquid molding material 13 is solidified and integrally formed on the molded base 12 of the circuit board 11 after the solidifying process. Take the molding material 13 being embodied as a thermosetting material as an example, in the embodiment of the present invention, the heated and melt liquid molding material 13 is solidified after being heated. For example, the molding material 13 can be heated under an increasing temperature or heated for a predetermined time under a constant temperature. For example, the molding material 13 is heated for a predetermined time under a constant temperature, in one embodiment, the liquid molding material 13 is heated under a predetermined temperature such as 175° C. for a first preset time to be melted into the liquid state, and the liquid molding material 13 is transported to the base forming guide groove 215. Then the liquid molding material 13 in the base forming guide groove 215 is heated under a predetermined and constant temperature for a second preset time such that the liquid molding material 13 is solidified. It is understandable that the predetermined temperature, the first preset time and the second preset time are exemplary only and not intended to be limiting. According to material properties of the molding material 13 and the molding process requirements, the predetermined temperature, the first preset time and the second preset time are adjusted. For example, the predetermined temperature has a range of 110-250° C., a melting and heating time has a range of 2-10 s and a solidifying and heating time has a range of 15 s-5 min. The present invention is not confined by the number and ranges of the embodiment. In addition, after the molding process is finished, the manufactured molded circuit board 10 can be removed from the molding mould 210 and is continued to be heated and solidified for a preset time such as 1-5 hours in a baking facility.

Figure 21:
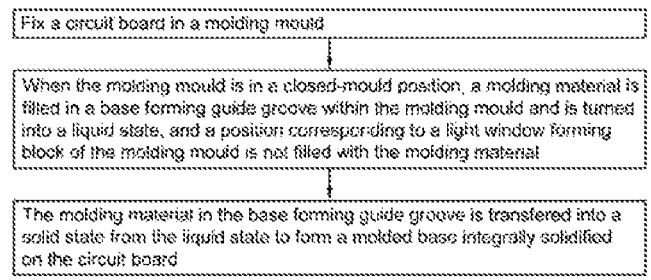
FIG. 21 is a flow diagram illustrating a manufacturing method of the molded circuit board according to the above embodiment of the present invention.

In addition, as shown in FIG. 21 of the drawings, a manufacturing method of the molded circuit board 10 of the camera module 100 according to the embodiment of the present invention is illustrated, the manufacturing method comprises the following steps.

A step of fixing the circuit board 11: fix the circuit board 11 in the molding mould 210;

A step of filling the molding material 13: when the molding mould 210 is in a closed-mould position, the liquid molding material 13 fills the base forming guide groove 215 of the molding mould 210, wherein the position of the light window forming block 214 of the molding mould 210 is not filled with the molding material 13; and A step of solidifying the liquid molding material 13: in the molding mould 210, the molding material 13 within the base forming guide groove 215 is turned into a solid-state from the liquid state.

It is understandable that in the step of fixing the circuit board 11, the molding mould 210 is in an open-mould position, the circuit board 11 is fixed at the second mould 212 of the molding mould 210. Alternatively, the circuit board 11 is fixed at the first mould 211 of the molding mould 210. In the embodiment of the present invention, the circuit board 11 is fixed at the second mould 212 which is the lower mould, and the electronic components 112 of the circuit board 11 is disposed on a top side so as to be integrally covered and coated by the molding material 13 in the subsequent molding steps.

In the step of filling the molding material 13 according to the embodiment of the present invention, further comprising a step: supply the solid-state molding material 13 in the material storing groove 2211 in advance before the molding mould 210 is in the closed-mould, and the solid-state molding material 13 is a solid material block or a solid powder; the solid molding material 13 is melted and enters into the base forming guide groove 215 through the material transporting channel 223 by a pushing effect of the material pushing member 222. After the pushing effect is finished, the liquid molding material 13 is filled in the base forming guide groove 215.

In the step of solidifying the liquid molding material 13, when the molding material 13 is a thermosetting material, the molding chamber 213 of the molding mould 210 provides a heating environment, so that the liquid molding material 13 is heated to be solidified and is integrally formed the molded base 12 on the circuit board 11, and the molded base 12 is covered and coated on the electronic components 112; when the molding material 13 is a hot melting material, the liquid molding material 13 is cooled inside the molding mould 210, so that the liquid molding material 13 is cooled to be solidified and is integrally formed the molded base 12 on the circuit board 11.

Figure 14:
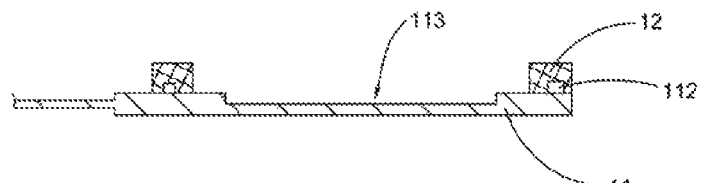
FIG. 14 is a cross-sectional view of the molded circuit board according to an alternative mode of the present invention.
Figure 15A:
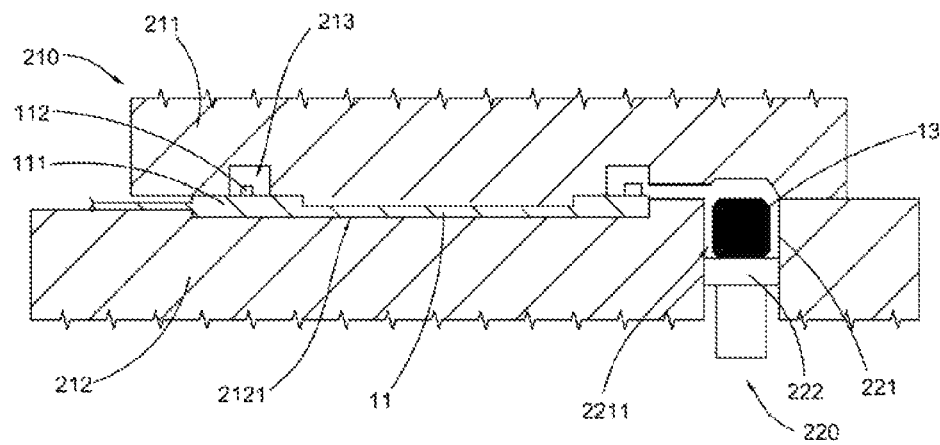
FIG. 15A is a cross-sectional view of the molded circuit board when the molding mould is in the closed-mould position and before the molded circuit board is molded out according to the alternative mode of the present invention.
Figure 15B:
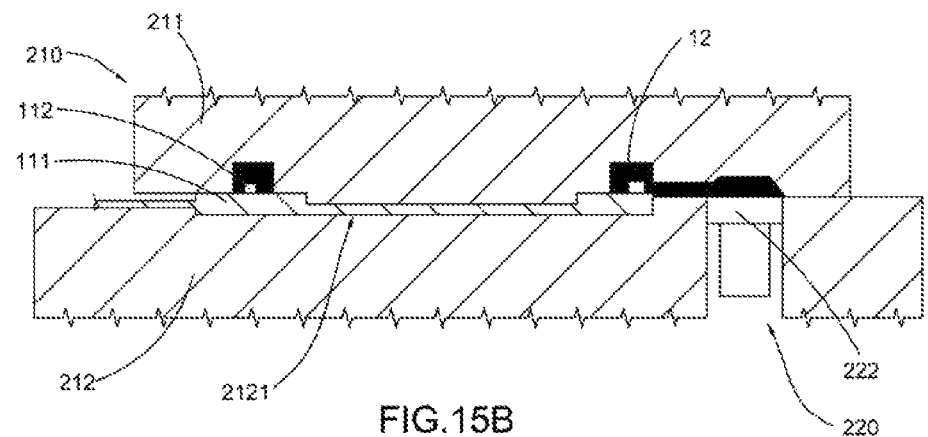
FIG. 15B is a cross-sectional view of the molded circuit board when the molding mould is in the closed-mould position and after the molded circuit board is molded out according to the alternative mode of the present invention.

As shown in FIG. 14, FIG. 15A and FIG. 15B of the drawings, one skilled in the art will understand that in other embodiments, the middle chip overlapping region 111a of the base board 111 of the circuit board 11 is concave. In other words, the middle chip overlapping region 111a of the base board 111 of the circuit board 11 and the edge region 111b are not in a same plane As the middle chip overlapping region 111a is concave, a concave groove 113 is formed on a top side of the base board 111 of the circuit board 11. Thus the light window forming block 214 is protruded from base forming guide groove 215 and a bottom end of the light window forming block 214 is extended to the concave groove 113; and the light window forming block 214 is contact with the concave middle chip overlapping region 111a, thereby further prevent the liquid molding material 13 from entering the concave groove 113 and reaching to the middle chip overlapping region 111a. In addition, after the circuit board 11 having the concave groove 113 is integrally formed the molded base 12, the photosensitive element 20 is mounted in the concave groove 113.

In addition, in the above embodiment, after the molded base 12 is integrally molded on the circuit board 11 to obtain the molded circuit board 10, the photosensitive element 20 is assembled on a top side of the circuit board 11 of the molded circuit board 10 and on an inner side of the molded base 12 in a COB manner. In other alternative mode, after the molded base 12 is formed and the circuit board 11 is provided with an opening hole, the photosensitive element 20 is assemble with the circuit board 11 by the flip chip process.

Figure 16A:
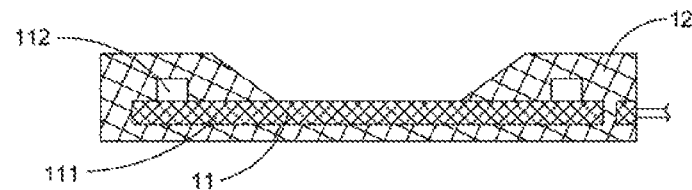
FIG. 16A is a cross-sectional view of the molded circuit board according to another alternative mode of the present invention.
Figure 16B:
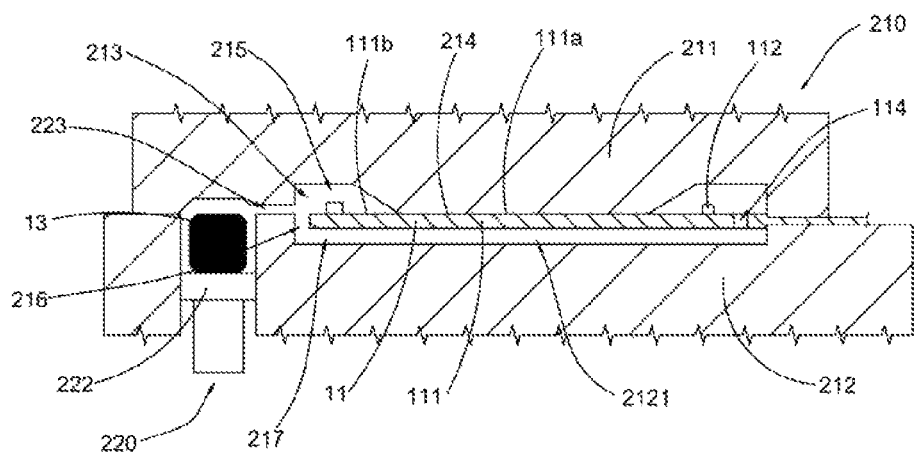
FIG. 16B is a cross-sectional view of the molded circuit board when the molding mould is in the closed-mould position and before the molded circuit board is molded out according to the alternative mode of the present invention.
Figure 16C:
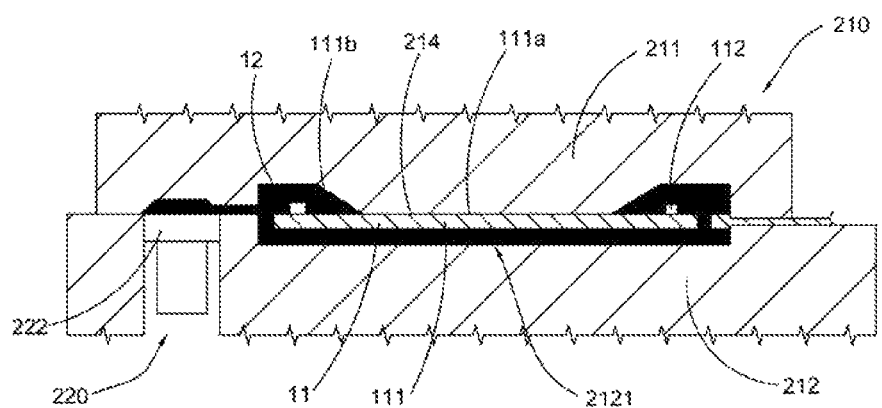
FIG. 16C is a cross-sectional view of the molded circuit board when the molding mould is in the closed-mould position and after the molded circuit board is molded out according to the alternative mode of the present invention.

Referring to FIG. 16A to FIG. 16C of the drawings, an alternative mode according to the above embodiment of the present invention is illustrated. In the alternative mode, the manufacturing equipment 200 is capable of manufacturing the molded base 12 not only coating on the top surface of the circuit board 11. Specifically, at least one side surface and at least one bottom surface of the molded base 12 is covered and coated with the molding material 13, thereby not only enhancing a strength of the molded circuit board 10, but also facilitating that the molded circuit board 10 is cut to obtain an end product along a side of being covered and coated.

As shown in FIG. 16B and FIG. 16C of the drawings, when the molding mould 210 is in the closed-mould position, at least one side of the circuit board 11 has a side guide groove 216 and a back surface of the circuit board 11 has a bottom guide groove 217. The side guide groove 216 and the bottom guide groove 217 are communicated with the material transporting channel 223. Thus when the liquid molding material 13 enters the molding mould 210 through the material transporting channel 223, the liquid molding material 13 is capable of filling in the base forming guide groove 215, the side guide groove 216 and the bottom guide groove 217. Therefore, after the solidifying step, the molded base 12 further coats at least one side surface and at least one bottom surface of the circuit board 11. It is understandable that, in other embodiment, except for forming the annular molding body 121, the molded base 12 only coats at least one side surface of the circuit board 11 or only coats at least one bottom surface of the circuit board 11.

In addition, the base board 111 of the circuit board 11 further comprises one or more through-holes 114. Therefore, in the molding process, the liquid molding material 13 further enters and fulfills the through-holes 114 so as to further enhance the strength of the formed integral molded structure. In this embodiment, the through-holes 114 are further communicated with the base forming guide groove 215 and the bottom guide groove 217. It is understandable that the through-holes 114 and the side guide groove 216 may not necessarily be both provided.

Figure 17:
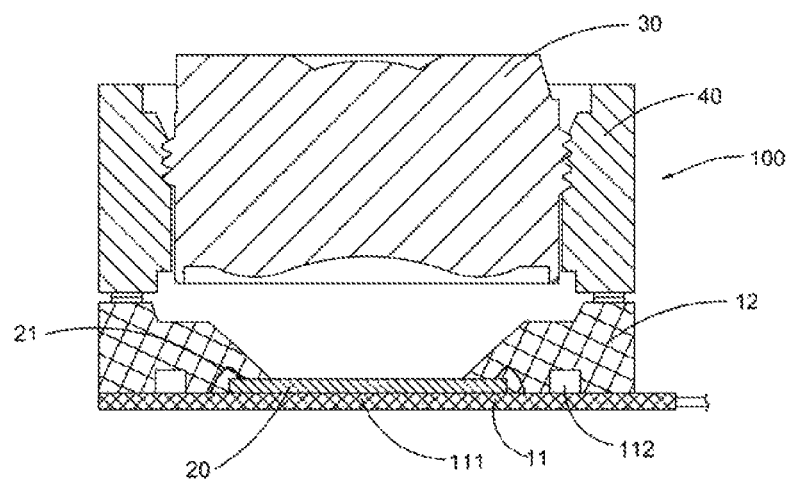
FIG. 17 is a cross-sectional view of the molded circuit board according to another alternative mode of the present invention.
Figure 18:
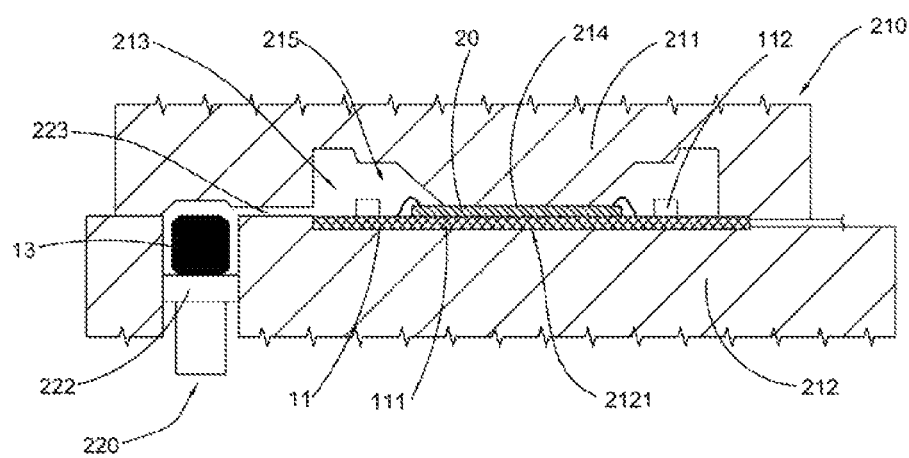
FIG. 18 is a cross-sectional view of the molded circuit board when the molding mould is in the closed-mould position and before the molded circuit board is molded out according to the alternative mode of the present invention.
Figure 19:
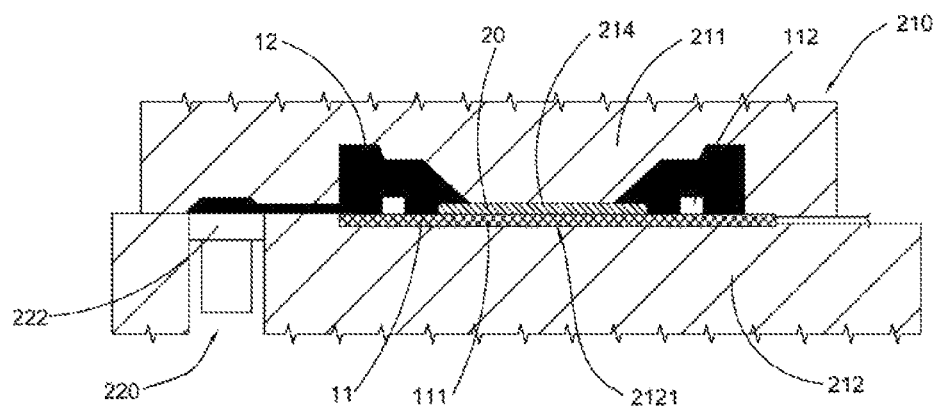
FIG. 19 is a cross-sectional view of the molded circuit board when the molding mould is in the closed-mould position and after the molded circuit board is molded out according to the alternative mode of the present invention.

As shown in FIG. 17 to FIG. 19 of the drawings, in another alternative mode, the manufacturing equipment 200 is capable of manufacturing the molded circuit board 10 which is integrally packaged with the photosensitive element 20. In this alternative mode, the integrally formed molded base 12 is integrally covered and coated on the circuit board 11 and the photosensitive element 20.

More specifically, the photosensitive element 20 is electrically connected to the circuit board 11 in advance. For example, the circuit board 11 is electrically conducted to the circuit board 11 by lead wires in the COB process. As shown in FIG. 17 of the drawings the photosensitive element 20 is electrically connected to the circuit board 11 by one or more lead wires 21. And a top surface of the photosensitive element 20 has a photosensitive area portion 201 and a non-photosensitive area portion 202 which is positioned around the photosensitive area portion 201. In other words, the photosensitive area portion 201 is disposed on a center position and the non-photosensitive area portion 202 is disposed on an outer edge of the photosensitive element 20.

When the molding mould 210 is in the open-mould position, the circuit board 11 electrically connected with the photosensitive element 20 is mounted on the second mould 212. As shown in FIG. 18 and FIG. 19 of the drawings, when the molding mould 210 is in the closed-mould position the circuit board 11 connected with the photosensitive element 20 is positioned in the molding chamber 213 of the molding mould 210. The light window forming block 214 is contacted with at least the photosensitive area portion 201 of the photosensitive element 20. The lead wires 21 and the electronic components 112 of the circuit board 11 are positioned in the base forming guide groove 215. Therefore, when the liquid molding material 13 enters the molding mould 210 through the material transporting channel 223, the liquid molding material 13 only reaches around the lead wires 21 and is in the base forming guide groove 215. In other words, the liquid molding material 13 is prevented from entering the photosensitive area portion 201 of the photosensitive element 20. Eventually, the liquid molding material 13 is solidified to form the annular molding body 121 in an outer side of the photosensitive area portion 201 of the photosensitive element 20. In other words, the annular molding body 121 is integrally formed on at least one portion of the non-photosensitive area portion 202 along an annular outer edge of the photosensitive element 20.

It is understandable that the molded base 12 is fixed to the circuit board 11 and the photosensitive element 20 by the molding process without a bonding process. Compared with the bonding process, the molding process has a better connection stability and a control-ability of the process and there is no need to reserve a leveling adjustment glue space in advance such that the thickness of the camera module is reduced; on the other hand, the molded base 12 coats the electronic components 112 and the lead wires 21. Unlike the molded base 12 is only molded on the circuit board 11 in the above embodiment, there is no need to reserve an operating space of connecting the photosensitive element 20 to the circuit board 11 by the lead wires in the subsequent operation, so that the molded base 12 is extended to the non-photosensitive area portion 202 of the photosensitive element 20 in this embodiment of the present invention and the molded base 12 is shorted inwardly, thereby reducing a horizontal size in length and width of the camera module 100.

It is worth mentioning that the photosensitive element 20 usually thin and fragile, so it has to ensure that the photosensitive element 20 from bearing too much pressure and being crushed when designing the isolation means. Meanwhile, a lead wire 21 will usually be provided between the photosensitive element 20 and the circuit board 11. The lead wire curvingly and bendingly extends between the photosensitive element 20 and the circuit board 11 to connect and communicate the circuit board 11 and the photosensitive element 20. Correspondingly, the design of the isolation means of the photosensitive element 20 has to consider reserving space for the lead wire, so as to avoid the lead wire 21 from being pressed to distort or even broken away from the photosensitive element 20 or the circuit board 11 during the isolation environment building process for the photosensitive element 20. As a result, the structure of the molding mould 110 has to improve and adjust correspondingly, so as to avoid the above mentioned issues.

Furthermore, in another alternative mode, after the photosensitive element 20 is assembled with the circuit board 11, the optical filter 50 is further overlappingly arranged on the photosensitive element 20, then an overall photosensitive structure assembly formed by the photosensitive element 20 and the circuit board 11 which is overlapped with the optical filter 50 is mounted on the molding mould 210. When the molding mould 210 is in the closed-mould position, the light window forming block 214 is contacted with the center area of the optical filter 50 to prevent the molding material 13 from entering the center area of the optical filter 50. The liquid molding material 13 entering the base forming guide groove 215 is capable of being integrally molded on the circuit board 11 and an edge area of the optical filter 50 after being solidified; and the liquid molding material 13 is covered and coated on the electronic components 112 of the circuit board 11, so that the circuit board 11, the photosensitive element 20 and the optical filter 50 form an integral packaging structure by the molded base 12.

Figure 20:
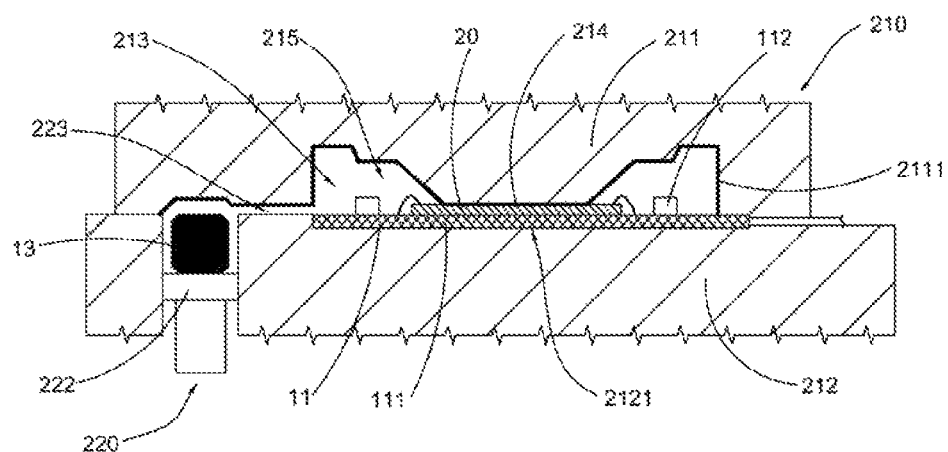
FIG. 20 is a cross-sectional view of the molded circuit board when the molding mould is in the closed-mould position and after the molded circuit board is molded according to another alternative mode of the present invention.

As shown in FIG. 20 of the drawings, according to the embodiment of the FIG. 17 to FIG. 19 of the drawings, another improved embodiment of the present invention is illustrated. The first mould 211 of the molding mould 210 which is the upper mould is attached with a cover film 2111, so that when the first mould 211 and the second mould 212 of the molding mould 210 are in the closed-mould position, a sealing performance of the molding mould 210 and the circuit board 11 which is about to be molded is enhanced and it is convenient to remove modules from the moulds after the molding process.

It is understandable that in other alternative modes, the molding surface of the first mould 211 of the molding mould 210 forms an addition layer by electroplating or other suitable methods so as to improve the performance of the molding surface such as hardness. Alternatively, a suitable material is chosen to prevent the circuit board 11 and the photosensitive element 20 from being scratched.

Referring to FIG. 22 to FIG. 35 of the drawings, the molded circuit board 10 of the camera module 100 and the manufacturing equipment 200 therefor according to another embodiment are illustrated. In the embodiment, the manufacturing equipment 200 is capable of simultaneously manufacturing an integral piece of molded circuit board array 1000. The integral piece of molded circuit board array 1000 can be a semi-finished product and then be cut according to requirements to obtain a plurality of separated molded circuit board assemblies 10 as finished products.

Figure 22:
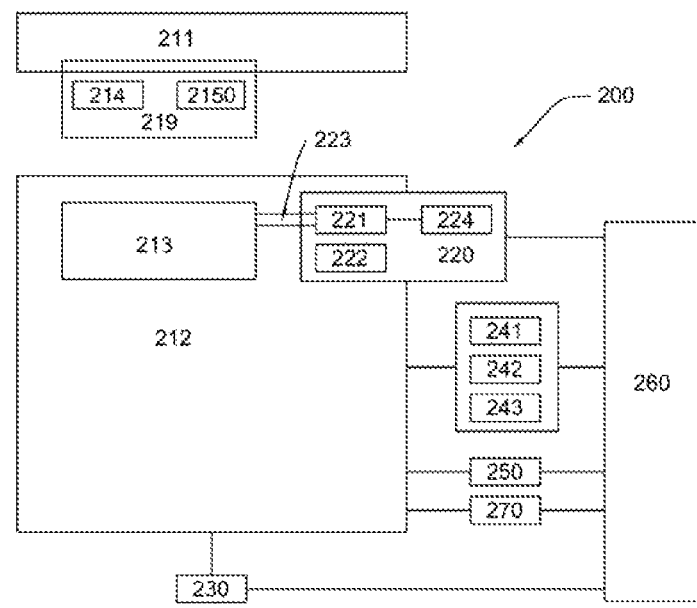
FIG. 22 is a block diagram illustrating a manufacturing equipment for an integral piece of molded circuit board array according to another embodiment of the present invention.
Figure 23:
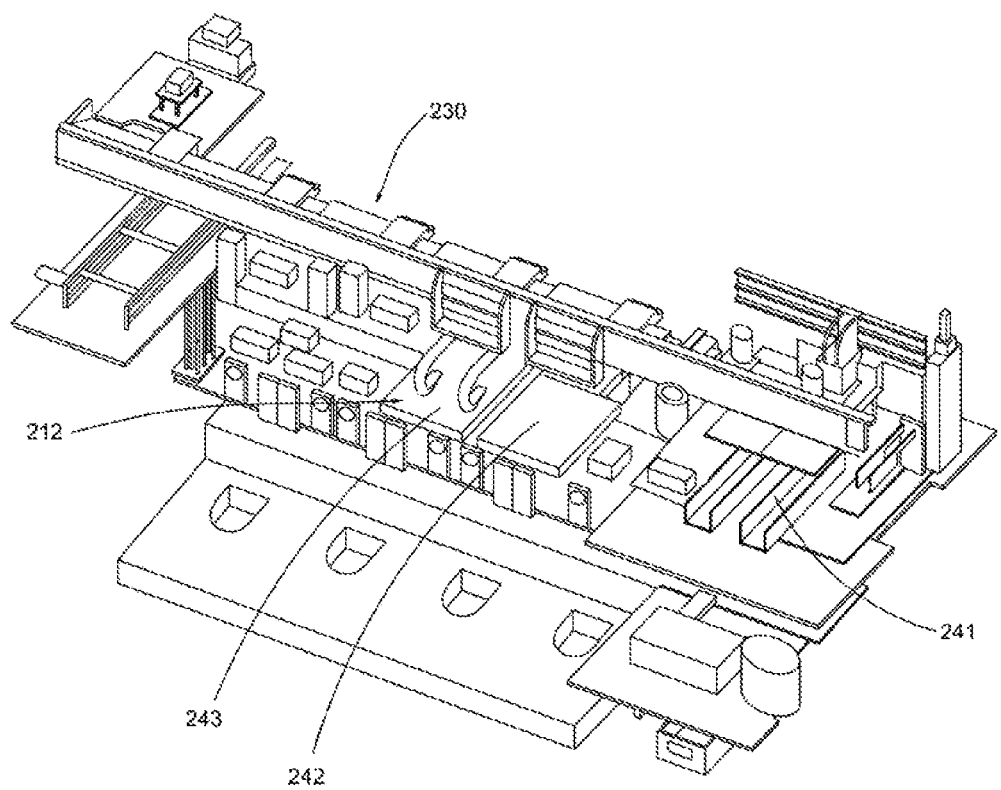
FIG. 23 is a perspective view of the manufacturing equipment for the integral piece of molded circuit board array according to above embodiment of the present invention.
Figure 24A:
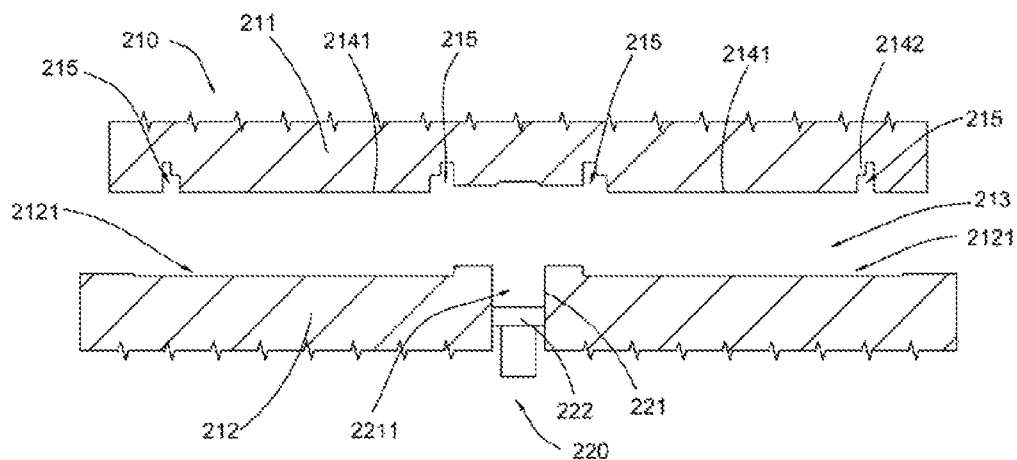
FIG. 24A is a cross-sectional view of the molding mould of the manufacturing equipment for the integral piece of molded circuit board array according to the above embodiment of the present invention along a length direction when the molding mould is in the open-mould position.
Figure 24B:
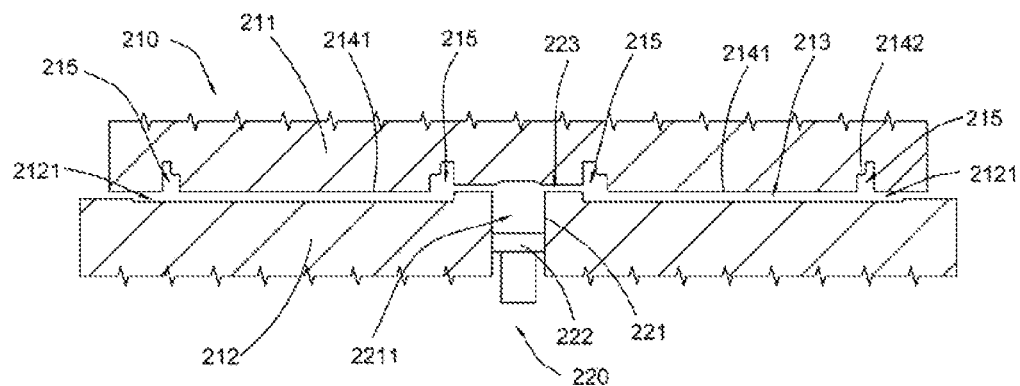
FIG. 24B is a cross-sectional view of the molding mould of the manufacturing equipment for the integral piece of molded circuit board array according to the above embodiment of the present invention along a length direction when the molding mould is in the closed-mould position.
Figure 25A:
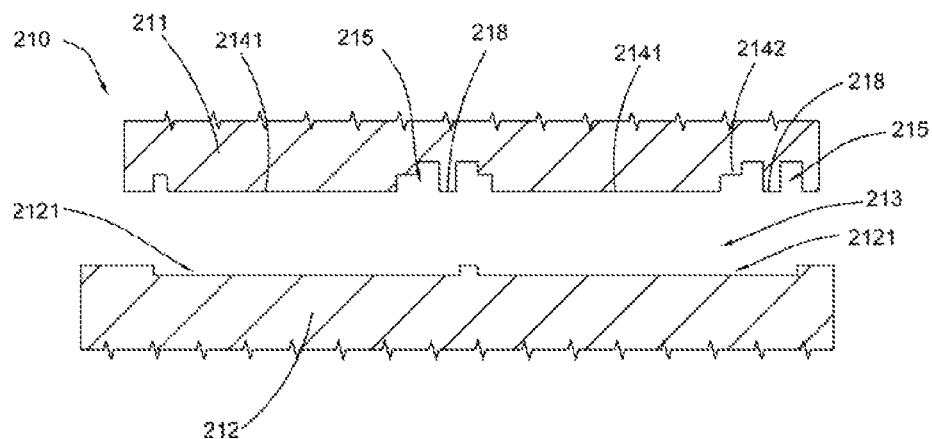
FIG. 25A is a cross-sectional view of the molding mould of the manufacturing equipment for the integral piece of molded circuit board array according to the above embodiment of the present invention along a width direction when the molding mould is in the open-mould position.
Figure 25B:
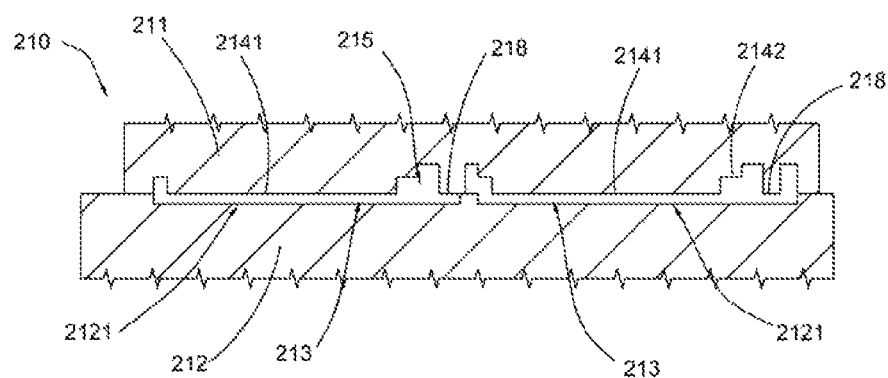
FIG. 25B is a cross-sectional view of the molding mould of the manufacturing equipment for the integral piece of molded circuit board array according to the above embodiment of the present invention along a length direction when the molding mould is in the closed-mould position.
Figure 26A:
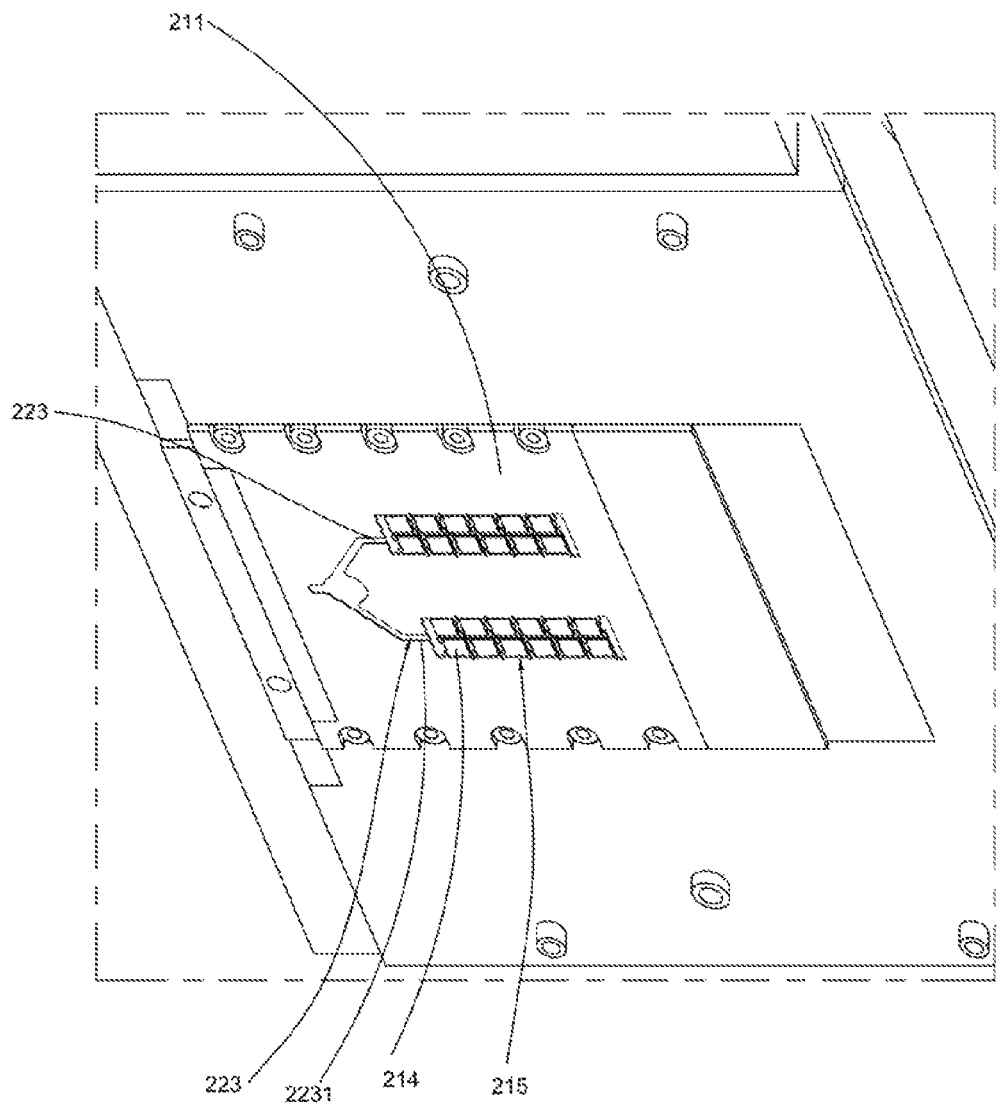
FIG. 26A is a perspective view of a first mould of the manufacturing equipment for the integral piece of molded circuit board array according to another preferred embodiment of the present invention.
Figure 26B:
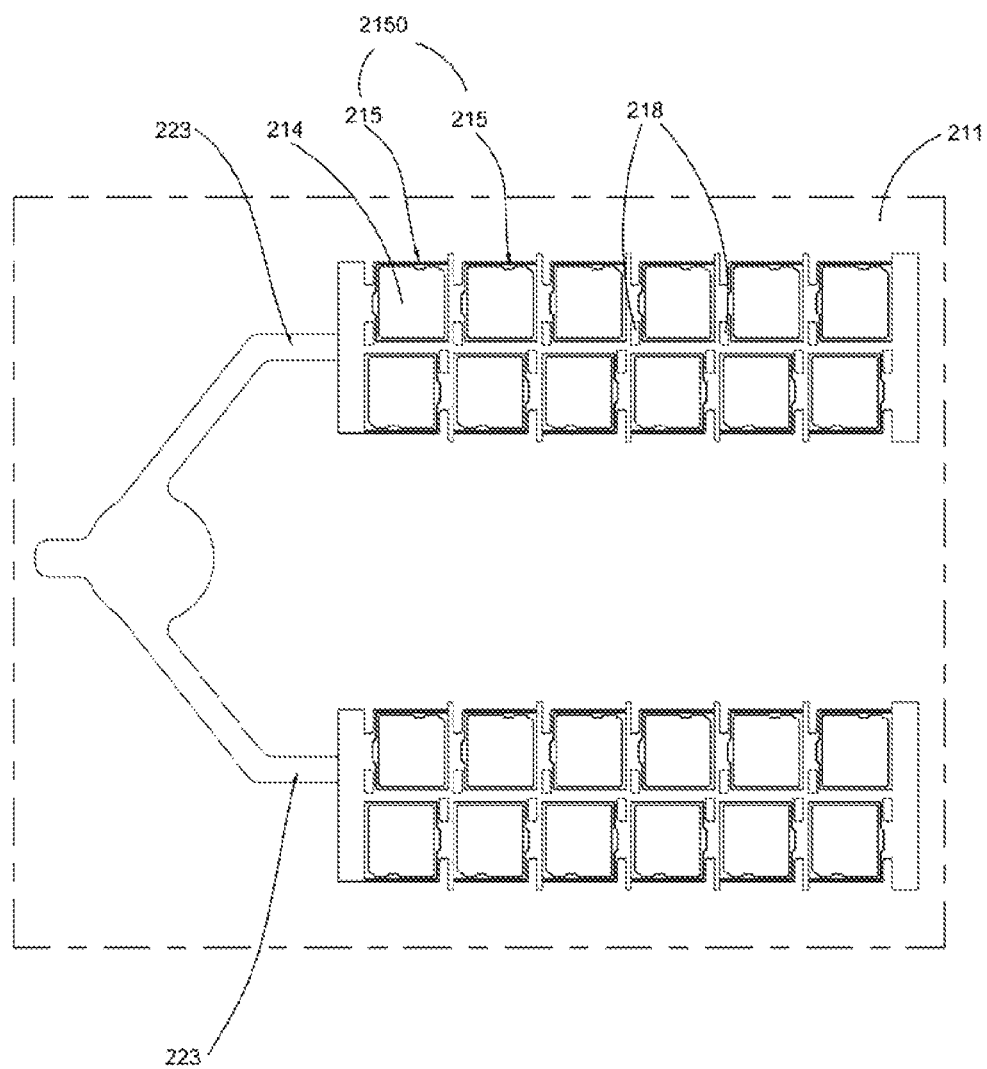
FIG. 26B is a perspective view of a light window forming block and a base array forming guide groove of the first mould of the molding mould of the manufacturing equipment for the integral piece of molded circuit board array according to the above embodiment of the present invention.
Figure 27:
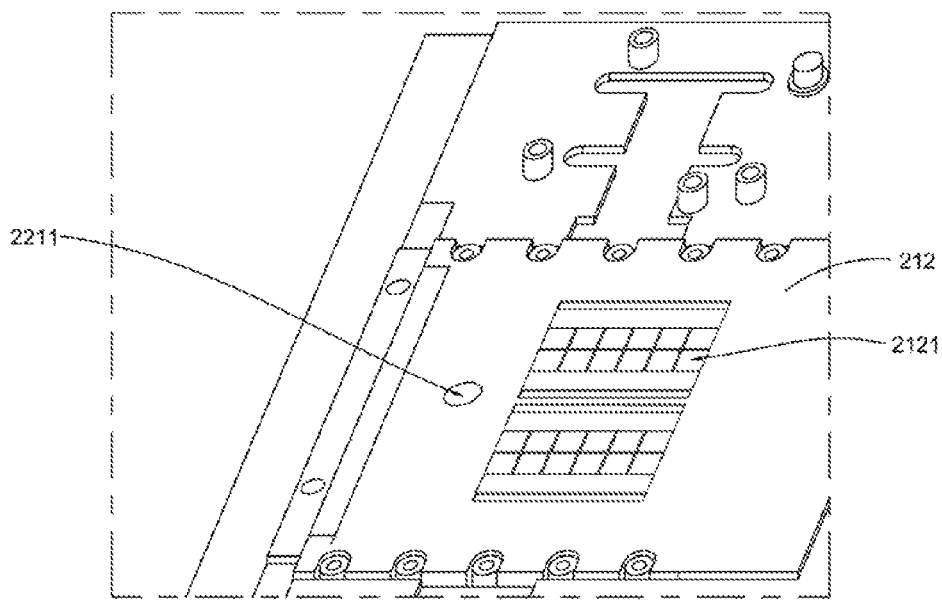
FIG. 27 is a perspective view of a second mound of the molding mould of the manufacturing equipment for the integral piece of molded circuit board array according to the above embodiment of the present invention.

More specifically, as shown in FIG. 22 and FIG. 23 of the drawings, the manufacturing equipment 200 comprises a molding mould 210, a molding material feeding mechanism 220, a mould fixing unit 230, a circuit board array feeding mechanism 240, a temperature control unit 250 and a controller 260. The molding mould 210 comprises a first mould 211 and a second mould 212. The first mould 211 and the second mould 212 are capable of opening and closing mould. The mould fixing unit 230 is capable of opening and closing the first mould 211 and the second mould 212. The molding material feeding mechanism 220 supplies the molding material 13 into the inside of the molding mould 210. The circuit board array feeding mechanism 240 automatically supplies one or more circuit board array 1100 to the molding mould 210. The controller 260 controls operations of the manufacturing equipment 200.

More specifically, when the molding mould 210 is in the closed-mould position, the molding mould 210 is formed a molding chamber 213 and is provided with a plurality of light window forming blocks 214, and the molding mould 210 has one or more base array forming guide groove 2150. In other words, the base forming guide grooves 215 are communicated with each other and form an overall guide groove.

It is worth mentioning that the base array forming guide groove 2150 and the light window forming block 214 can be detachable formed the first mould 211. In other words, the first mould 211 further comprises a detachable mould structure 219. The mould structure 219 is formed with the base array forming guide groove 2150 and the light window forming block 214. Therefore, the base array forming guide groove 2150 and the light window forming block 214 with different shapes and sizes are designed according to the integral piece of molded circuit board array 1000 with different shapes and sizes such as according to a required diameter and thickness of the molded base 12. Therefore, as long as to replace different mould structures 219, the manufacturing equipment 200 is capable of adapting to manufacture the integral piece of molded circuit board array 1000 with different specification requirements. It is understandable that the second mould 212 correspondingly comprises detachable fixing blocks so as to provide the circuit board positioning groove 2121 with different shapes and sizes, thereby conveniently replacing circuit board array 1100 with different shapes and sizes.

Similarly, the first mould 211 and the second mould 212 are capable of having a relative displacement under a drive effect of the mould fixing unit 230. For example, one of the moulds is fixed and other one is driven to move by the mould fixing unit 230; alternatively, the two moulds are both driven to move by the mould fixing unit 230. In the embodiment of the present invention, the first mould 211 is applied as a fixed upper mould, the second mould 212 is embodied as a movable lower mould, and the mould fixing unit 230 drives the second mould 212 to move vertically. In other words, the mould fixing unit 230 is capable of driving the second mould 212 to move upwardly to operate with the first mould 211 such that the molding mould 210 is in the closed-mould. When the material needs to be supplied or after the molding process, the mould fixing unit 230 is capable of driving the second mould 212 to move downward and to depart from the first mould 211.

One skilled in the art will understand that the mould fixing unit 230 can be various arrangements which are capable of driving the second mould 212 to move. For example, in one embodiment, the mould fixing unit 230 is embodied as a pressing arrangement. Under the drive of the power supply such as electric motors, hydraulic pressure, air pressure and so on, the second mould 212 is pushed to move upwardly and is firmly contacted to the first mould 211 so as to form a relative enclosed molding chamber 213. When the closed-mould is needed to be changed, the press arrangement drives the second mould 212 to move downward under an opposite driving effect, so that the first mould 211 and the second mould 212 are separated.

It is worth mentioning that in this embodiment of the present invention, the first mould 211 and the second mould 212 are arranged along a vertical direction. The upward movement and the downward movement of the second mould 212 are exemplary only and not intended to be limiting. In another alternative mode, the first mould 211 and the second mould 212 can be configured to be connected along a horizontal direction or other directions.

The molding material feeding mechanism 220 comprises one or more material storing member 221, one or more material pushing member 222 and has one or more material transporting channel 223. For example, two material transporting channels 223 are arranged to provide the molding material 13 for two circuit board arrays 1100. The molding material feeding mechanism 220 also further comprises one or more transport mechanisms 224 transporting the molding material 13 to the material storing member 221 correspondingly.

The circuit board array feeding mechanism 240 comprises one or more feeding guide rail 241, a load member 242 supported on the feeding guide rail 241 and a unload member 243. Wherein under the control of the controller 260, one or more circuit board array 1100 stored in a circuit board array magazine is transported to the corresponding work station by the load member 242 automatically along each of the feeding guide rails 241. After the molding process or the integral piece of molded circuit board array 1000 are further cut, the integral piece of molded circuit board array 1000 after being molded is uploaded by the unload member 243 and moves in the feeding guide rail 241 so as to transport the integral piece of molded circuit board array 1000 to a finished product storage box.

It is understandable that the mould fixing unit 230, the molding material feeding mechanism 220, the circuit board array feeding mechanism 240 and the temperature control unit 250 are controlled by the controller 260 so as to automatically work, thereby achieving automatic molding process. In addition, in other embodiment, the manufacturing equipment 200 comprises a vacuum unit 270 to decrease the pressure inside of the molding chamber 213 and excludes the air inside of the molding chamber 213; and the first mould 211 and the second mould 212 are more firmly pressed.

Furthermore, a plurality of the material transporting channels 223 is respectively communicated with the base array forming guide groove 2150. Each of the material storing members 221 has a material storing groove 2211. The molding material 13 is placed in the material storing groove 2211. The solid-state molding material 13 is heated and melted into the liquid molding material 13 by the temperature control unit 250. The material storing member 221 can be a separate box body, and also can be integrally formed in the second mould 212. In other words, the material storing groove 2211 can be formed at a partial position of the second mould 212.

Certainly, the manufacturing equipment 200 also provides a plurality of material storing members 221 and a plurality of material pushing members 222 correspondingly performing pushing operation. The material storing members 221 and the material pushing members 222 can operate independently so as to perform molding operation to the plurality of integral pieces of circuit board array 1100. For example, as shown in FIG. 23 of the drawings, the molding mould 210 provides four processing stations and performs molding operations to the four integral pieces of circuit board array 1100 simultaneously.

It is understandable that in a conventional process that a conventional circuit board is attached to a holder by a glue affixing step, the amount of glue is difficult to control and a flat attachment cannot be ensured. Further the operation cost too much time and a large-scale operation cannot be achieved. While as the molding process in the present invention for the production is by joint board operations, the production efficiency of the molded circuit board 10 is greatly improved.

Similar to the above-described embodiment, each of the material transporting channels 223 is integrally formed in the molding material feeding mechanism 220. In the preferred embodiment of the present invention, the material transporting channel 223 is embodied as a guiding groove formed on a bottom side of the first mould 211 which is also the upper mould. Each of the material pushing members 222 has a structure which is movable and capable of increasing pressure and pushing the molding material 13 in the material storing groove 2211. For example, each of the material pushing members 222 is a trunk piston.

It is understandable that the molding material 13 is accurately quantified by weight, or by controlling a flow rate of the molding material 13, or by controlling the pressure or flow of the molding mould 210 and the material storing groove 2211 or other suitable ways.

Figure 33:
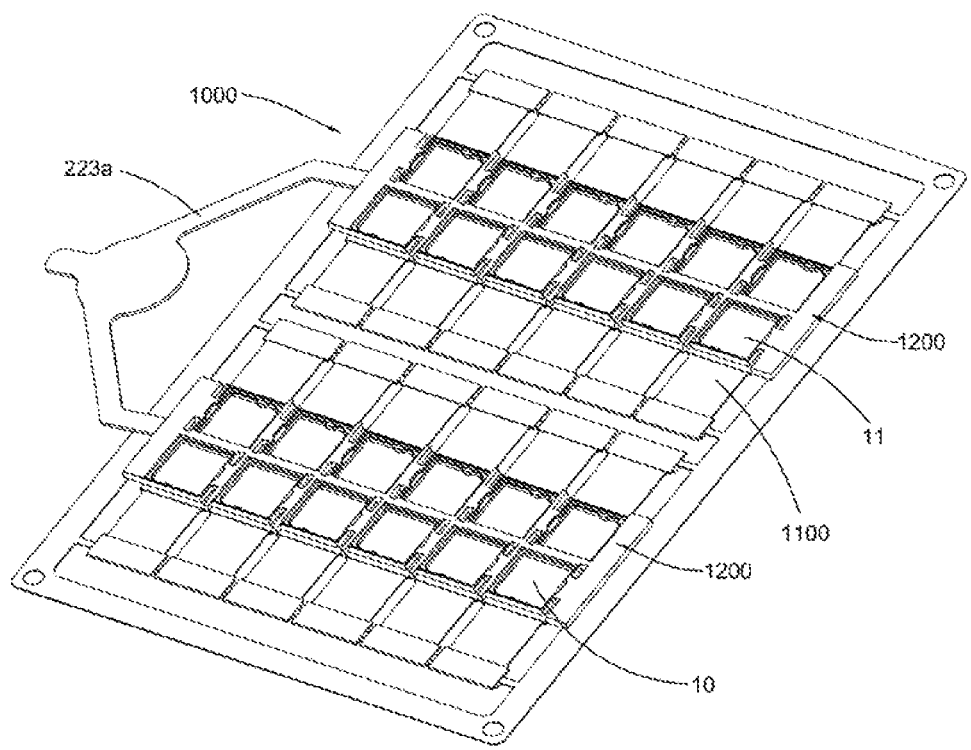
FIG. 33 is a perspective view of the integral piece of molded circuit board array manufactured by a manufacturing process according to the above embodiment of the present invention.

When the molding mould 210 is the closed-mould position, the liquid molding material 13 is pushed into the base array forming guide groove 2150 through each of the material transporting channels 223 under the pushing and pressure increasing effects of each of the material pushing members 222, thereby the liquid molding material 13 is filled around each of the light window forming blocks 214. Finally, during a solidifying process, the liquid molding material 13 in the base array forming guide groove 2150 is solidified and hardened to be integrally molded on the molded base 12 of the circuit board 11. These molded base 12 form an overall integral piece of molded base array 1200. It is understandable that the circuit boards 11 of the integral piece of circuit board array 1100 can be arranged in one set or a plurality of sets. As an example, each set of the circuit board array 1100 has two rows of circuit board 11. Each row of the circuit board 11 has at least one circuit board 11. Wherein each one end of two rows of circuit board 11 which are correspond mounted with the molded base are adjacent to each other such that the integral pieces of molded base array 1200 is formed on each of the two rows of the circuit board 11. For example, as shown in FIG. 33 of the drawings, the integral piece of molded circuit board array 1000 has two integral pieces of molded base array 1200. Twenty four circuit boards 11 are divided into two sets. Each of the sets has two rows of the circuit board 11 and each of the rows has six circuit boards 11. Each of the connected integral piece of molded base array 1200 has twelve integrally connected molded base 12. Two rows of photosensitive elements 20 of the circuit board 11 are mounted and arranged end to end so as to conveniently form the connected integral piece of molded base array 1200.

Similarly, in the joint board array operation process, the molding material 13 is heat fusible material such as a thermoplastic material. A melting and heating device turns the solid-state heat fusible material into the liquid molding material 13 by heating and melting. During the molding process, the hot melt molding material 13 is solidified by a cooling process.

The molding material 13 can also be a thermosetting material. The soil-state thermosetting material is put into each of the material storing grooves 2211. The solid-state thermosetting material is turned into the liquid molding material 13 by heating and melting. During the molding process, the thermosetting material molding material 13 is solidified by a heating process under a heating effect of the temperature control unit 250. And the molding material 13 cannot be melted after solidification, thereby forming the integral piece of molded base array 1200. In other words, in this embodiment, the molding mould 210 and the molding material feeding mechanism 220 are provided with a heating environment by the integral temperature control unit 250. In order to avoid the liquid molding material 13 being solidified inside the material storing groove 2211, after the molding material 13 in each of the material storing grooves 2211 are heated and melt under controlled heating time, the pure liquid molding material 13 is transported in each of the feeding tubes or the molding material 13 is transported to 2231 in a semi-solid state during a melting process. As the molding mould 210 is also in the heating environment, the molding material 13 reached into the base array forming guide groove 2150 is turned into a pure liquid state.

It is understandable that the molding mould 210 can preheat the fixed circuit board array 1100 in advance, so that during the molding process, the circuit board 11 and the liquid thermosetting molding material 13 have not too much difference in temperature.

It is worth mentioning that when the integral piece of molded circuit board array 1000 is cut into separate molded circuit board 10 for manufacturing the auto fixed camera module, the molding mould 210 is further provided with a plurality of actuator pin groove forming blocks 218. Each of the actuator pin groove forming blocks 218 is extended in the base array forming guide groove 2150, so that during the molding process, the liquid molding material 13 will not fill in the position of each of the actuator pin groove forming blocks 218, so that after the fixing step, a plurality of light windows 122 and a plurality of actuator pin grooves 124 are formed in the integral piece of molded base array 1200 of the integral piece of molded circuit board array 1000. The molded base 12 of each the separate molded circuit board 10 which is cut is provided with the actuator pin grooves 124, so that when the camera module 100 is manufactured, the actuator pin 41 of the motor 40 is connected to the circuit board 11 of the molded circuit board 10 by welding or by attaching through an electrical conducting resin.

It is understandable that in another alternative mode, the integral piece of molded circuit board array 1000 is bugled out to form electrical connecting pads at a position which is needed to connecting the actuator pin 41 of the motor 40. Therefore, the depth of each of the actuator pin groove forming blocks 218 is reduced, so that when the circuit board 11 of the molded circuit board 10 is assembled with the motor 40, the actuator pin 41 of the motor 40 is not needed to be too much long. In other words, the length of the actuator pin 41 of the motor 40 is reduced.

In addition, the second mould 212 which is embodied as the lower mould has a circuit board array positioning groove or positioning column 2121 adapted for mounting and fixing the circuit board array 1100. The light window forming block 214 and the base array forming guide groove 2150 can be formed in the first mould 211 which is embodied as the upper mould. When the first mould 211 and the second mould 212 are in the closed-mould position, the molding chamber 213 is formed, and the liquid molding material 13 is filled into the base array forming guide groove 2150 on a top side of the circuit board array 1100, so that the integral piece of molded base array 1200 is formed on the top side of the circuit board array 1100.

When the first mould 211 and the second mould 212 are in the closed-mould position and perform a molding step, each of the light window forming blocks 214 is overlappingly arranged on the middle chip overlapping region 111*a* of the base board 111 of each of the circuit board array 1100 and a bottom surface of each of the light window forming block 214 is firmly contacted with the middle chip overlapping region 111*a* of each of the base boards 111 of the circuit board array 1100, so that the liquid molding material 13 filled in the base array forming guide groove 2150 is prevented from entering the middle chip overlapping region 111*a* of each of the base boards 111 of the circuit board array 1100. While the liquid molding material 13 is filled in the corresponding edge region 111*b* which is outside of the each of the middle chip overlapping regions 111*a* and is filled in each of the corresponding base array forming guide grooves 2150, thereby forming the integral piece of molded base array 1200.

Figure 34:
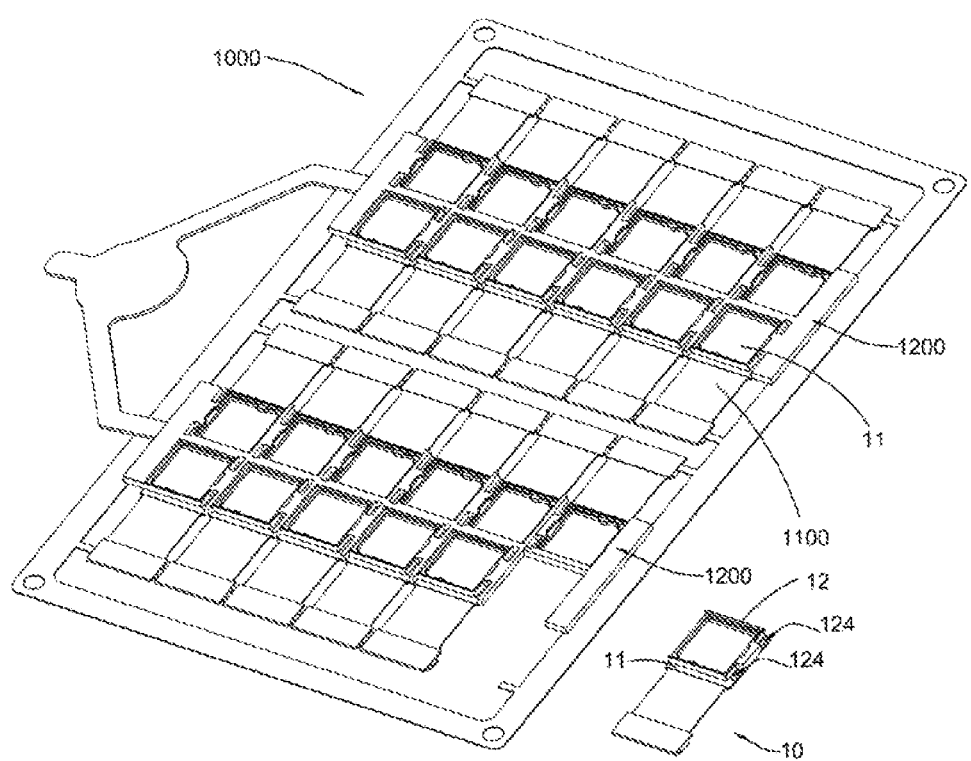
FIG. 34 is a schematic view of a camera module with a separated molded circuit board which is cut from the integral piece of molded circuit board array manufactured by the manufacturing process according to the above embodiment of the present invention.
Figure 35:
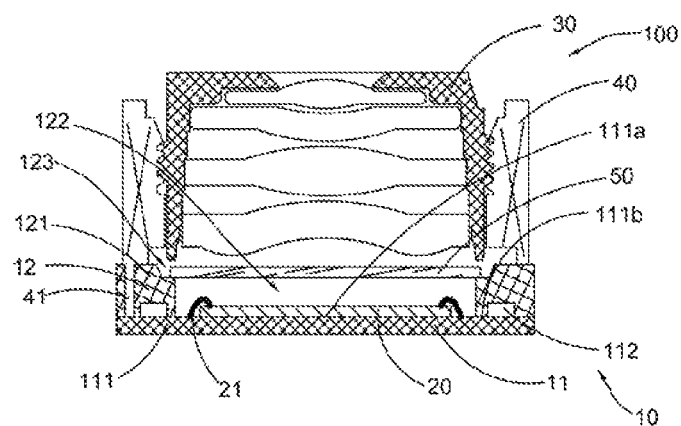
FIG. 35 is a schematic view of a camera module with a separated molded circuit board which is cut from the integral piece of molded circuit board array manufactured by the manufacturing process according to the above embodiment of the present invention.

It is understandable that compared with the manufacturing process for the molded circuit board 10 in the first embodiment, in the joint board array operation, the two adjacent base forming guide groove 215 which are used for forming two molded base 12 are integrated together. While the plurality of the light window forming block 214 are spaced, so that the molding material 13 eventually forms the integral piece of molded base array 1200 having an overall structure. In this embodiment as shown in FIG. 33 of the drawings, the manufactured integral piece of molded base array 1200 has a plurality of light windows 122 and a plurality of the actuator pin grooves 124. After the integral piece of molded base array 1200 is cut, the separate molded circuit board 10 having a light window 122 and two actuator pin grooves 124 as shown in FIG. 34 is obtained. Furthermore, a solidified and extended portion 223*a* is formed at the position of the integral piece of molded base array 1200 which is corresponding to the material transporting channel 223. In other words, the integral piece of molded base array 1200 comprises a plurality of molded bases 12 which are integrally combined with each other and a solidified and extended portion 223*a* integrally extended from the molded bases 12.

As shown in FIG. 28 to FIG. 32B of the drawings, a manufacturing process of the molded base 12 of the camera module 100 by the joint board array operation according to the preferred embodiment of the present invention is illustrated.

Figure 28:
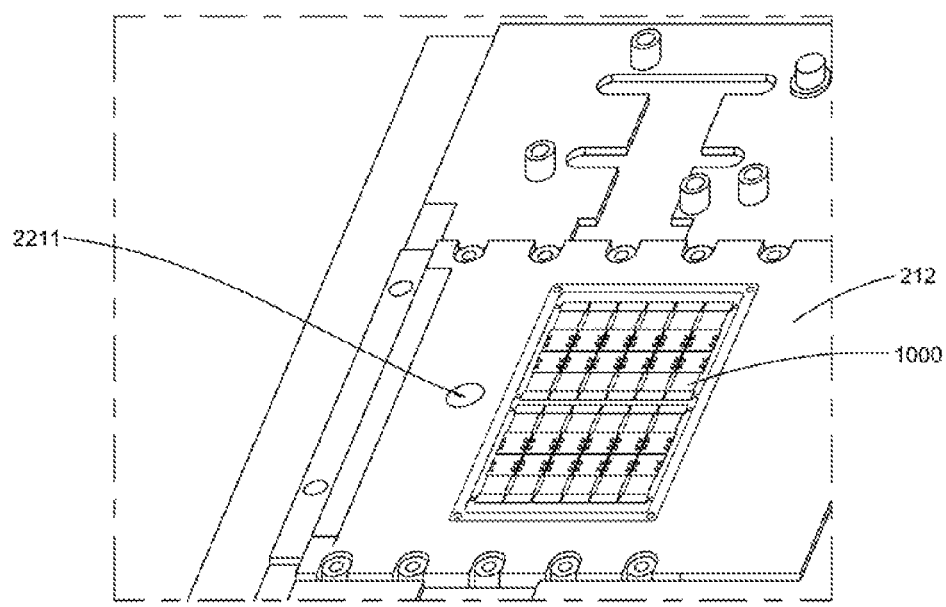
FIG. 28 is a perspective view illustrating the second mound of the molding mould of the manufacturing equipment for the integral piece of molded circuit board array is placed with a circuit board array according to the above preferred embodiment of the present invention.
Figure 29:
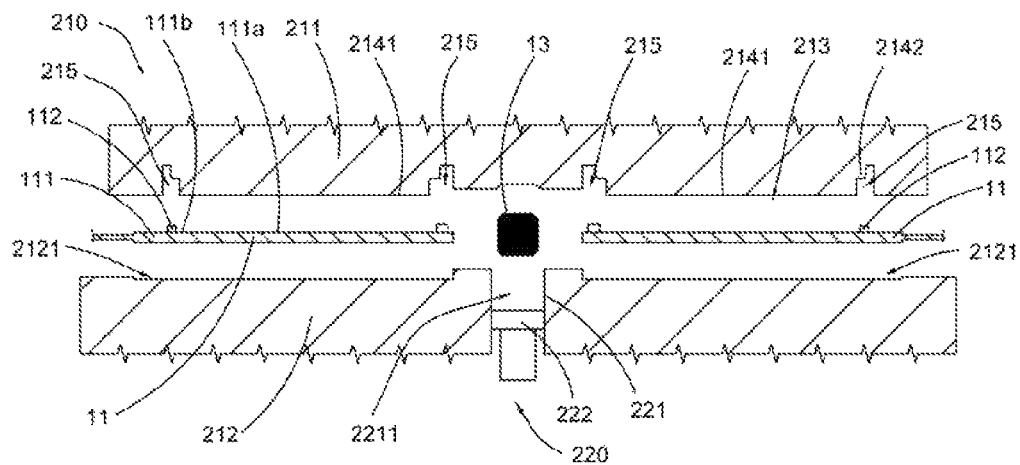
FIG. 29 is a cross-sectional view of the molding mould of the manufacturing equipment for the integral piece of molded circuit board array provided with a circuit board and a molding material according to the above embodiment of the present invention along a length direction of the molding mould.

As shown in FIG. 28 to FIG. 29 of the drawings, before the molding process, in this embodiment, the integral piece of circuit board array 1100 is fixed in the circuit board array positioning groove 2121 of the second mould 212 which is the lower mould. The material storing groove 2211 which supplies the molding material 13 to the circuit board array 1100 is positioned in a center position and supplies the molding material 13 to the two base array forming guide groove 2150 through the two material transporting channels 223.

Figure 30:
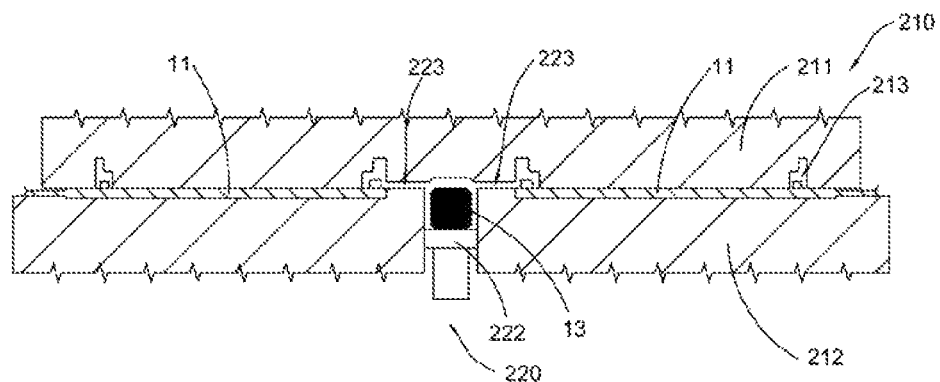
FIG. 30 is a cross-sectional view of the molding mould of the manufacturing equipment for the integral piece of molded circuit board array positioned with the circuit board and the molding material according to the above embodiment of the present invention along a length direction of the molding mould.

As shown in FIG. 30 of the drawings, the molding mould 210 is in the closed-mound position, the circuit board array 1100 about to be molded and the solid-state molding material 13 are ready in position. The solid-state molding material 13 is heated by the temperature control unit 250, so that the molding material 13 is melted to turn into the liquid state. Alternatively, the melt molding material 13 which is in the liquid state or in a semi-solid state enters the material storing groove 2211 transported by tubes.

Figure 31:
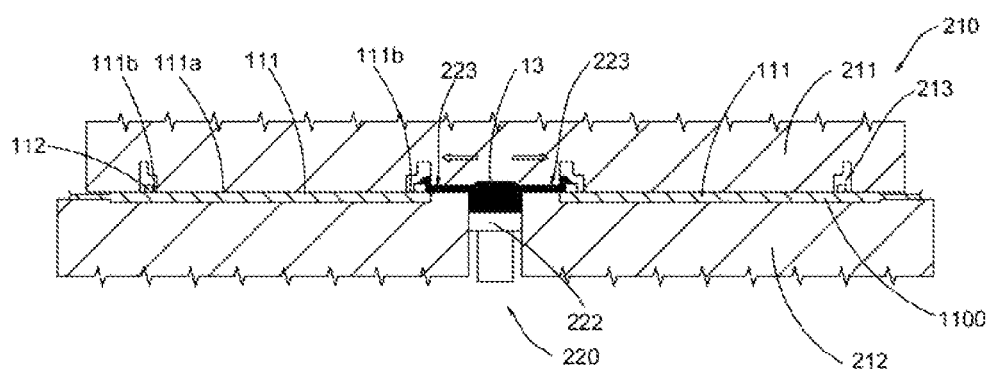
FIG. 31 is a cross-sectional view of the molding mould of the manufacturing equipment for the integral piece of molded circuit board array according to the above embodiment of the present invention along a length direction of the molding mould, illustrating that the liquid material is pushed into the base forming guide groove by the molding mould.

As shown in FIG. 31 of the drawings, the melt molding material 13 enters the base array forming guide groove 2150 along the two material transporting channels 223 under the effect of the material pushing member 222 and reaches around each of the light window forming blocks 214. Similarly, the molding material 13 can be completely melt into the liquid state and then be pushed in the material transporting channel 223 by the material pushing member 222; or the molding material 13 is pushed in each of the material transporting channels 223 during a melting process and the solid-state molding material 13 is completely melted into the liquid molding material 13 by the temperature control unit 250 providing a heating performance for the molding mould 210.

Figure 32A:
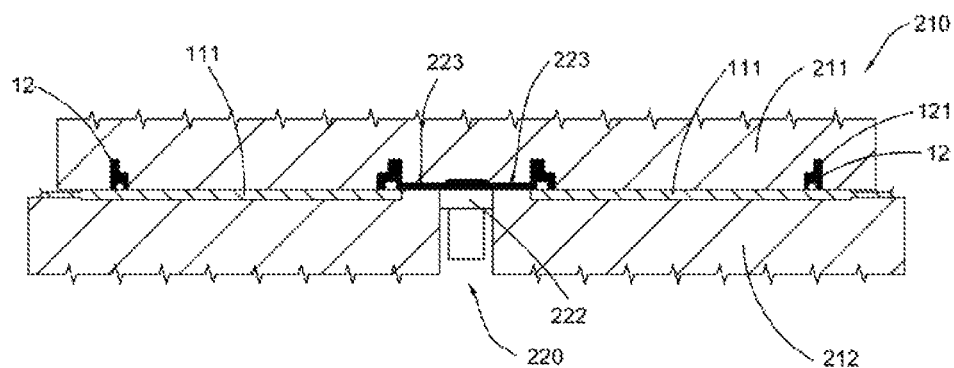
FIG. 32A is a cross-sectional view of the molding mould of the manufacturing equipment for the integral piece of molded circuit board array according to the above embodiment of the present invention, illustrating that the molding mould performs a molding process to form the integral piece of molded base array; the cross-sectional view is along a length direction of the molding mould.
Figure 32B:
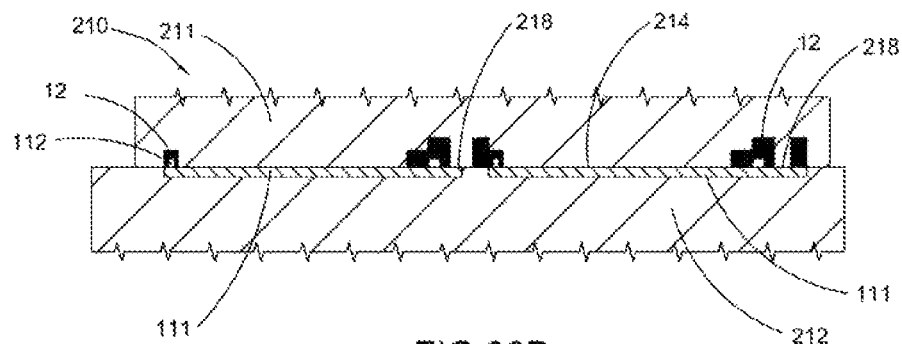
FIG. 32B is a cross-sectional view of the molding mould of the manufacturing equipment for the integral piece of molded circuit board array according to the above embodiment of the present invention, illustrating that the molding mould performs the molding process to form the integral piece of molded base array and an actuator pin groove is formed; the cross-sectional view is along a width direction of the molding mould.

As shown in FIG. 32A and FIG. 32B of the drawings, when the base array forming guide groove 2150 is filled with the liquid molding material 13, the liquid molding material 13 is solidified and integrally form the integral piece of molded base array 1200 on the integral piece of circuit board array 1100 after the solidifying process. Take the molding material 13 being embodied as a thermosetting material as an example, in the embodiment of the present invention, the heated and melt liquid molding material 13 is solidified after being heated. For example, the molding material 13 can be heated under an increasing temperature or heated for a predetermined time under a constant temperature. The manufactured integral piece of molded circuit board array 1000 can be removed from the molding mould 210 and is continued to be heated and solidified for a preset time in a baking facility.

In addition, as shown in FIG. 40 of the drawings, a manufacturing method of the molded circuit board 10 of the camera module 100 according to the embodiment of the present invention is illustrated, the manufacturing method comprises the following steps.

A step of fixing the circuit board array 1100: transport and load the circuit board array 1100 to the second mould 212 of the molding mould 210.

A step of filling the molding material 13: when the molding mould 210 is in a closed-mould position, the liquid molding material 13 fills the base array forming guide groove 2150 of the molding mould 210, wherein the position of each of the light window forming blocks 214 of the molding mould 210 is not filled with the molding material 13.

A step of solidifying the liquid molding material 13: in the molding mould 210, the molding material 13 within the base array forming guide groove 2150 is turned into a solid-state from the liquid state, so that the integral piece of molded base array 1200 is formed on the circuit board array 1100 and the integral piece of molded circuit board array 1000 is obtained.

A step of manufacturing the separated molded circuit board 10: cut the integral piece of molded circuit board array 1000 to obtain a plurality of the molded circuit board assemblies 10.

Accordingly, in this embodiment, in the step of fixing the circuit board array 1100, the molding mould 210 is in an open-mould position, the circuit board array 1100 is transported by the feeding guide rail 241 and eventually fixed to the circuit board array positioning groove 2121 of the second mould 212 of the molding mould 210; the circuit board array 1100 is disposed on a top side so as to be integrally covered and coated by the molding material 13 in the subsequent molding steps.

According to this embodiment of the present invention, the method further comprises a step: supply the solid-state molding material 13 in the material storing groove 2211 in advance before the molding mould 210 is in the closed-mould, and the solid-state molding material 13 is a solid material block or a solid powder; the solid molding material 13 is melted and enters into the base forming guide groove 215 through the material transporting channel 223 by a pushing effect of the material pushing member 222. After the pushing effect is finished, the liquid molding material 13 is filled in the base array forming guide groove 2150. After the pushing effect is finished, the liquid molding material 13 is filled in the base array forming guide groove 2150. In addition, in the manufacturing process of the integral piece of molded circuit board array 1000 of the camera module, the molding material 13 is not filled at the positions corresponding to the actuator pin groove forming blocks 218. Correspondingly, in the manufacturing process of the integral piece of molded circuit board array 1000 of the camera module, the molding mould 210 is not provided with the actuator pin groove forming blocks 218.

In the step of solidifying the liquid molding material 13, when the molding material 13 is a thermosetting material, the molding chamber 213 of the molding mould 210 provides a heating environment under the heating effect of the temperature control unit 250, so that the liquid molding material 13 is heated to be solidified and is integrally formed as the integral piece of molded base array 1200 on the circuit board 11, and the integral piece of molded base array 1200 is covered and coated on the electronic components 112; when the molding material 13 is a hot melting material, the liquid molding material 13 is cooled inside the molding mould 210, so that the liquid molding material 13 is cooled to be solidified and is integrally formed the integral piece of molded base array 1200 on the circuit board array 1100. In the step of manufacturing the separated molded circuit board 10, the integral piece of molded circuit board array 1000 is cut into a plurality of molded circuit board assemblies 10 to manufacture the separated camera module.

Alternatively, separate two or more molded circuit board 10 which are combined with each other from the integral piece of molded circuit board array 1000 by cutting so as to manufacture a split type camera module array. In other words, each of the camera modules of the array camera module respectively has an individual molded circuit board, wherein two or more molded circuit board 10 are respectively electrically connected to a controlling mainboard of a same electric device. Thus the array camera module manufactured by two or more molded circuit board assemblies 10 transport the images captured by the camera modules to the controlling mainboard for graphic information processing.

Figure 36:
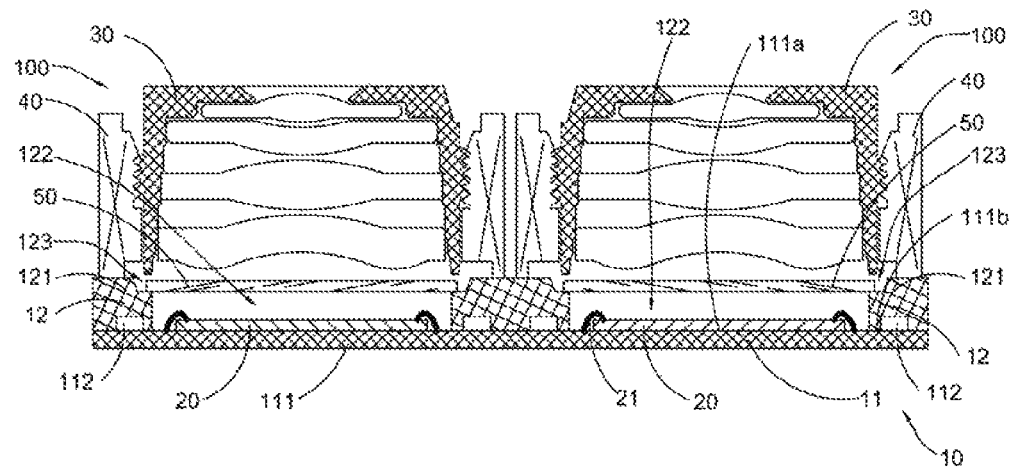
FIG. 36 is a schematic view of the molded circuit board which is used to manufacture a camera module array by the manufacturing process according to an alternative embodiment of the present invention.
Figure 37A:
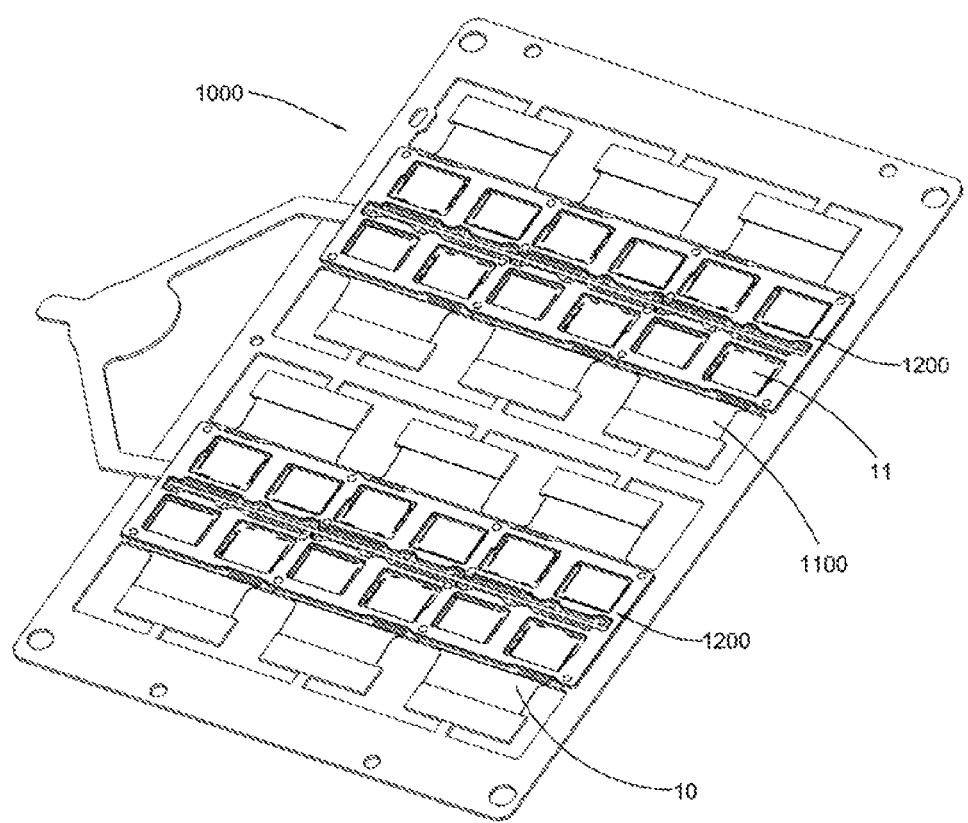
FIG. 37A is a schematic view of the array camera module assembled with the molded circuit board by the manufacturing process according to the above embodiment of the present invention.
Figure 37B:
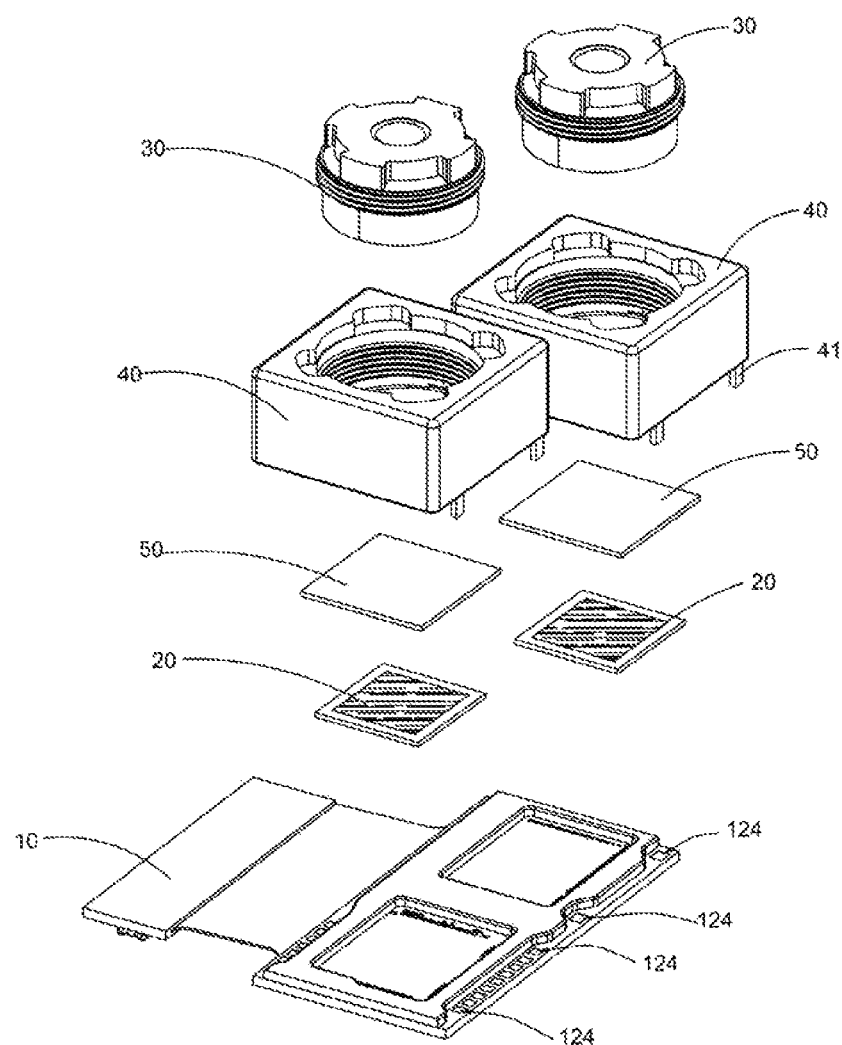
FIG. 37B is an exploded perspective view of the camera module array assembled with the molded circuit board by the manufacturing process according to the above embodiment of the present invention.

As shown in FIG. 36 to FIG. 37B of the drawings, the molding process of the joint board array operation also can be used to make a molded circuit board 10 with two or more light windows 122, wherein the molded circuit board 10 can be used to manufacture an camera module array sharing a same base board. In other words, take the molded circuit board 10 of an array of double camera modules as an example, for each of the circuit boards 11 of the circuit board array 1100 in the molding process, one base board 111 is correspondingly provided with two light window forming block 214. The light window forming block 214 are spaced with each other and two base forming guide grooves which are communicated with each other are disposed around the light window forming block 214. Therefore, after the molding process, the circuit board 11 together form a combined molded base which shares one base board 111 and which has two light windows 122, and two photosensitive elements 20 and two lens 30 are correspondingly mounted. Furthermore, the base board 111 of the circuit board 11 can be connected to a controlling board of an electric device, thus the camera module array manufactured in this embodiment transports the images captured by the camera modules to the controlling mainboard for graphic information processing.

As shown in FIG. 38 to FIG. 39 of the drawings, according to another alternatively mode of the embodiment, the manufacturing equipment 200 can manufacture the molded circuit board 10 with the photosensitive element 20 and the photosensitive element 20 which are integrally packaged. In this alternative mode, the integrally formed molded base 12 is integrally covered and coated on the circuit board 11 and the photosensitive element 20.

More specifically, the plurality of photosensitive elements 20 is electrically connected to the corresponding circuit board 11 of the circuit board array 1100 in advance. Each of the photosensitive elements 20 is electrically connected to the circuit board 11 by one or more lead wires 21. Each of the photosensitive elements 20 has a photosensitive area portion 201 on a top surface and a non-photosensitive area portion 202 positioned around the photosensitive area portion 201. Each of the integrally molded bases 12 is covered and coated on the corresponding outer edge area of the circuit board 11 and at least part of the non-photosensitive area portion 202 of the photosensitive element 20.

When the molding mould 210 is in the open-mould position, the integral piece of circuit board array 1100 electrically connected with the plurality of photosensitive elements 20 is mounted at the second mould 212. As shown in FIG. 39 of the drawings, when the molding mould 210 is in the closed-mould position, the integral piece of circuit board array 1100 electrically connected with the plurality of photosensitive elements 20 is positioned in the molding chamber 213 of the molding mould 210. Each of the light window forming blocks 214 is contacted with the corresponding photosensitive area portion 201 of each of the photosensitive elements 20. The molding chamber 213 of the molding mould 210 is provided with a plurality of the actuator pin groove forming blocks 218 so as to form actuator pin groove forming block grooves receiving the motor pins 41 which electrically connects the motor 40 with the circuit board 11 after the molding process. Therefore when the liquid molding material 13 enters the molding mould 210 through each of the material transporting channels 223, the molding material 13 can only reach to the light window forming block 214 and around the actuator pin groove forming blocks 218. In other words, the liquid molding material 13 can be only positioned in the base forming guide groove 215. In other words, the liquid molding material 13 is prevented from entering the photosensitive area portion 201 of each of the photosensitive elements 20. In addition, in other alternative mode, after the circuit board array 1100 is assembled with each of the photosensitive elements 20, a plurality of the optical filters 50 are further overlappingly arranged on the corresponding photosensitive element 20, then after the molding process, the photosensitive element 20 and the optical filter 50 are integrally packaged on the integral piece of circuit board array 1100 by the integral piece of molded base array 1200; then the separated molded circuit board 10 with the integrally packaged photosensitive element 20 and the optical filter 50 is obtained by cutting.

An alternative mode of the molding mould of the present invention will be illustrated in the following. In order for person skilled in the art to better understand the improvements to the technical features of the molding mould, some structures of the molding mould and the molded circuit board will be renamed. Nevertheless, one skilled in the art should understand that those new names are only for better illustrating the technical features of the molding mould, rather than additionally limiting the scope of the present invention.

Figure 41:
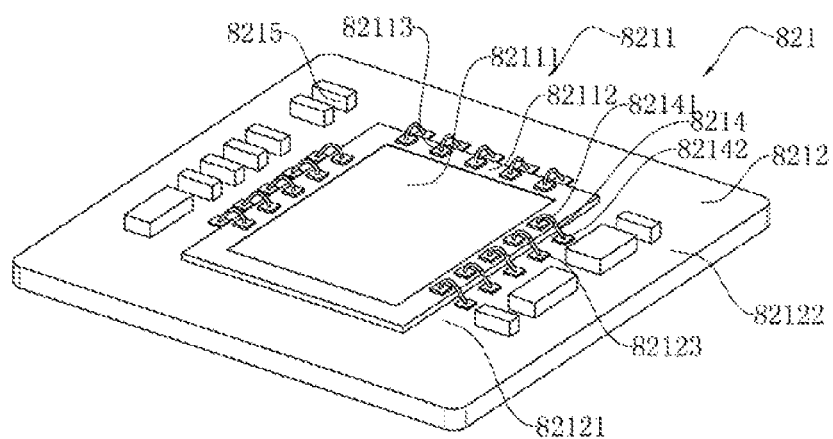
FIG. 41 is a perspective view of the imaging component of the molded circuit board provided by the present invention.
Figure 43:
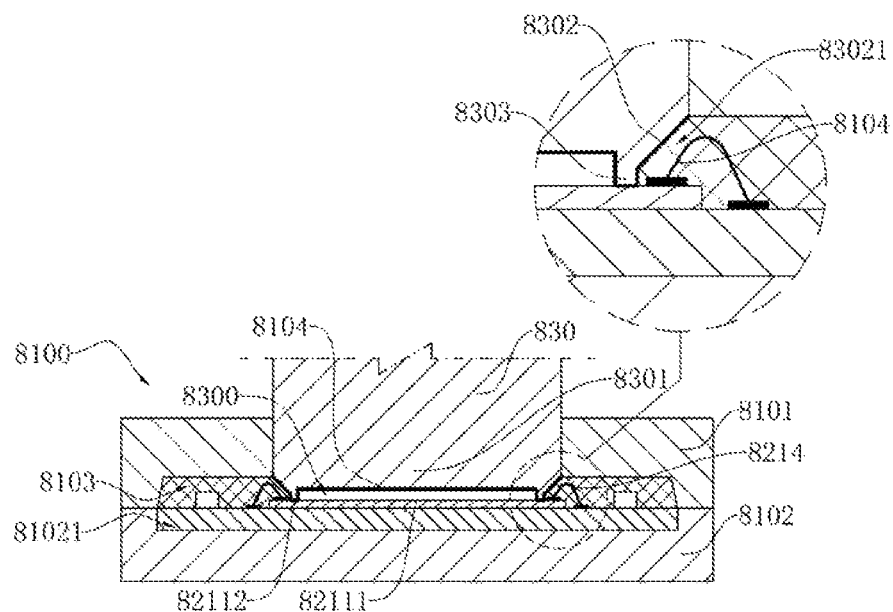
FIG. 43 is a perspective view of the molding mould in a closed-mould position according to the above preferred embodiment of the present invention.
Figure 44:
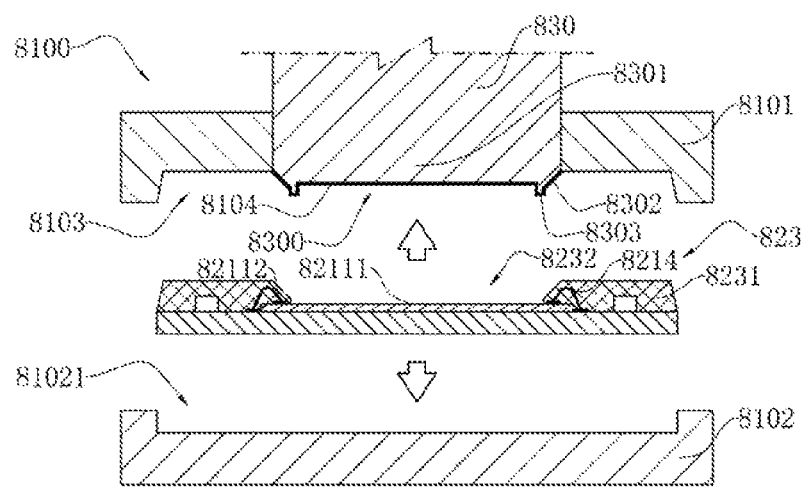
FIG. 44 is a perspective view of the molding mould in a demoulding state according to the above preferred embodiment of the present invention.
Figure 45:
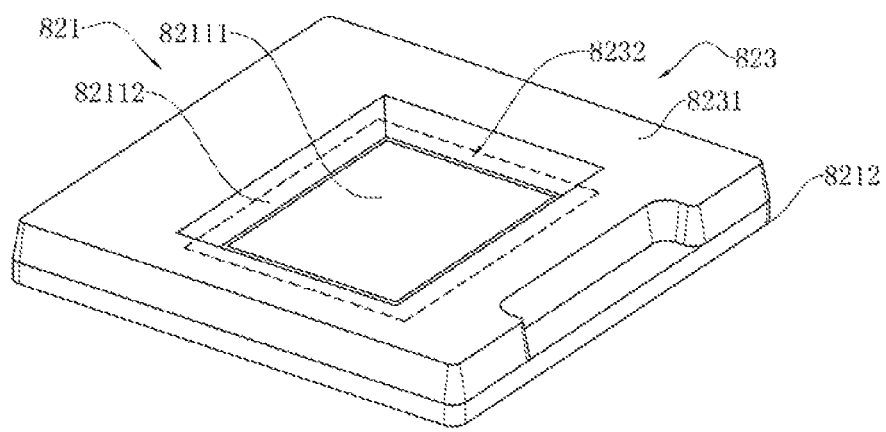
FIG. 45 is a perspective view of the molded circuit board prepared by the molding mould provided by the present invention.

Specifically, FIGS. 41-48 illustrated another molding mould 8100 and a molded circuit board 820 manufactured through the molding mould 8100 according to the present invention. As shown in FIG. 41 and FIG. 45, the molded circuit board 820 comprises an imaging component 821 and a molded base 823, wherein the molded base 823 is manufactured through the molding mould 8100 and is integrally molded to the imaging component 821, so that the molded base 823 can substitute a holder or a supporter of a conventional camera module and unlike the conventional packaging process, it does not have to attach the holder or the supporter to the circuit board 8212 through gluing.

The imaging component 821 further comprises a photosensitive element 8211 and a circuit board 8212 and the photosensitive element 8211 is communicatingly coupled with the circuit board 8212. The molded base 823 comprises an annular molding body 8231 and a light window 8232. When the molded base 823 is integrally molded on the imaging component 821, the light window 8232 will be provided correspondingly on the photosensitive path of the photosensitive element 8211 of the imaging component 821, so as to allow the photosensitive element 8211 to receive light from the external environment via the light window 8232 of the molded base 823.

Further, the circuit board 8212 comprises a chip attaching region 82121 and a periphery region 82122 integrally molded and formed with the chip attaching region 82121. The chip attaching region 82121 is in the middle of the circuit board 8212 and surrounded by the periphery region 82122. The photosensitive element 8211 is correspondingly attached on the chip attaching region 82121 of the circuit board 8212. The circuit board 8212 further comprises a set of circuit board connectors 82123 arranged between the chip attaching region 82121 and the periphery region 82122 for connecting and communicating with the photosensitive element 8211.

Correspondingly, the photosensitive element 8211 comprises a photosensitive area portion 82111 and a non-photosensitive area portion 82112. The photosensitive area portion 82111 is located on the top side of the photosensitive element 8211, which is integrally formed by the photosensitive area portion 82111 and the non-photosensitive area portion 82112. Besides, the photosensitive area portion 82111 is in the middle of the photosensitive element 8211 and surrounded by the non-photosensitive area portion 82112. The photosensitive element 8211 further comprises a set of chip connectors 82113 arranged in the photosensitive area portion 82111 to be electrically connected to the circuit board connectors 82123 of the circuit board 8212, so as to connect and communicate the circuit board 8212 and the photosensitive element 8211.

Further, the imaging component 821 further comprises a set of lead wires 8214. Each the lead wire 8214 curvingly and bendingly extends between the circuit board 8212 and the photosensitive element 8211 to connect and communicate the photosensitive element 8211 and the circuit board 8212. Specifically, each the lead wire 8214 has a circuit board connecting end 82141 and a chip connecting end 82142. The circuit board connecting end 82141 is arranged to be connected to the circuit board connector 82123 of the circuit board 8212, while the chip connecting end 82142 is arranged to be connected to the chip connector 82113 of the photosensitive element 8211. In this way, the lead wires can connect and communicate the circuit board 8212 and the photosensitive element 8211. It is worth mentioning that each the lead wire 8214 extends between the circuit board 8212 and the photosensitive element 8211 and protrudes upward. Therefore, when the molding mould 8100 provided by the present invention is utilized to manufacture the molded circuit board 820, it has to provide a certain wiring space 83021 for the lead wires 8214, so as to avoid the lead wires 8214 from being pressed and pushed or even falling off from the circuit board 8212 or the photosensitive element 8211 during the molding process of the molded base 823.

In addition, the imaging component 821 further comprises a series of electronic components 8215 mounted on the circuit board 8212 through techniques, such as SMT and etc. The electronic components 8215 are then covered and coated by the molded base 823 as the molded base 823 is integrally molded and formed. The electronic components 8214 include capacitors, resistors, inductors, and etc.

One skilled in the art should understand that the circuit board 8212 and the photosensitive element 8211 may also be connected and communicated without utilizing the lead wires 8214. For instance, the photosensitive element 8211 can be mounted on the bottom of the circuit board 8212 through Flip-Chip technology and the chip connectors 82113 of the photosensitive element 8211 and the circuit board connectors 82123 of the circuit board 8212 are directly contacted and press fit with conducting medium. In this way, the circuit board 8212 and the photosensitive element 8211 can also be connected and communicated. According to the present preferred embodiment of the present invention, the way that the photosensitive element 8211 and the circuit board 8212 are connected and communicated is just an example for better illustrating the advantages of the molding mould 8100 provided by the present invention in manufacturing the molded circuit board 820. In other words, according to the present invention, the molded circuit board 820 here is just a workpiece to support the illustration of the technical features of the molding mould 8100 in the molding technology, which shall not influence the scope of the present invention.

Figure 42:
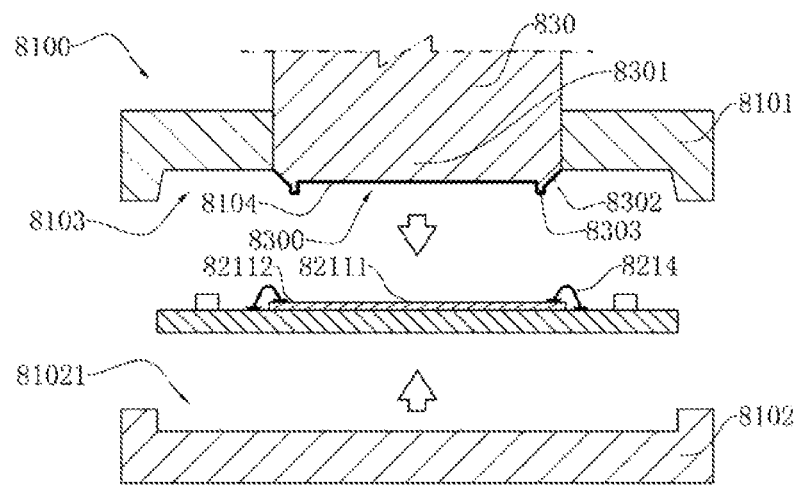
FIG. 42 is a perspective view of a molding mould in an open-mould position according to a preferred embodiment of the present invention.

Specifically, referring to FIGS. 42-44, the molding mould 8100 further comprises an upper mould 8101 and a lower mould 8102. When the upper mould 8101 and the lower mould 8102 are closed, a molding space will therefore be defined and formed between the upper mould 8101 and the lower mould 8102. The imaging component 821 can be arranged in the molding chamber, such that when the molding material adapted for moldingly forming the molded base 823 is filled into the molding space 8103 and solidified and molded, the molded base 823 will be integrally molded on the circuit board 8212 and the molded base 823 will cover and coat at least part of the photosensitive element 8211 and the circuit board 8212.

More specifically, the molding mould 8100 further comprises an isolation block 830. When the upper mould 8101 and the lower mould 8102 are closed, the isolation block 830 extends in the molding space 8103. When the imaging component 821 of the molded circuit board 820 is mounted in the molding space 8103, the isolation block 830 will be correspondingly provided above the photosensitive element 8211 of the imaging component 821 to seal the photosensitive element 8211, such that when the molding space 8103 is filled with molding material, it keeps the molding material from flowing into the area between the isolation block 830 and the photosensitive element 8211. As a result, the annular molded base 823 can be formed in the outer side of the isolation block 830 and the light window 8232 of the molded base 823 can be formed at the same time at the position corresponding to the isolation block 830.

The isolation block 830 is provided in the upper mould 8101. The imaging component 821 is arranged in the lower mould 8102. When the upper mould 8101 and the lower mould 8102 are clamping and moving closer to each other to form the molding space 8103, the isolation block 830 provided in the upper mould 8101 will gradually approach the photosensitive element 8211 of the imaging component 821 arranged in the lower mould 8102 and eventually be overlapped on the photosensitive element 8211. Hence, the isolation block 830 can effectively avoid the molding material from flowing onto the photosensitive element 8211 during the molding process of the molded base 823. It is worth mentioning that the isolation block 830 may also be provided in the lower mould 8102 of the molding mould 8100 and, correspondingly, the imaging component 821 will then be arranged inversely in the upper mould 8101, such that the isolation block 830 provided in the lower mould 8102 is still correspondingly arranged to face the upper part of the photosensitive element 8211 for sealing the photosensitive element 8211 when the upper mould 8101 and the lower mould 8102 are closed. In other words, the position of the isolation block 830 in the molding mould 8100 provided by the present invention is not limited. For example, according to the present preferred embodiment of the present invention, the isolation block 830 is provided in the upper mould 8101 of the molding mould 8100 and, correspondingly, a mounting groove 81021 will be provided in the lower mould 8102 for accommodating the imaging component 821 of the molded circuit board 820.

More specifically, when the upper mould 8101 and the lower mould 8102 are closed or in the closed-mould position so as for the execution of the molding process, the isolation block 830 and the photosensitive element 8211 are overlappingly arranged and at least the photosensitive area portion 82111 of the photosensitive element 8211 are covered. In this way, the molding material will be kept from at least the photosensitive area portion 82111 of the photosensitive element 8211. Therefore, the molded base 823 can be molded and formed in the outside environment of the photosensitive area portion 82111 of the photosensitive element 8211 and the light window 8232 of the molded base 823 can be formed at the position corresponding to the isolation block 830. One skilled in the art should understand that, in this case, the isolation block 830 is provided in the inner side of the chip connector 82113 of the photosensitive element 8211 and firmly attached on the inner area of the chip connector 82113 of the photosensitive element 8211 during the molding process. As a result, it can utilize the isolation block 830 to at least seal the photosensitive area portion 82111 of the photosensitive element 8211. After the molded base 823 is integrally molded, the molded base 823 will cover and coat the circuit board 8212 and the photosensitive element 8211 to form the molded circuit board 820 that has an integral structure.

Referring to FIG. 43, the isolation block 830 further comprises an isolation block body 8301 and a side tilt part 8302 integrally formed on the side of the isolation block body 8301, such that when the isolation block 830 is attached on the inner side of a chip connector 82113 of the photosensitive element 8211, the isolation block body 8301 will be overlapped with the photosensitive area portion 82111 of the photosensitive element 8211. The side tilt part 8302 extends above a lead wire 8214 connecting and communicating the circuit board 8212 and the photosensitive element 8211, so as to preventing the isolation block 830 from contacting the lead wire 8214. One skilled in the art should be able to understand that the lead wires 8214 are extended and protruded upward between the chip connectors 82113 of the photosensitive element 8211 and the circuit board connectors 82123 of the circuit board 8212, so it has to provide enough wiring space for the lead wire 8214 as the isolation block 830 is overlappingly arranged on the photosensitive element 8211, so as to prevent the isolation block 830 from pushing and pressing the lead wires 8214 and rendering distortion or falling of the lead wires 8214 from the photosensitive element 8211. In other words, when the isolation block body 8301 is overlapped on the photosensitive element 8211, the side tilt part 8302 will extend above the lead wires 8214, so as to provide a wiring space 83021 for the lead wires 8214. The lead wires 8214 extend outward from the photosensitive element 8211 in the wiring space 83021. In this way, it utilizes the side tilt part 8302 to effectively avoid contact between the isolation block 830 and the lead wires 8214.

It is worth mentioning that the molding material flows in the molding space 8103 and fills the wiring space 83021 during the molding process of the molded base 823, such that after the molding material is solidified and molded, the molded base 823 can better attach the lead wires 8214. Namely, the design of utilizing the isolation block 830 to define and form the wiring space 83021 has to consider not only to provide sufficient space for the lead wires 8214, but also to allow the lead wires 8214 to freely extend and protrude in the wiring space 83021. Besides, it has to further adjust the shape of the wiring space 83021 into the shape that is more similar to the curving and bending shape of the lead wires 8214, such that the lead wires 8214 can be more fittingly covered and coated by the molded base 823 and turned into a more stable integral structure in the subsequent molding process. More illustration about this will also be referred subsequently.

Further, the isolation block 830 further comprises an extension part 8303, integrally formed on the bottom side of the isolation block body 8301, such that when the isolation block 830 is arranged on the upper part of the photosensitive element 8211, the extension part 8303 of the isolation block 830 will be closely united on the photosensitive element 8211, so as to at least seal the photosensitive area portion 82111 of the photosensitive element 8211 through the extension part 8303. One skilled in the art should understand that the structural design that the extension part 8303 extends downward from the bottom side of the isolation block body 8301 renders several advantages to the isolation block 830.

Specifically, if the extension part 8303 is not provided, the transition angle between the side tilt part 8302 of the isolation block 830 and the isolation block body 8301 on the bottom of the isolation block 830 will be larger, rendering that the molding material can seep onto the photosensitive element 8211 from the transition area on the bottom of the isolation block body 8301 and the side tilt part 8302 during the subsequent molding process, which causes burr around the photosensitive element 8211. When the extension part 8303 is provided on the isolation block 830, the extension part 8303 is integrally extended from the bottom of the isolation block body 8301 and attached on the photosensitive element 8211 during the molding process. In this way, it can effectively reduce the transition angle on the bottom of the isolation block 830, such that the isolation block 830 can attached on the photosensitive element 8211 more firmly and tightly through the extension part 8303, which helps to better seal the photosensitive area portion 82111 of the photosensitive element 8211 during the molding process. As a result, it can better prevent the molding material from entering the area of the photosensitive element 8211 and rendering processing errors, such as burr and etc.

Besides, the extension part 8303 integrally extends downward from the isolation block body 8301 for a predetermined height, so as to allow the extension part 8303 to raise the heights of the isolation block body 8301 and the side tilt part 8302 when the isolation block 830 is overlapped with the photosensitive element 8211, which enlarges the wiring space 83021 and allows the lead wire 8214 to bend and zigzag freely in the wiring space 83021. In other words, when the extension part 8303 is provided on the isolation block body 8301, the wiring space 83021 will be molded and formed at the outer side of the side tilt part 8302 and the extension part 8303. In contrasting to that the wiring space 83021 is defined through the side tilt part 8302 only, in this case, the area of the wiring space 83021 is significantly increased, especially for the space of the height direction, such that it can better avoid unnecessary contact from occurring between the isolation block 830 and the lead wires 8214. For instance, when the isolation block 830 is attached on the photosensitive element 8211 and the bottom of the isolation block 830 is close to the chip connector 82113 of the photosensitive element 8211, the protruded portion of the lead wires 8214 at the chip connectors 82113 of the photosensitive element 8211 is very likely to contact the isolation block 830 under this circumstance. Hence, when the extension part 8303 is not provided, the gradient of the side tilt part 8302 of the isolation block 830 has to be greatly reduced in order to narrowly avoid unnecessary contact from occurring between the isolation block 830 and the lead wires 8214. Nevertheless, a wiring space 83021 provided by a gradient that is too small is adverse to the subsequent molding process.

In other words, it can easily avoid unnecessary pressing from occurring between the isolation block 830 and the lead wires 8214 through the extension part 8303 of the isolation block 830 without significantly changing the gradient of the side tilt part 8302 of the isolation block 830. One skilled in the art should understand that the size and shape of the wiring space 83021 can both be adjusted more easily in the way that the side tilt part 8302 and the extension part 8303 of the isolation block 830 coordinate to jointly define the wiring space 83021. Hence, it not only helps to avoid the lead wires 8214 from being pushed and pressed by the isolation block 830, but also allows the relative positions of the extension part 8303 and the side tilt part 8302 be adjusted so as to create a shape of the wiring space 83021 that fits the curving and bending condition of the lead wires 8214 better, which allows the molded base 823 formed subsequently fit the line bank of the lead wires 8214 better.

According to this preferred embodiment of the present invention, the extension part 8303 extends downward from the bottom side of the isolation block body 8301 along a vertical direction, such that when the isolation block 830 is overlapped on the photosensitive element 8211, the extension part 8303 is bonded to the photosensitive element 8211 mostly vertically. In this way, the transition angle in the transition area on the bottom of the isolation block 830 can be reduced effectively, such that the photosensitive element 8211 can be sealed more closely, which is beneficial to avoid processing errors, such as burr and etc., from occurring in the subsequent molding processes.

Figure 46A:
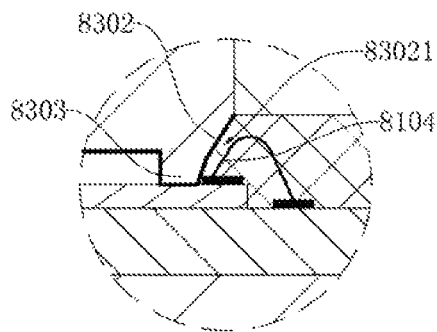
FIG. 46A illustrates an alternative mode of the molding mould according to the above preferred embodiment of the present invention.

Referring to FIG. 46A, it is an alternative mode of the above preferred embodiment of the present invention, wherein the extension part 8303 extends downward and inward from the bottom side of the isolation block body 8301. The downward and inward extending angle of the extension part 8303 is adjustable, so as for the coordination of the extension part 8303 and the side tilt part for defining the shape of the wiring space 83021 to be closer to the line bank of the lead wire 8214. Therefore, the molded base 823 formed subsequently can cover and coat the lead wire 8214 more closely. It is worth mentioning that the gradient of the side tilt part 8302 of the isolation block 830 is adjustable, such that it can be coordinated to the extension part 8303 to adjust the size and shape of the wiring space 83021, so as to better fit the wiring space 83021 to the line bank of the lead wires 8214.

Figure 46B:
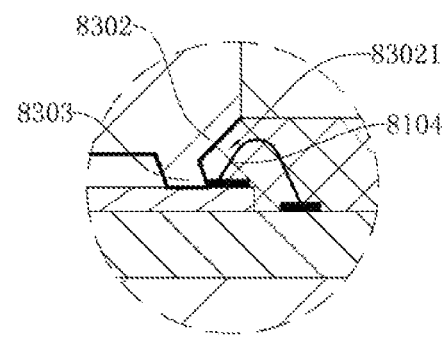
FIG. 46B illustrates another alternative mode of the molding mould according to the above preferred embodiment of the present invention.

Referring to FIG. 46B, it is another alternative mode of the above preferred embodiment of the present invention, wherein the extension part 8303 extends downward and outward from the bottom side of the isolation block body 8301, wherein the downward and outward extending angle of the extension part 8303 is adjustable, such that when the isolation block 830 is overlapped on the photosensitive element 8211, the extension part 8303 can further reduce the transition angle in the transition area on the bottom of the isolation block 830. Therefore, the photosensitive element 8211 can be sealed more closely, which is beneficial to avoid processing errors, such as burr and etc., from occurring in the subsequent molding processes. It is worth mentioning that this structure is particularly suitable for the case that the molding mould 8100 further includes a cushion film, which will be illustrated subsequently. The reasons include that the extension part 8303 that extends downward and outward from the bottom of the isolation block body will exert a stronger pressure onto the cushion film 8104, such that the cushion film 8104 will be attached on the photosensitive element 8211 more firmly. Therefore, even for a thicker cushion film 8104, this technology can effectively avoid large gap from occurring between the chip surface and the bottom of the isolation block body due to overly large curvature radius as the cushion film was bent during the molding process, so as to avoid defects, such as burr and etc. from occurring. Further, according to the present preferred embodiment of the present invention, the isolation block 830 also comprises an avoidance space 8300 sunkenly formed on the bottom side of the isolation block 830, such that when the isolation block 830 is attached on the photosensitive element 8211, the avoidance space 8300 is provided between the photosensitive element 8211 and the isolation block 830, which prevents the isolation block 830 from directly contacting the photosensitive element 8211, so as to protect the photosensitive area portion 82111 of the photosensitive element 8211 from being crushed. Preferably, the avoidance space 8300 provides a spatial extent that is slightly larger than the photosensitive area portion 82111 of the photosensitive element 8211, such that when the isolation block 830 seals the photosensitive element 8211, the avoidance space 8300 will be correspondingly provided above the photosensitive area portion 82111 of the photosensitive element 8211. Therefore, the bottom of the isolation block 830 will not directly contact the photosensitive area portion 82111 of the photosensitive element 8211, so as to reduce the risks of crushing the photosensitive area portion 82111 of the photosensitive element or damaging pixel element of the photosensitive area portion during the mould closing process.

One skilled in the art should understand that the avoidance space 8300 is sunkenly formed on the bottom side of the isolation block 830, so as to significantly reduce the sealing area between the photosensitive element 8211 and the isolation block 830, which effectively lowers the factor of difficulty of the coordination between the photosensitive element 8211 and the isolation block 830. More specifically, when the avoidance space 8300 is not provided on the bottom of the isolation block 830; that is, the bottom of the isolation block 830 is a complete molding surface, it has to completely ensure the flatnesses of both the photosensitive element 8211 and the bottom molding surface of the isolation block 830 to ensure the accurate attachment between the photosensitive element 8211 and the isolation block 830. When the avoidance space 8300 is provided on the molding surface of the isolation block 830, at least part of the molding surface of the isolation block 830 will be sunken. As a result, the contact area between the isolation block 830 and the photosensitive element 8211 is not only arranged at the non-photosensitive area portion 82112 of the photosensitive element 8211, but also greatly reduced comparing to it without the avoidance space 8300. Therefore, the coordination difficulty between the photosensitive element 8211 and the isolation block 830 becomes lower, which helps to enhance the tightness between the photosensitive element 8211 and the isolation block 830. According to the present preferred embodiment of the present invention, the avoidance space 8300 is provided at the extension part 8303 of the isolation block 830, so as to better seal the photosensitive element 8211 with the extension part 8303 and achieve a better molding result.

Referring to FIG. 43, the molding mould 8100 further comprises a cushion film 8104 arranged between the isolation block 830 and the photosensitive element 8211, so as to reinforce and enhance the sealing performance therebetween through the cushion film 8104. The cushion film 8104 can also prevent the molding material from flowing onto the photosensitive element 8211 in the subsequent molding process, which enhances the molding quality of the molding process. It is worth mentioning that, according to the present preferred embodiment of the present invention, the cushion film 8104 is attached on the bottom of the isolation block 830, so as to turn the cushion film 8104 into a cushion layer between the photosensitive element 8211 and the isolation block 830. When the isolation block 830 is overlapped on the photosensitive element 8211, the load exerted on the photosensitive element 8211 will be effectively absorbed by the cushion film 8104, so as to avoid damage of the chip. One skilled in the art should understand that the upper mould 8101 and the lower mould 8102 of the molding mould 8100 will be detached from each other after the molding process, so as for separating the molded circuit board 820 from the molding mould 8100. At this point, the preset cushion film 8104 can provide another function that allows the molded circuit board 820 to be separated from the molding mould 8100 easily.

More specifically, according to the present preferred embodiment of the present invention, the cushion film 8104 is arranged and deployed on the molding surface of the upper mould to cover and coat the entire extension part 8303 and the side tilt part 8302, such that when the isolation block 830 is arranged above the photosensitive element 8211, the cushion film 8104 will be firmly attached on the photosensitive element 8211, so as to enhance the tightness of the isolation block 830. The cushion film 8104 is somewhat flexible and soft, such that when the cushion film 8104 is united on the photosensitive element 8211, the extension part 8303 of the isolation block 830 will press on the cushion film 8104 and slightly distort it, so as to push the cushion film 8104 to be attached on the photosensitive element 8211 more firmly, which therefore enhances the tightness of the photosensitive element 8211. Furthermore, when the avoidance space 8300 is not provided on the bottom of the isolation block 830, because the contact area between the photosensitive element 8211 and the bottom of the isolation block 830 is correspondingly reduced, the pressure acting on the cushion film 8104 will be correspondingly increased, which further forces the cushion film 8104 to move down and, subsequently further reduces the sealing gap between the photosensitive element 8211 and the cushion film 8104. As a result, the tightness between the photosensitive element 8211 and the isolation block 830 will be further increased. It is worth mentioning that the change of the extending direction of the extension part 8303 can correspondingly change the mechanical effect of the extension part 8303 onto the cushion film 8104. Hence, even if the cushion film 8104 is thicker, one may still utilize the extension part 8303 to well solve the issue of large gap occurring between the photosensitive element 8211 and the cushion film 8104 in the transition area on the bottom of the isolation block 830, so as to effectively prevent processing errors, such as burr and etc. from occurring in the molding process.

It is to ensure that the cushion film 8104 can stay firmly on the bottom of the isolation block 830 throughout the molding process rather than having processing errors, such as dislocation, deviation, and etc. One skilled in the art should understand that the dislocation here refers to that the cushion film 8104 is detached from the bottom of the isolation block 830 when the isolation block 830 is correspondingly attached on the photosensitive element 8211, rendering direct contact between the photosensitive element 8211 and the isolation block 830, which is likely to cause the photosensitive element 8211 be crushed or scratched by the isolation block 830. The deviation here refers to that the cushion film 8104 moves between the isolation block 830 and the photosensitive element 8211 because it has not been firmly affixed during the molding process. As a result, it will rub between the isolation block 830 and the photosensitive element 8211 and produce fragments or draw dirt on the non-photosensitive area portion 82112 of the photosensitive element 8211 onto the photosensitive area portion 82111 of the photosensitive element 8211.

Figure 47:
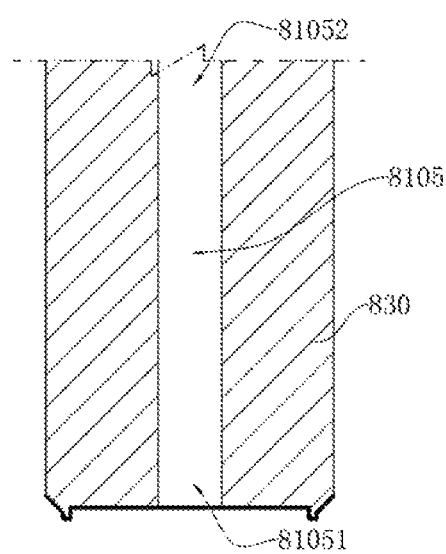
FIG. 47 is a perspective view of a molding mould according to the above preferred embodiment of the present invention.

Correspondingly, referring to FIG. 47, according to this preferred embodiment of the present invention, the isolation block 830 further comprises an air path 8105, formed in the inside of the isolation block 830 and communicating the isolation block 830 and the external environment of the molding mould 8100, so as to provide a negative pressure room between the cushion film 8104 and the bottom of the isolation block 830 through the air path 8105 and ensure the cushion film 8104 to be firmly attached on the bottom of the isolation block 830 during the entire molding process, which can effectively avoid processing errors, such as dislocation, deviation, and etc. More specifically, the air path 8105 has at least one air inlet 81051 and one air outlet 81052. The air inlet 81051 is arranged and formed on the bottom of the isolation block 830, such that the air remained between the cushion film 8104 and the bottom of the isolation block 830 can be removed through the air outlet 81052. Therefore, the cushion film 8104 can be firmly attached on the bottom of the isolation block 830 under the effect of the pressure difference. It is worth mentioning that the shape of the air outlet 81051 is not limited, which can be circular, triangular, densely porous, and etc. That is to say, it can be in any shape as long as it is capable of discharging the remained gas between the cushion film 8104 and the upper mould 8101.

Figure 48:
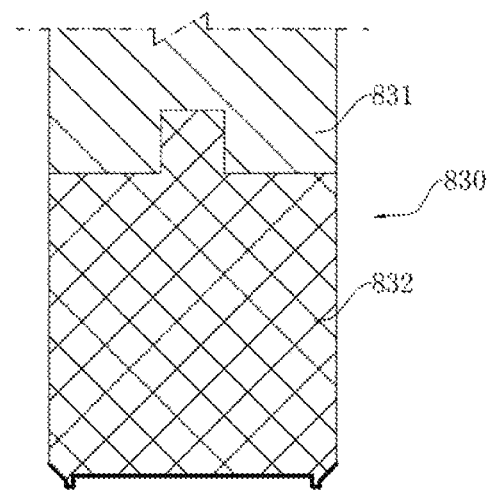
FIG. 48 is a perspective view of the molding mould according to another preferred embodiment of the present invention.

FIG. 48 illustrated another equivalent embodiment of the present invention, wherein the isolation block 830 further comprises a rigid section 831 and a flexible section 832 coupled and aligned with the rigid section 831 and extending downward therealong. When the isolation block 830 is correspondingly attached on the photosensitive element

8211, the flexible section will be closely united on the photosensitive element 8211. The flexible section is soft and flexible, so as to be capable of avoiding the chip from being crushed or scratched. The softness and flexibility of the flexible section also enhances the tightness between the photosensitive element 8211 and the flexible section as it is sealing the photosensitive element 8211. Preferably, the flexible section is replaceable coupled with the rigid section 831, so as to allow the flexible section to be replaced when fails. In this way, it can reduce the cost of the molding mould 8100.

It is worth mentioning that the flexible section is made of flexible material and will not concrete or bond with the molding material. Therefore, the flexible section is reusable after a molding process, which further lowers the cost. For example, according to the present preferred embodiment of the present invention, the flexible material is an organic polymer, the rigid material is a metal, and the flexible section is replaceable coupled on the rigid section to form the isolation block 830 of the molding mould 8100. It is worth mentioning that the molding mould 8100 is especially suitable for the case that the molded base 823 integrally seals and packages at least part of the circuit board 8212 and the photosensitive element 8211. Certainly, the molding mould 8100 also works for the case that the molded base 823 integrally seals and packages only at least part of the circuit board 8212.

It is understandable that the isolation block 830 may also be completely made of flexible material according to another alternative mode, such that the isolation block 830 can be closely united on the photosensitive element 8211 and effectively avoid the photosensitive element 8211 from being crushed or scratched. It is also worth mentioning that the cushion film can still be utilized and the thickness thereof can be reduced when the isolation block 830 adopts the flexible section 832 or is completely made of flexible material.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A manufacturing equipment, for manufacturing at least one molded circuit board of at least one camera module by a molding material and at least one circuit board which is electrically connected to at least one photosensitive element, comprising:
    a molding mould comprising a first mould and a second mould;
    a mould fixing unit, wherein said mould fixing unit is capable of separating and closely uniting said first mould and said second mould, wherein when said first mould and said second mould are united to form a molding chamber, at least one light window forming block and a base forming guide groove disposed around said light window forming block are provided in said molding chamber of said molding mould; and
    a temperature control unit which provides a controlled temperature environment for said molding chamber, wherein when the at least one circuit board is mounted in said molding chamber, the molding material filled in said base forming guide groove is solidified from a liquid state to a solid state under a temperature controlling effect of said temperature control unit, wherein a molded base is formed at a position corresponding to said base forming guide groove and a light window of said molded base is formed at a position corresponding to said light window forming block above the photosensitive element, wherein the molded base is integrally molded on the circuit board and the photosensitive element so as to form the molded circuit board of the camera module.

2. The manufacturing equipment, as recited in claim 1, wherein said temperature control unit comprises a melting and heating arrangement and a solidifying and temperature controlling arrangement, said melting and heating arrangement melts said molding material which is solid, said solidifying and temperature controlling arrangement provides a heating environment for said molding mould, wherein said temperature control unit is capable of heating and melting said molding material which is in said solid state and is capable of heating said molding material within said molding chamber such that said liquid molding material is heated to be solidified.

3. The manufacturing equipment, as recited in claim 1, further comprising a circuit board array feeding mechanism for providing at least one integral piece of circuit board array to said molding mould, wherein the circuit board array is integrally combined with a plurality of the circuit boards, said circuit board array feeding mechanism comprises at least one guide rail, at least one load member and at least one unload member, said load member and said unload member move along said guide rail, wherein said load member transports the at least one integral piece of circuit board array to said molding chamber and said unload member uploads said molded circuit board.

4. The manufacturing equipment, as recited in claim 1, wherein an integral piece of circuit board array is adapted for being mounted in said molding chamber, the integral piece of circuit board array is integrally combined with a plurality of the circuit boards, wherein said manufacturing equipment manufactures at least one integral piece of molded circuit board array in a joint board array molding operation on the integral piece of circuit board array, wherein said integral piece of molded circuit board array comprises a plurality of the molded circuit boards which are integrally combined.

5. The manufacturing equipment, as recited in claim 4, wherein the circuit boards of the molded circuit boards are formed with said molded bases which are separated with each other.

6. The manufacturing equipment, as recited in claim 4, wherein the integral piece of molded circuit board array is formed with an integral piece of molded base array which is integrally molded on the integral piece of circuit board array.

7. The manufacturing equipment, as recited in claim 1, wherein the molding material is a hot melting material, said molding material which is filled in said base forming guide groove is in a liquid-melt state and is solidified to form the molded base which is integrally molded on the circuit board by cooling.

8. The manufacturing equipment, as recited in claim 1, wherein the molding material is a thermosetting material, said molding material which is filled in said base forming guide groove is in a liquid condition and is solidified to form the molded base which is integrally molded on the circuit board by heating.

9. The manufacturing equipment, as recited in claim 1, wherein the circuit board comprises a base board and a plurality of electronic components provided on the base board, wherein the molded base is covered and coated on the electronic components.

10. The manufacturing equipment, as recited in claim 1, wherein when said molding mould is in a closed-mould position and performs a molding process, a side guide groove adjacent to at least one side surface of the circuit board is provided to communicate with said base forming guide groove, wherein the molding material is filled in said side guide groove and forms the molded base after solidification and the molded base is further covered and coated on the side surface of the circuit board.

11. The manufacturing equipment, as recited in claim 1, wherein when said molding mould is in a closed-mould position and performs a molding process, a bottom guide groove adjacent to at least one bottom surface of the circuit board is provided to communicate with said base forming guide groove, wherein the molding material is filled in said bottom guide groove and forms the molded base after solidification and the molded base is further covered and coated on the bottom surface of the circuit board.

12. The manufacturing equipment, as recited in claim 1, wherein the circuit board to be molded and the photosensitive element are electrically connected by one or more lead wires in advance of a molding process.

13. The manufacturing equipment, as recited in claim 12, wherein the photosensitive element has a photosensitive area portion and a non-photosensitive area portion which is positioned around the photosensitive area portion, wherein when said molding mould is in said closed-mould position and performs a molding process, said light window forming block is firmly contacted to at least the photosensitive area portion, the molded base being solidified and molded is integrally molded on at least one portion of the non-photosensitive area portion.

14. The manufacturing equipment, as recited in claim 13, wherein the molded base is integrally covered and coated on the lead wires and the electronic components of the circuit boards.

15. The manufacturing equipment, as recited in claim 1, wherein the circuit board to be molded is electrically connected to at least one photosensitive element and an optical filter is overlappingly arranged with the photosensitive element, wherein the optical filter has a center area, wherein when said molding mould is in a closed-mould position and performs a molding process, said light window forming block is firmly contacted with the center area of the optical filter, the molded base after being solidified and molded is integrally molded on the circuit board, the photosensitive element and the optical filter.

16. The manufacturing equipment, as recited in claim 1, wherein when said molding mould is in said closed-mould position, one or more actuator pin groove forming blocks are provided and extended in said base forming guide groove, wherein after the molding material filled in said base forming guide groove is solidified from said liquid state to said solid state, one or more actuator pin grooves are formed in the molded base at positions corresponding to said actuator pin groove forming blocks.

\* \* \* \* \*